United States Patent [19]

Miyamoto et al.

[11] Patent Number: 5,452,249
[45] Date of Patent: Sep. 19, 1995

[54] NON-VOLATILE SEMICONDUCTOR MEMORY DEVICE WITH VERIFY MODE FOR VERIFYING DATA WRITTEN TO MEMORY CELLS

[75] Inventors: Junichi Miyamoto, Yokohama; Yasuo Itoh, Kawasaki; Yoshihisa Iwata, Yokohama, all of Japan

[73] Assignee: Kabushiki Kaisha Toshiba, Kawasaki, Japan

[21] Appl. No.: 210,434

[22] Filed: Mar. 21, 1994

[30] Foreign Application Priority Data

Mar. 31, 1993 [JP] Japan .................... 5-074797
Feb. 1, 1994 [JP] Japan .................... 6-010209

[51] Int. Cl.$^6$ .................................. G11C 7/00
[52] U.S. Cl. .................. 365/185; 365/189.01; 365/189.11
[58] Field of Search .......... 365/185, 189.01, 189.11, 365/230.03, 230.08, 900, 154, 156

[56] References Cited

U.S. PATENT DOCUMENTS

| | | | |
|---|---|---|---|
| 5,105,384 | 4/1992 | Noguchi et al. | 365/230.08 |
| 5,293,350 | 3/1994 | Kim et al. | 365/185 |
| 5,299,162 | 3/1994 | Kim et al. | 365/201 |

OTHER PUBLICATIONS

*1992 Symposium on VLSI Circuits Digest of Technical Papers*, Jun. 4, 1992, "A Quick Intelligent Program Architecture for 3V-Only NAND-EEPROMS", Tanaka, et al., pp. 20–21.

*Primary Examiner*—Joseph A. Popek
*Assistant Examiner*—Vu Le
*Attorney, Agent, or Firm*—Banner & Allegretti, Ltd.

[57] ABSTRACT

A non-volatile semiconductor memory device includes a flip-flop circuit for holding write data in one of first and second states. A bit line is connected to the flip-flop circuit via a switching element, and a transistor changes the bit line. A non-volatile memory cell, connected to the bit line and having a MOS transistor structure, stores data when a threshold thereof is set in one of first and second threshold ranges, wherein at the time of a write mode the threshold of the memory cell is shifted from the first threshold range towards the second threshold range while the flip-flop circuit remains in the first state and the shift of the threshold is not effected while the flip-flop circuit remains in the second state, and at the time of a verify mode following the write mode the bit line is kept at a charge potential by the charging transistor while the threshold remains in the second threshold range. A data setting circuit connects one of first and second signal nodes of the flip-flop circuit to a predetermined potential when the bit line is at the charge potential in the verify mode, thereby setting the flip-flop circuit in the second state irrespective of the state prior to the verify mode.

84 Claims, 36 Drawing Sheets

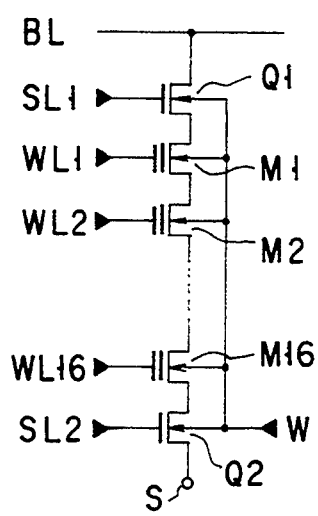
FIG. 1
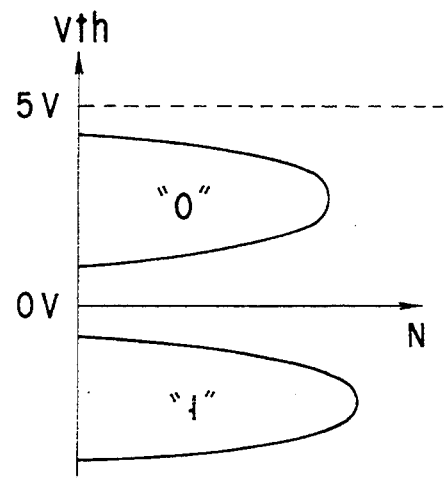
FIG. 2
|  | READ | ERASE | WRITE |
|---|---|---|---|
| BL | 5V PRE-CHARGE | OPEN | "0" WRITE 0V<br>"1" WRITE 9V |
| SL1 | 5V | 0V | 11V |
| WL | SELECTED 0V<br>NON-SELECTED 5V | 0V | SELECTED 18V<br>NON-SELECTED 9V |
| SL2 | 5V | 0V | 0V |
| W | 0V | 18V | 0V |
| S | 0V | 18V | 0V |
FIG. 3

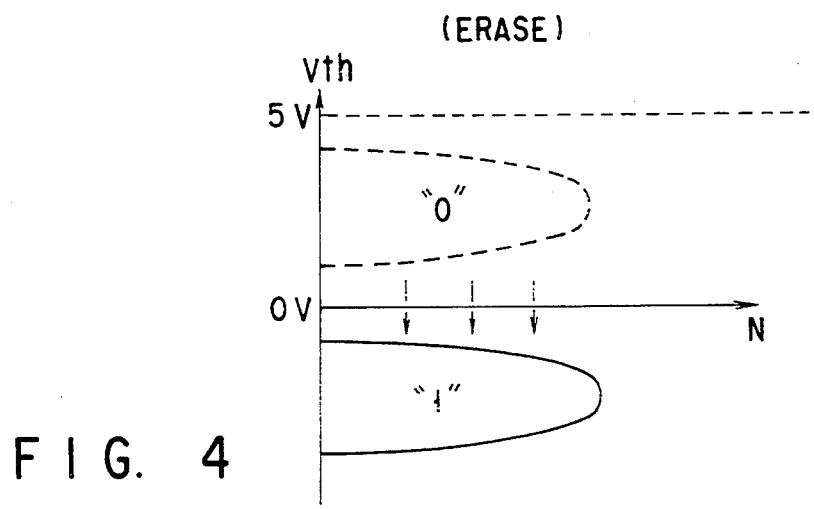
F I G. 4
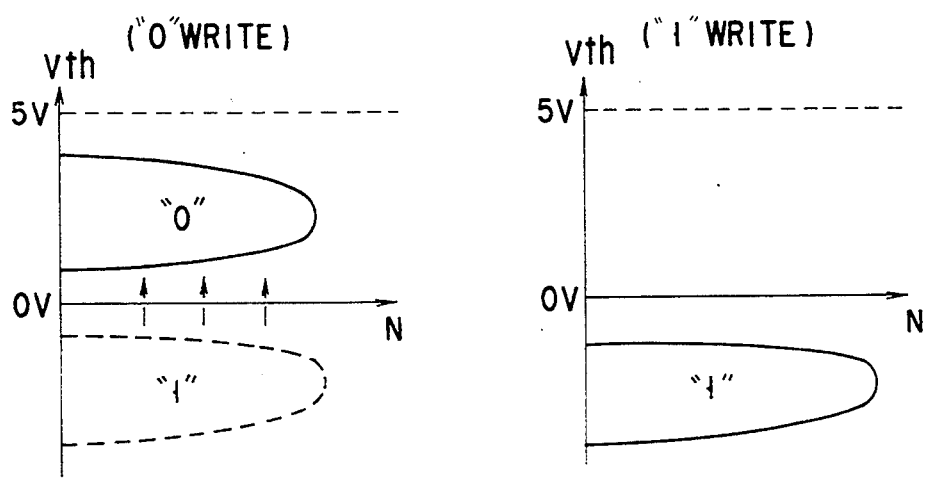
F I G. 5A
F I G. 5B
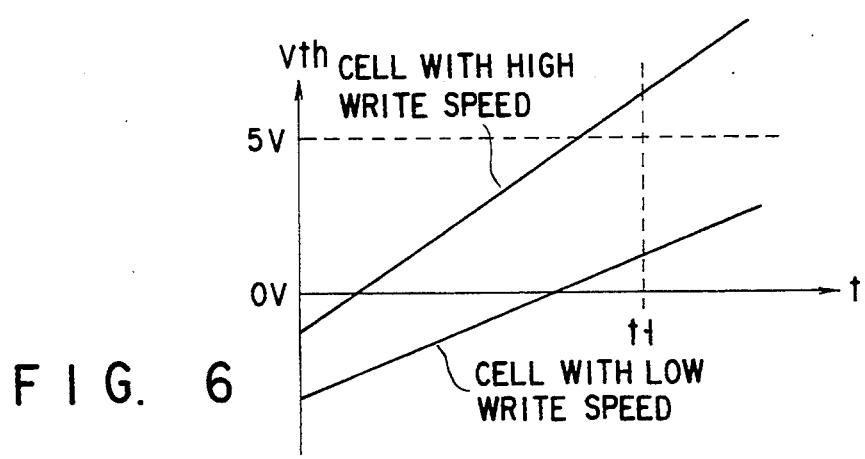
F I G. 6

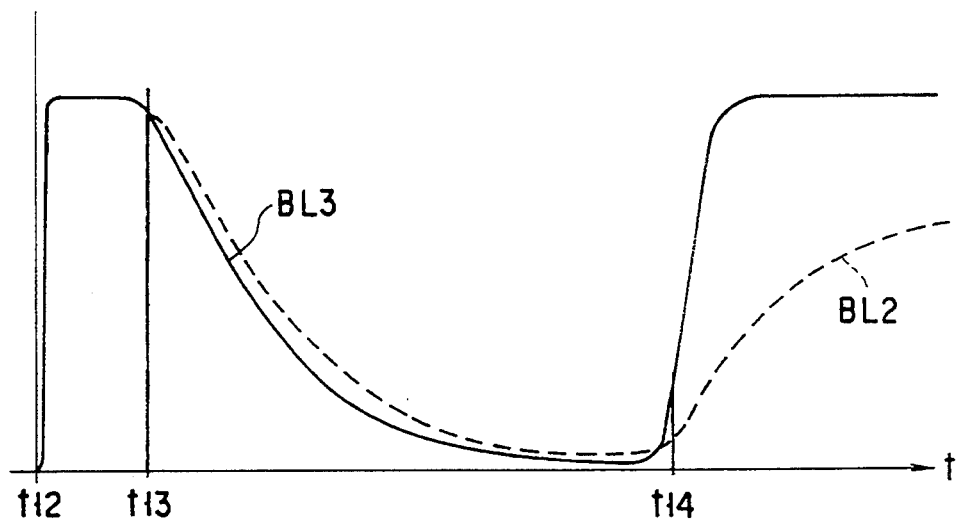
F I G. 10
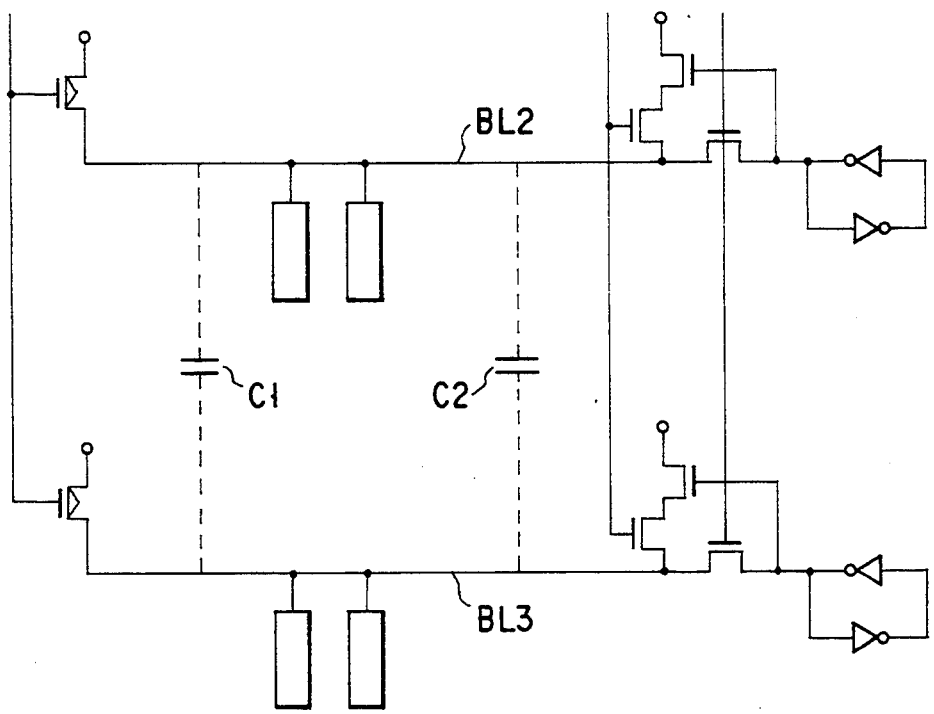
F I G. 11

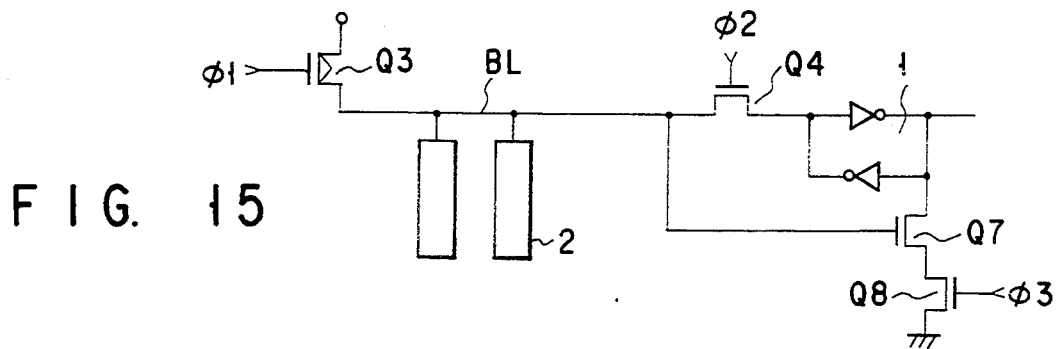
F I G. 15
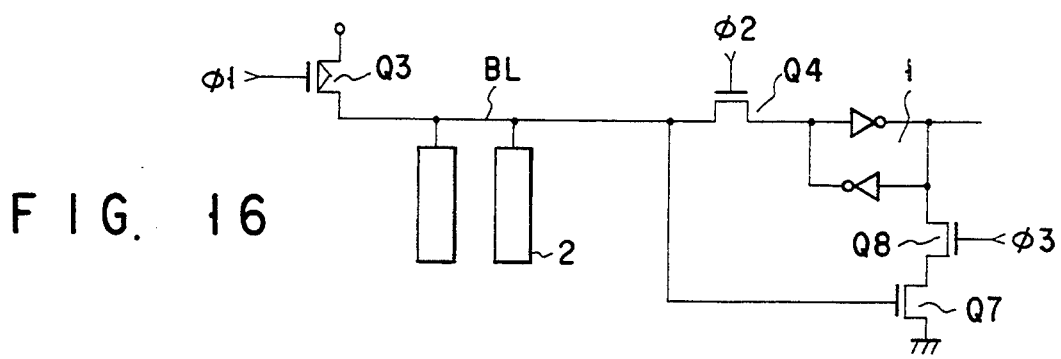
F I G. 16
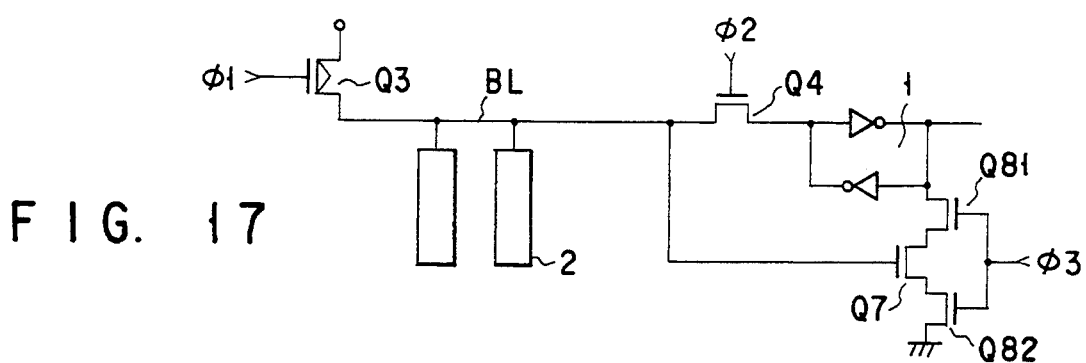
F I G. 17
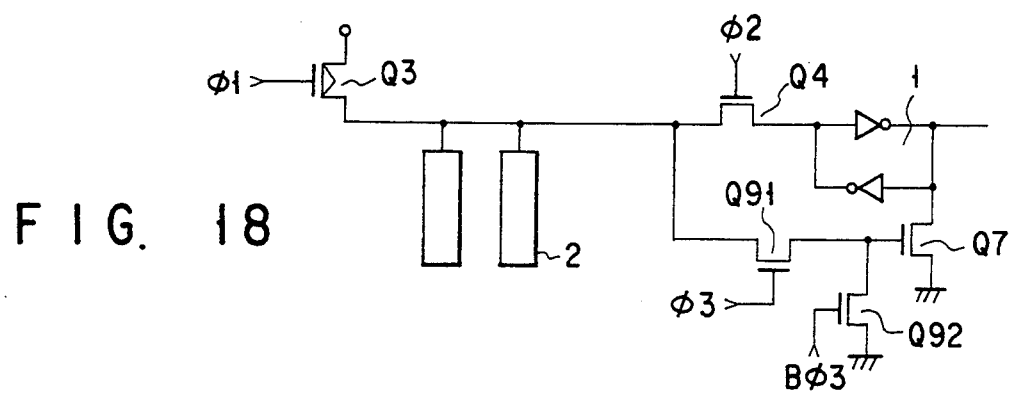
F I G. 18

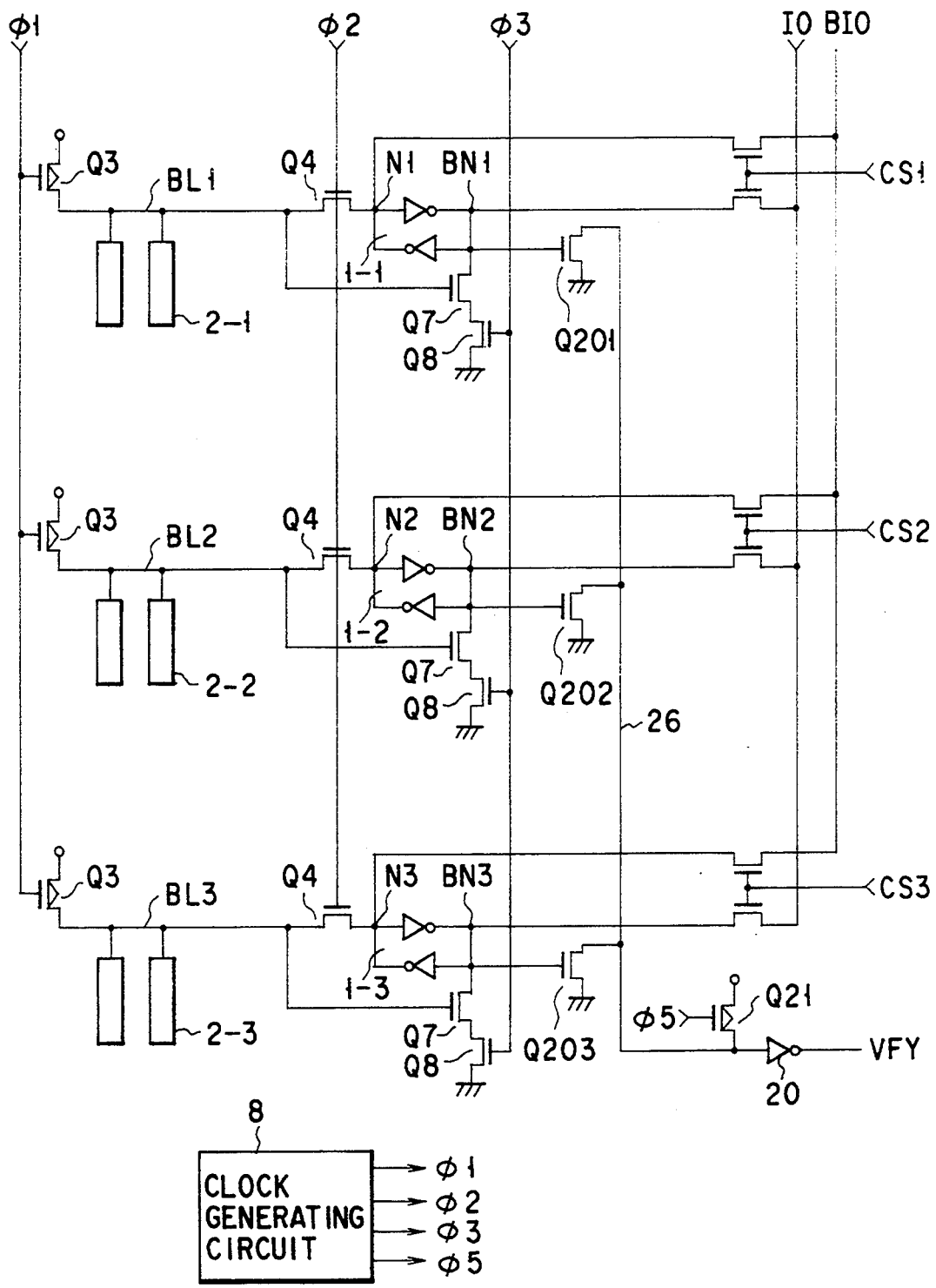
F I G. 44

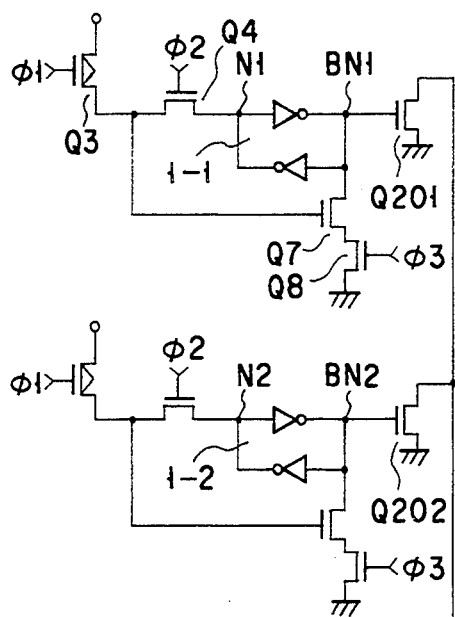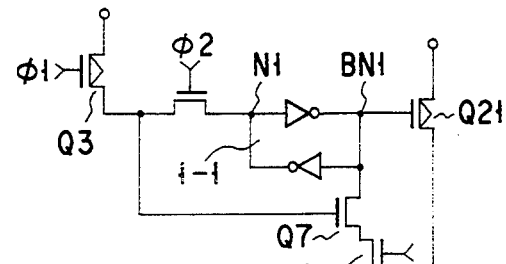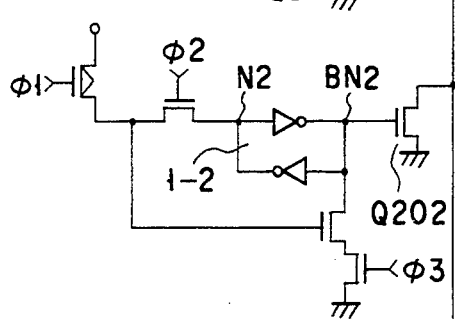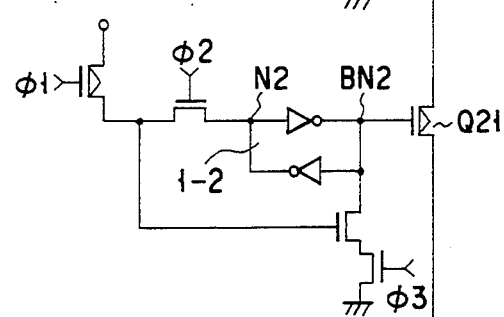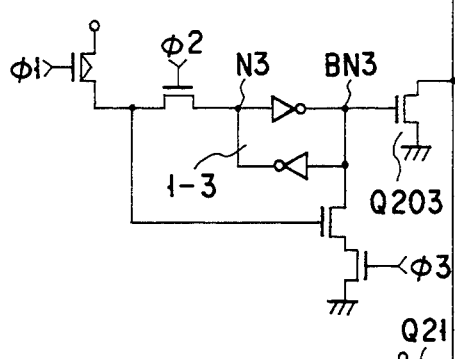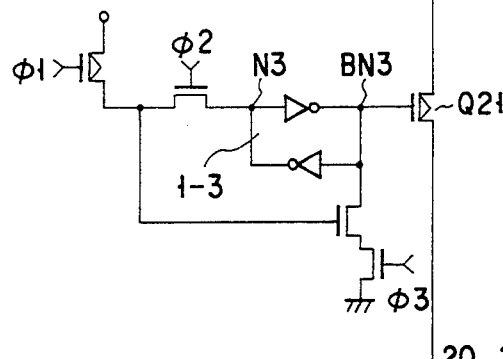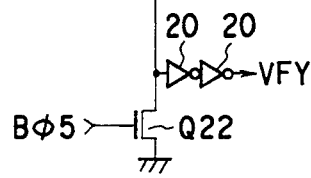
FIG. 45    FIG. 46

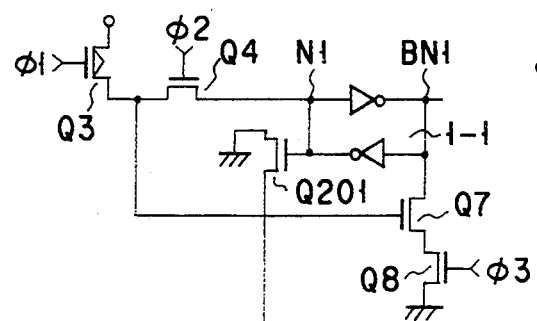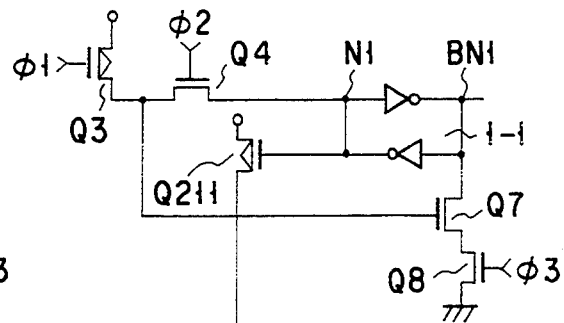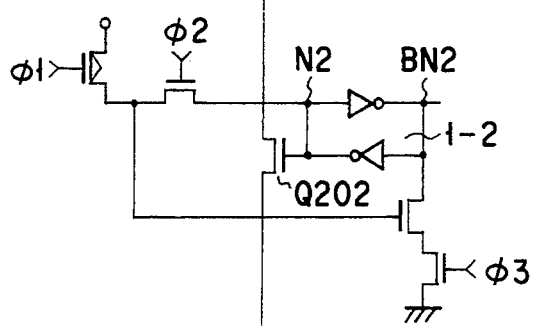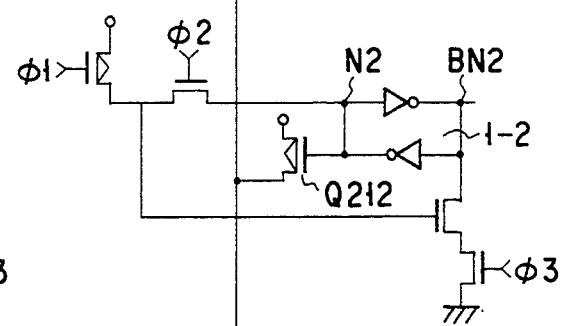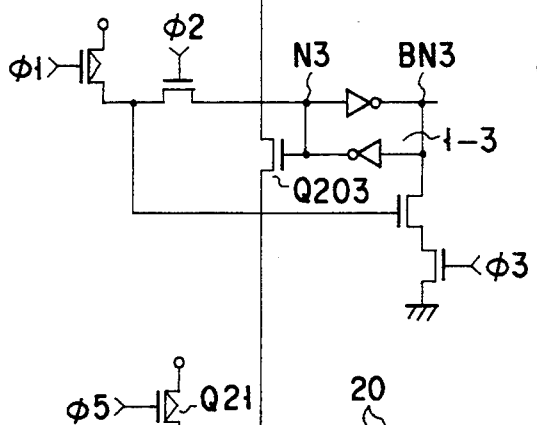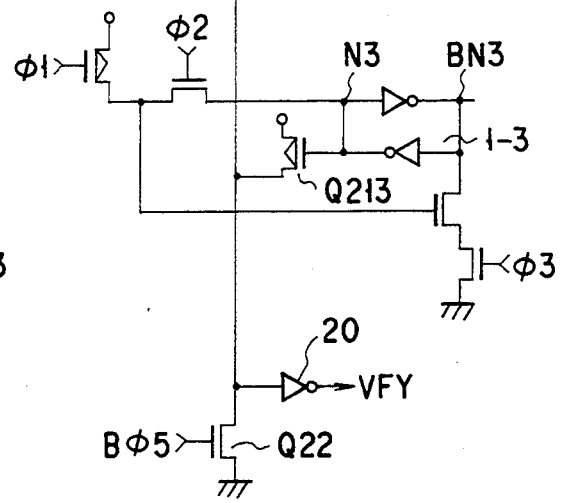
F I G. 47   F I G. 48

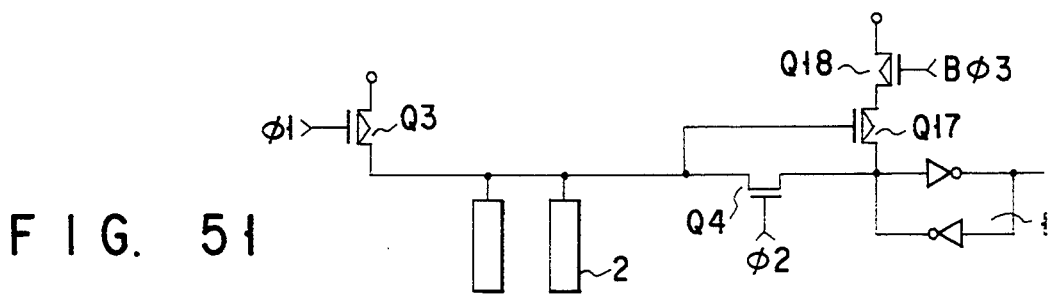
F I G. 51
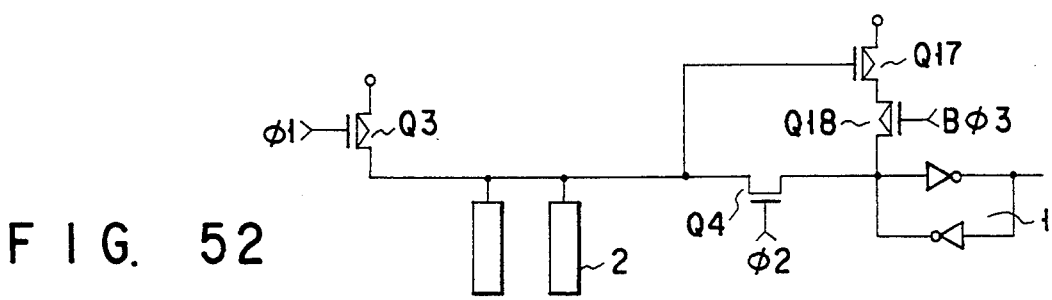
F I G. 52
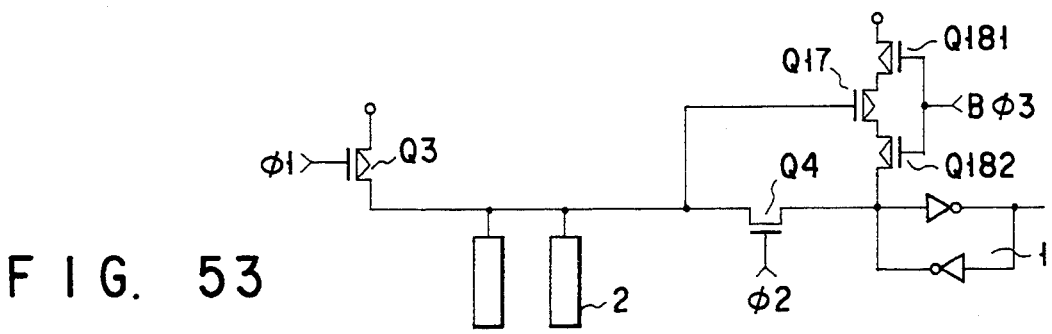
F I G. 53
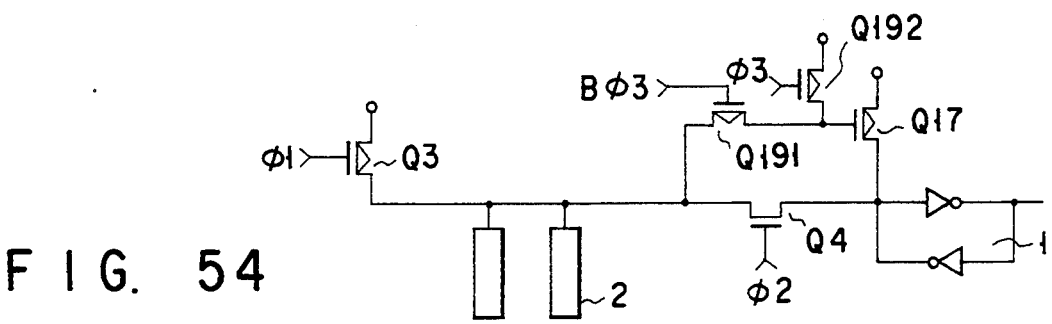
F I G. 54

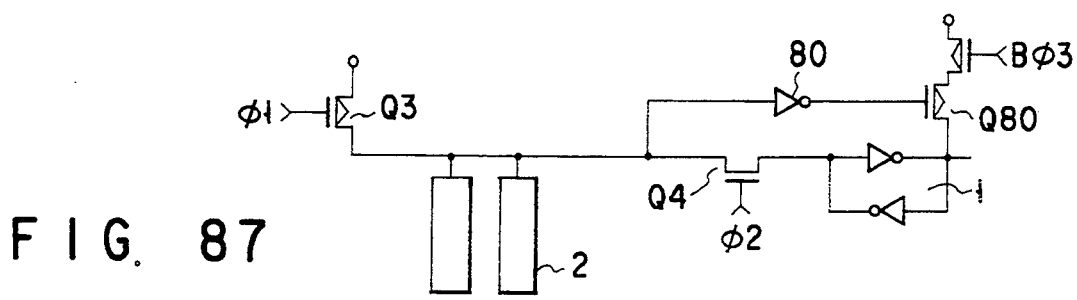
F I G. 87
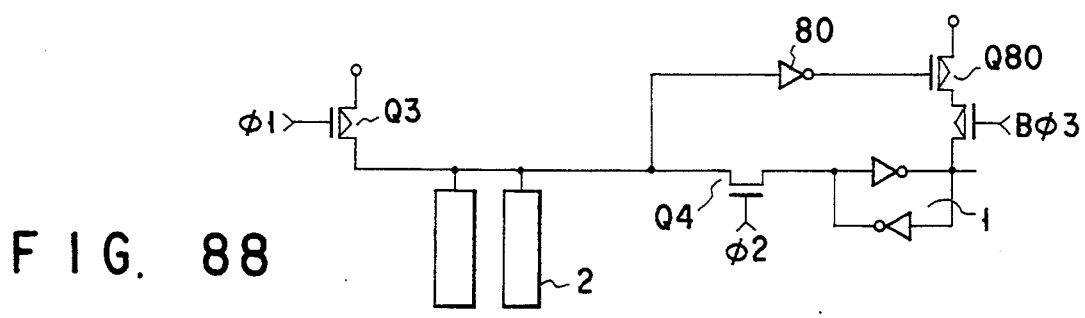
F I G. 88
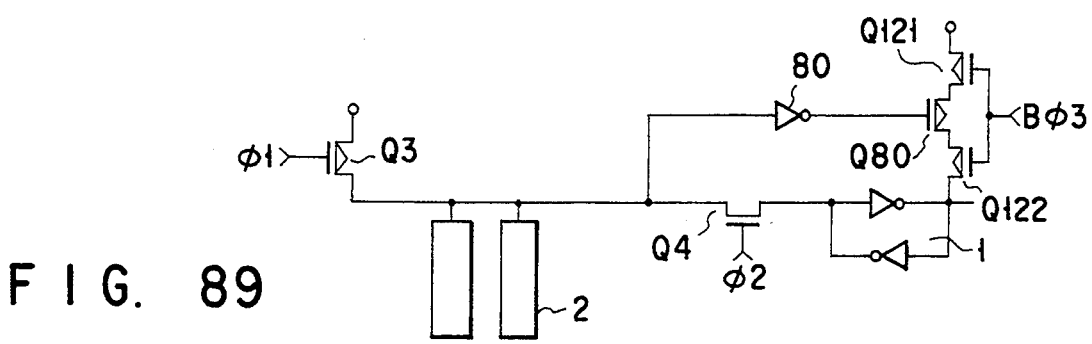
F I G. 89
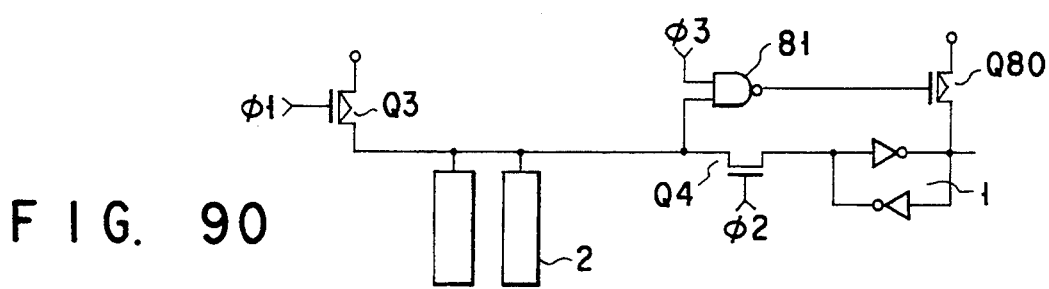
F I G. 90

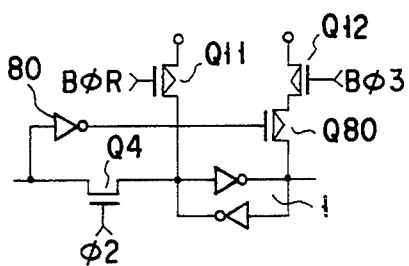
F I G. 91
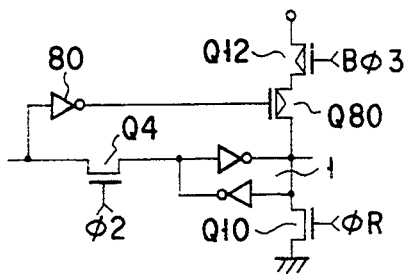
F I G. 95
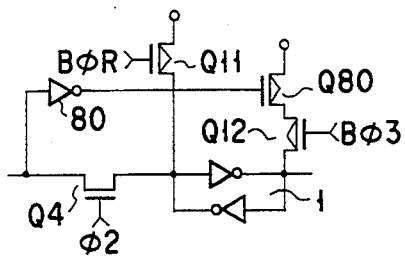
F I G. 92
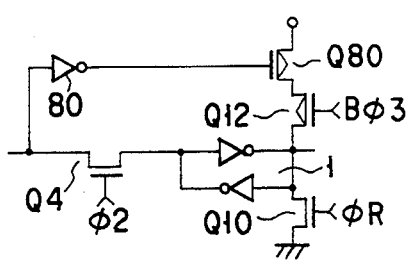
F I G. 96
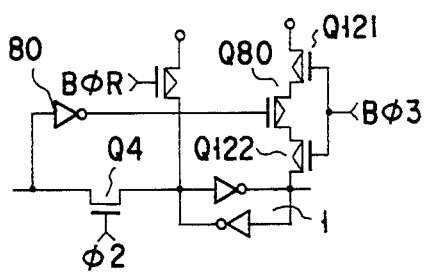
F I G. 93
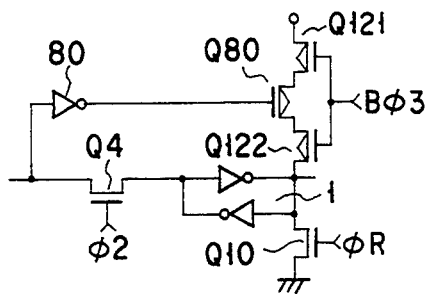
F I G. 97
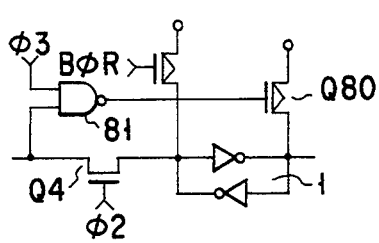
F I G. 94
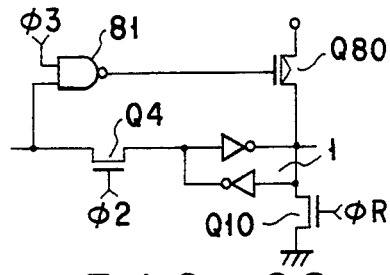
F I G. 98

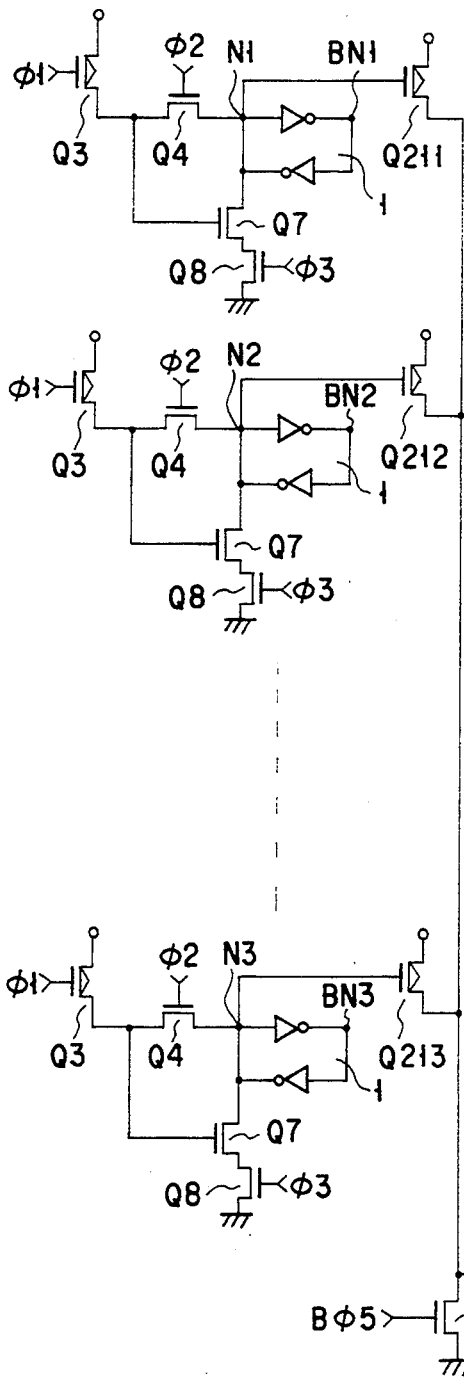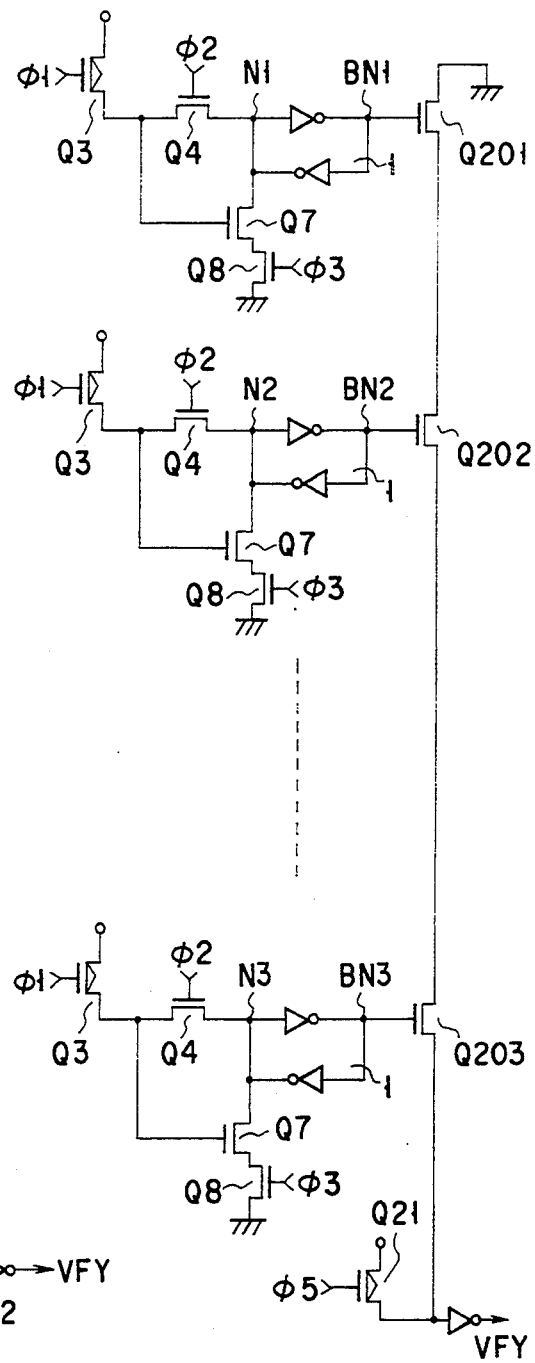
F I G. 101        F I G. 102

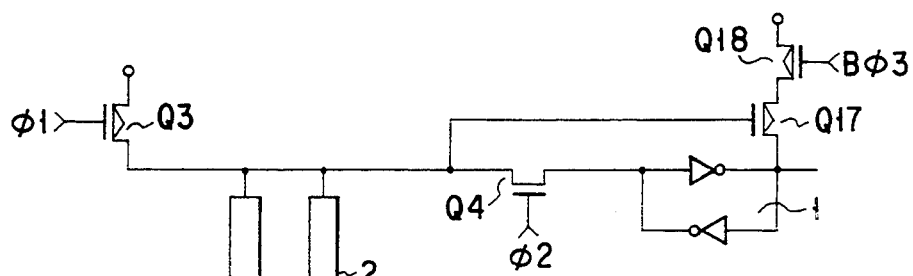
F I G. 103
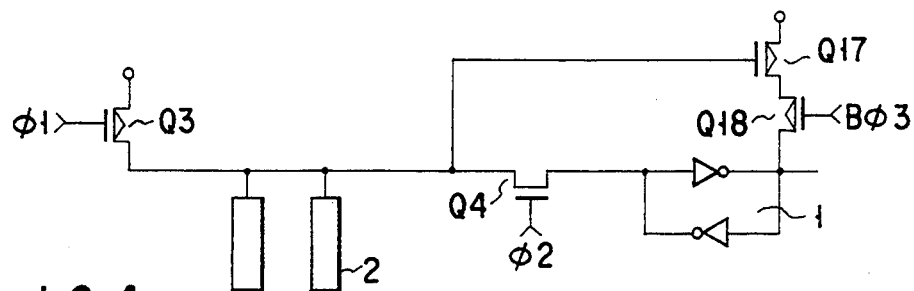
F I G. 104
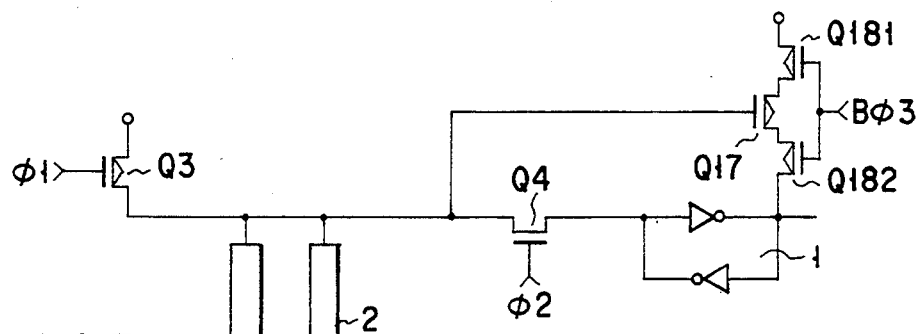
F I G. 105
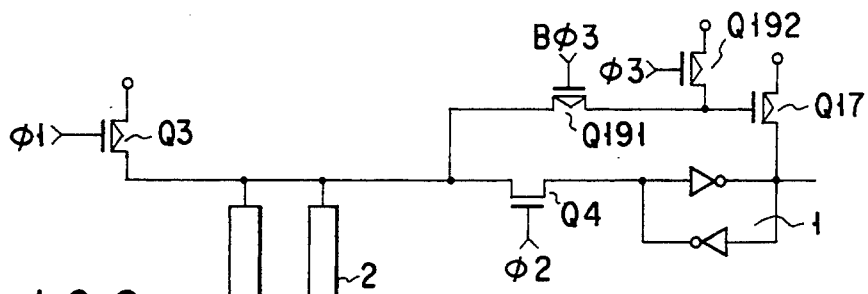
F I G. 106

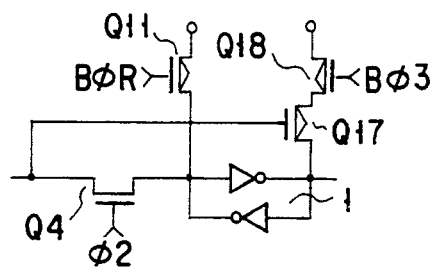
F I G. 107
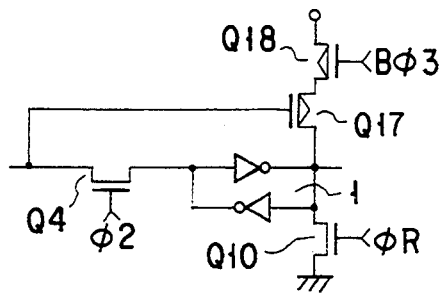
F I G. 111
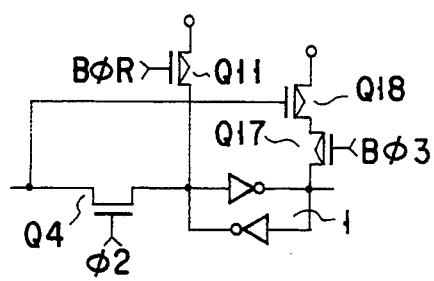
F I G. 108
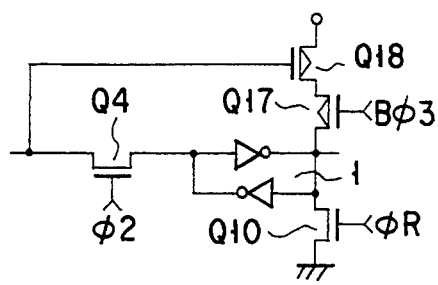
F I G. 112
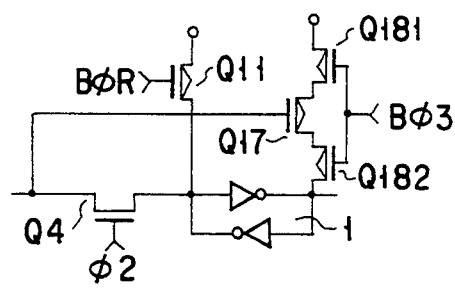
F I G. 109
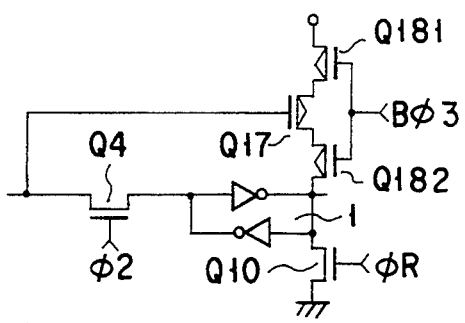
F I G. 113
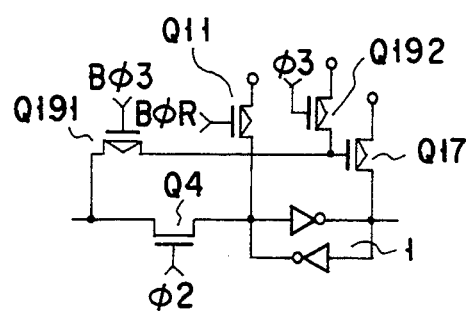
F I G. 110
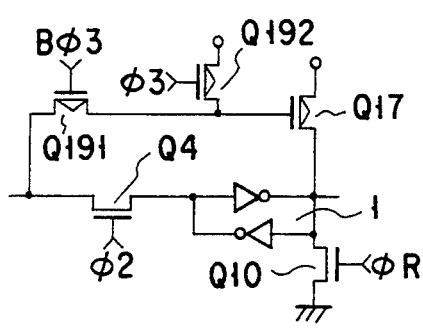
F I G. 114

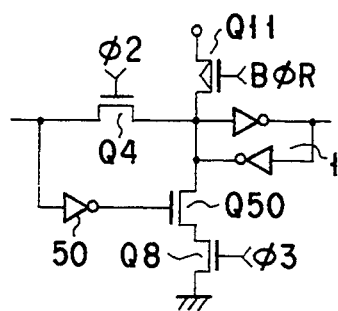
F I G. 119
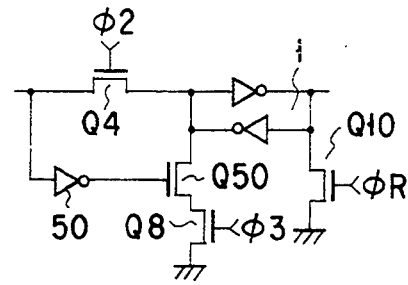
F I G. 123
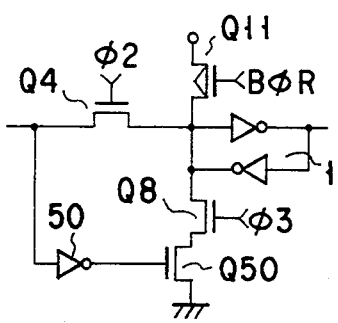
F I G. 120
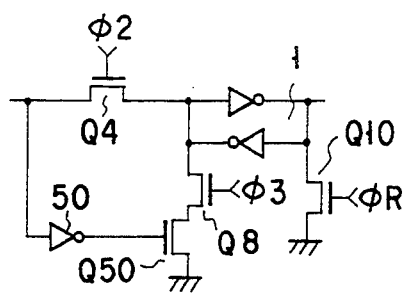
F I G. 124
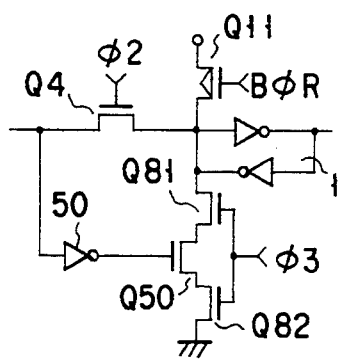
F I G. 121
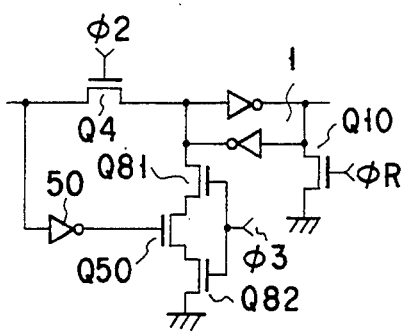
F I G. 125
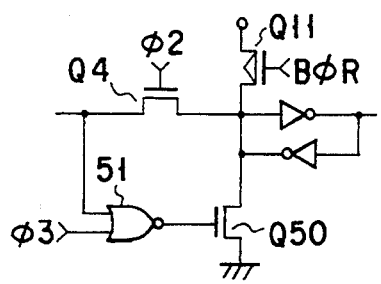
F I G. 122
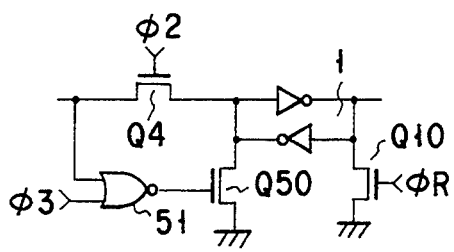
F I G. 126

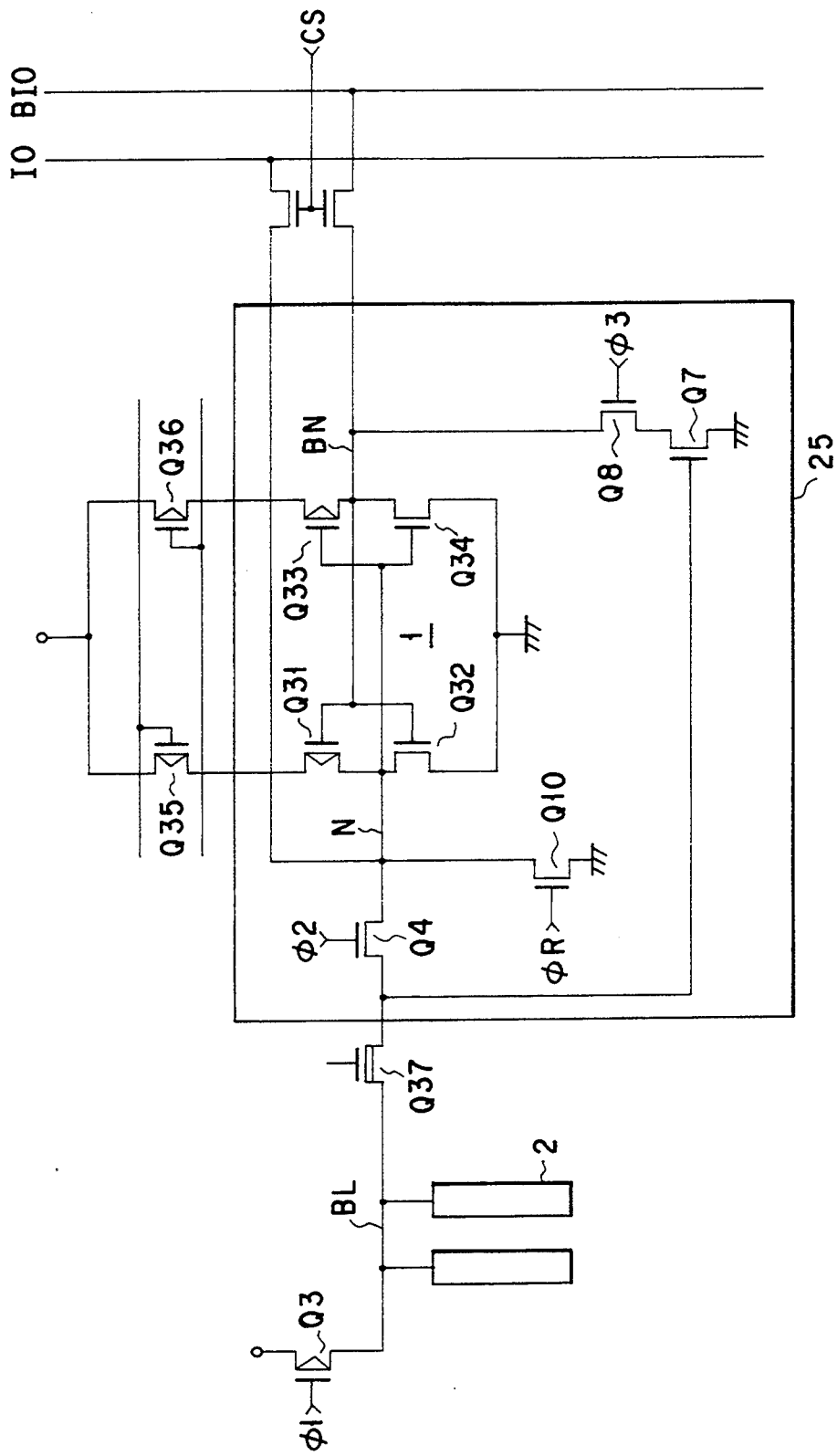
F I G. 127

NON-VOLATILE SEMICONDUCTOR MEMORY DEVICE WITH VERIFY MODE FOR VERIFYING DATA WRITTEN TO MEMORY CELLS

BACKGROUND OF THE INVENTION

1. Field of the Invention

The present invention relates to a non-volatile semiconductor memory device having a rewrite data setting function (i.e. a verify function), and more particularly to a sense amplifier type circuit used for write and read operations.

2. Description of the Related Art

Since a non-volatile semiconductor memory device has an advantage in which data is not lost even if power is turned off, a demand for such non-volatile semiconductor memories has recently increased more and more. Unlike a two-transistor byte-type non-volatile semiconductor memory device, a flash memory or an electrically batch-erasable non-volatile semiconductor memory device may have a memory cell constituted by a single transistor. As a result, the size of the memory cell can be decreased, and it is expected to substitute the flash memory for a large-capacity magnetic disk.

In this type of non-volatile semiconductor memory device, a memory cell array is constituted by arranging memory cells comprising MOS transistors with floating gates in a matrix. A threshold value of the MOS transistor is varied by accumulating a charge in the floating gate, and data is stored by the threshold value. At the time of data write or data read, an electric current is let to flow to the gate insulative film to control data. Thus, a write time varies greatly, depending on a change in process or use condition. This is a principal difference between the above non-volatile semiconductor memory device and a DRAM or SRAM. As a result, a single chip may comprise cells with a short write time and cells with a long write time.

In order to describe the above problems in detail, a conventional non-volatile semiconductor memory device with reference to a NAND type flash memory.

FIG. 1 is a circuit diagram showing a cell structure of the NAND type flash memory. Non-volatile memory cells M1 to M16, each comprising a MOS transistor having a floating gate, are connected in series. The memory cell M1 at one end of the group of the memory cells M1 to M16 is connected to a bit line BL via a selector transistor Q1, and the memory cell M16 at the other end thereof is connected to a common source line S via a selector transistor Q2. Each transistor constituting each cell is formed on a single well substrate W. Control gates of memory cells M1 to M16 are connected to word lines WL1 to WL16, a control electrode of the selector transistor Q1 is connected to a selector line SL1, and a control gate of the selector transistor Q2 is connected to a selector line SL2.

Each of the memory cells M1 to M16 has a threshold value corresponding to data to be stored. When "0" data is stored, the threshold value is set at more than 0 V and less than 5 V. When "1" data is stored, the threshold value is set at less than 0 V. (More appropriately, these threshold values are set in narrow ranges in order to provide some margin.)

FIG. 2 is a graph illustrating a threshold distribution of an N-number of memory cells having threshold values corresponding to the above data "0" and "1". In the case of a NAND type flash memory, the state in which "1" data is stored is normally called "erase state", and the state in which "0" data is stored is called "write state". An operation of shifting the threshold value of a memory cell storing "1" data in a positive direction so that the memory cell may store "0" data is called "write operation". An operation of shifting the threshold value (Vth) of a memory cell storing "0" data in a negative direction so that the memory cell may store "1" data is called "erase operation". This definition of operations may differ in the case of NOR type memory devices.

FIG. 3 is a table showing voltages to be applied to the memory cells at the time of erase and write operations. In the read operation, the bit line BL is precharged at 5 V in a floating state. Then, 5 V is applied to the selector line SL1, 0 V is applied to the word line WL of the selected memory cell, 5 V is applied to the word lines WL of the non-selected memory cells, 5 V is applied to the selector line SL2, 0 V is applied to the well substrate W, and 0 V is applied to the common source line S. Thus, the transistors of all non-selected memory cells, other than the selected memory cell, are turned on. When "0" data is stored in the selected memory cell, this memory cell is in the non-conductive state and the bit line potential remains at 5 V. If "1" data is stored in the selected memory cell, this memory cell is in the conductive state and the bit line potential is discharged and dropped. A data sense operation is effected by sensing the bit line potential at the time of read-out.

FIGS. 4, 5A and 5B show distributions of thresholds of memory cells at the time of erase and write operations. In the erase operation, the bit line BL is opened, 0 V is applied to the selector line SL1, 0 V is applied to the word line WL of the memory cell, 0 V is applied to the selector line SL2, 18 V is applied to the well substrate w, and 18 V is applied to the common source line S. Thus, a tunnel current flows across the floating gate and the well via the gate insulative film, and the threshold value lowers to 0 V or less. FIG. 4 shows a shift of the threshold value distribution.

At the time of the write operation, different voltages are applied in accordance with write data. Specifically, in the case of "0" data write (i.e. in the case of shifting the threshold value), 0 V is applied to the bit line BL. In the case of "1" data write (i.e. in the case of not shifting the threshold value), 9 V is applied to the bit line BL. A potential of 11 V is applied to the selector line SL1, 18 V is applied to the word line WL of the selected memory cell, 9 V is applied to the word line WL of the non-selected memory cell, 0 V is applied to the selector line SL2, 0 V is applied to the well W, and 0 V is applied to the common source line S. As a result, the selector transistor Q1 and all memory cells M1 to M16 are turned on and set at the same potential as the bit line potential (no consideration is given to a drop in threshold value of transistors). Accordingly, in the memory cell in which 0 V is applied to the bit line BL, a high voltage of 18 V is applied between the channel and the control electrode, a tunnel current flows, and the threshold value shifts to the positive side. On the other hand, in the memory cell in which 9 V is applied to the bit line BL, only 9 V is applied between the channel and the control electrode. Thus, the threshold value is not shifted to the positive side. This "9 V" is called "write prohibition voltage". FIGS. 5A and 5B illustrate the shift of distribution of these threshold values.

As stated above, in the non-volatile semiconductor device, a write operation is effected by using purely physical means of a tunnel current (Fowler-Nordheim tunneling). Thus, the write speed varies from memory cell to memory cell. Even if the same write time is set, a threshold value of a certain memory cell may fall within a range of 0 V to 5 V, but a threshold value of another memory cell may exceed 5 V. This phenomenon is illustrated in FIG. 6.

Specifically, "0" data is written in a cell with low write speed at time t1. However, when "0" data is written in a cell with high write speed, the threshold voltage has exceeded 5 V which is an upper limit value. As described above, at the time of read-out of the NAND type flash memory, 5 V is applied to the word line of the non-selected memory cell to turn on the word line. If the threshold of a certain memory cell exceeds 5 V, data in all memory cells connected in series to this memory cell cannot be read out because the series current path is cut off.

It is therefore necessary to narrow the distribution of thresholds to a predetermined value range. In order to keep a sufficient read-out margin, it is desirable to narrow this distribution to a smaller range.

A bit-by bit verify method has been proposed to solve this problem. According to this method, the write time is not made constant for all memory cells, unlike the above-described technique, and different write times are set for the respective memory cells. In principle, the write time is divided into short time periods, and the following steps are repeated: write→verify→ rewrite data set→write→verify→rewrite data set . . . . As regards the memory cell the threshold of which has been sufficiently increased by the verify operation, the rewrite data is set so as to prevent the write operation in the next cycle.

Thus, the cell with high write speed completes the write operation earlier, and the threshold thereof will not increase afterwards (in this case, an increase in threshold due to a potential difference of 9 V is ignored). FIG. 7 illustrates this technique. The cell with high write speed completes the write operation at time t0, and the cell with low write speed completes the write operation at time t1. The threshold values are set near 3.5 V.

The bit-by-bit verify method can be realized most easily by making use of an external system such as a CPU or software. However, in the NAND type flash memory wherein several-thousand bits are written simultaneously, it is not practical to input/output several-thousand bit data by using an I/O interface of 8 bits at most in each verify operation. In addition, a several-thousand bit register or comparator needs to be provided externally. Accordingly, it is most desirable to perform the verify operation and rewrite data set operation within the chip.

In a most primitive method for achieving the bit-by-bit verify, it will suffice to provide only the same number of flip-flop circuits for latching write data, flip-flop circuits for latching read-out data and comparators for comparing both write data and read-out data as the number of bit lines (several thousand). However, this is impractical.

FIG. 8 shows schematically a circuit for achieving the bit-by-bit verify operation within the chip. This circuit comprises flip-flop circuits 1 (1−x; x=1-3) for temporarily storing write data; bit lines BL (BLx; x=1-3); NAND type memory cells 2 (2−x; x=1-3), as illustrated in FIG. 1, connected to the bit lines BL; P-channel transistors Q3 for charging the bit lines BL; N-channel transistors Q4 for connecting the bit lines BL and flip-flops 1; and N-channel transistors Q5 and Q6 connected in series between a power supply potential of 5 V and the bit lines BL. The gates of transistors Q5 are connected to bit-line-side terminals of the flip-flops 1.

For the purpose of simplicity, FIG. 8 shows the circuit corresponding to only three bit lines, but in fact there are several thousand bit lines. A signal line $\phi 1$ is connected to the gates of all transistors Q3, a signal line $\phi 2$ is connected to the gates of all transistors Q6, and a signal line $\phi 3$ is connected to the gates of all transistors Q4. The sources of the transistors Q3 are connected to a power supply having a potential of 9 V at the time of write and a potential of 5 V at the other time. In addition, a power supply for the flip-flop circuits has a potential of 9 V at the time of write and a potential of 5 V at the other time.

The operation of the circuit shown in FIG. 8 will now be described with reference to FIG. 9 showing waveforms at the time of the write operation. Suppose that "0" data is written in the memory cell 2-1, "0" data in the memory cell 2—2, and "1" data in the memory cell 2-3, and that data is written less easily in the memory cell 2—2 than in the memory cell 2-1.

At first, write data supplied from the outside via column gates (not shown) is latched in the respective the flip-flop circuits 1. Specifically, a bit-line-side node N1 of the flip-flop circuit 1—1 is set at 0 V, a bit-line-side node N2 of the flip-flop circuit 1-2 is set at 0 V, and a bit-line-side node N3 of the flip-flop circuit 1-3 is set at 5 V. In this state, a first write operation (WRITE-1) starts.

At time t10, when the signal line $\phi 1$ is set at 0 V, the transistors Q3 are rendered conductive and the bit lines BL are charged at 9 V. Since the power supply for the flip-flop circuits rises to 9 V, the node N3 has a potential of 9 V.

At time t11, the potential of signal line $\phi 1$ rises to 10 V, and the charge of the bit lines is completed. At the same time, the potential of signal line $\phi 3$ rises to 10 V, and the bit lines are discharged according to the potentials of nodes N (Nx; x=1–3). Specifically, since the potentials of nodes N1 and N2 are 0 V, the bit lines BL1 and BL2 are discharged to 0 V. Since the potential of node N3 is 9 V, the bit line BL3 is discharged to 9 V. This potential of 9 V functions as a write prohibition potential for the memory cell 2-3. Under this condition, a write voltage is applied to each memory cell 2.

At time t12, the first write operation is completed, and a verify operation and a rewrite data set operation ("VERIFY") start. The potential of the signal line $\phi 1$ falls to 0 V, and the bit lines are charged at 5 V via the transistors Q3. At the same time, since the potential of the signal line $\phi 3$ falls to 0 V, the bit lines BL are electrically disconnected from the flip-flop circuits 1.

At time t13, the charging for the bit lines is completed, and the bit lines in the floating state are discharged by the memory cells. The discharge speed varies depending on the threshold values of the memory cells. If the write operation is not fully effected, the threshold value does not rise and the bit line is discharged. In the first write operation, the write operation is not fully effected in either the memory cell 2-1 or memory cell 2—2. Since the write operation for the memory cell 2-3 is not effected, the bit line is necessarily discharged.

At time t14, the potential of the signal line $\phi 2$ rises to 5 V. Then, all transistors Q6 are turned on. Since the potentials of nodes N1 and N2 are 0 V, the corresponding transistors Q5 are non-conductive and the bit lines BL1 and BL2 are not influenced. Since the potential of node N3 is 5 V, the bit line BL3 is connected to a power supply potential of 5 V via the transistors Q5 and Q6. As a result, the bit line BL3 is charged to 5 V. This operation is referred to as "recharging of bit line of '0' data write cell."

At time t15, the signal line $\phi3$ rises to 5 V, the bit lines are connected to the flip-flop circuits, and the bit line potentials are latched in the flip-flop circuits. The potentials latched at the nodes N1 to N3 of flip-flop circuits 1 are 0 V, 0 V and 5 V, respectively, from the uppermost node N1. This state remains the same as before the write operation.

At time t20, a second write operation (WRITE-2) starts. Specifically, 9 V-charging of the bit lines is effected between time t20 and time t21, and data write is effected in the memory cells between time t21 and time t22.

At time t22, second verify and rewrite data set operations are performed. Specifically, 5 V-charging of the bit lines is effected between time t22 and time t23, discharge of the bit lines by the memory cells 2 is effected between time t23 and time t24, and re-charging of the bit lines of "0" write cells is stated from time t24. It should be noted that the potential of the bit line BL1 does not substantially decrease from 5 V. This indicates that the data write in the memory cell 2-1 has been completed.

At time t25, the bit lines are connected to the flip-flop circuits, and the bit line potentials are latched in the flip-flop circuits 1. The potentials latched in the nodes N1 to N3 of the flip-flop circuits are 5 V, 0 V, and 5 V, respectively, from the uppermost node. It should be noted that the potential of the node N1 has changed to 5 V from 0 V in the first operation.

The bits in which write is completed are reset from 0 V to 5 V, and this 5 V is raised to function as 9 V-write prohibition voltage. Thus, no further write operations are effected in these bits.

At time t30, a third write operation (WRITE-3) starts. Specifically, 9 V-charging of the bit lines is effected between time t30 and time t31, and write in memory cells is effected between time t31 and time t32. It should be noted that the potential of the bit line BL1 is 9 V. This 9 V is the same write prohibition voltage as for the bit line BL3.

At time t32, third verify and rewrite data set operations are performed. Specifically, 5 V-charging of the bit lines is effected between time t32 and time t33, discharge of the bit lines by the memory cells 2 is effected between time t33 and time t34, and re-charging of the bit lines of "0" write cells is started from time t34. It should be noted that the potential of the bit line BL2 does not substantially decrease from 5 V. This indicates that the data write in the memory cell 2—2 has been completed.

At time t35, the bit lines are connected to the flip-flop circuits, and the bit line potentials are latched in the flip-flop circuits 1. The potentials latched at the nodes N1 to N3 of the flip-flop circuits are 5 V, 5 V and 5 V, respectively, from the uppermost node. It should be noted that the potential of node N2 has changed to 5 V from 0 V in the second operation. Thus, all (three bits) write operations have been completed.

The operation of the bit-by-bit verify circuit has been described, on the supposition of the ideal case (no interference between adjacent bit lines). This circuit, however, has a serious problem, i.e. a malfunction occurs in the verify operation due to interference between adjacent bit lines. This problem will now be described.

FIG. 10 shows realistic waveforms on the bit lines BL2 and LB3 between time t12 and time t15 in FIG. 9. At time t12, the verify and rewrite data set operations start. The bit lines BL2 and BL3 are charged to 5 V via the transistors Q3. Subsequently, charging of the bit lines is completed at time t13, and the bit lines in the floating state are discharged by the memory cells. The write in the memory cell 2—2 is not fully effected, the threshold value does not rise and the bit line BL2 is discharged. The bit line BL3 is necessarily discharged.

At time t14, the recharging of the bit lines of "0" write cells is performed. Specifically, the bit line BL3 is connected to the power supply potential of 5 V via the transistors Q5 and Q6. As a result, the bit line BL3 is charged to 5 V.

In the meantime, the bit lines extend from end to end of the memory cell array, and the capacitance between adjacent bit lines is not negligible. Thus, as shown in FIG. 11, floating capacitances C1 and C2 occur parasitically. Consequently, when the bit line BL3 is recharged, the potential of the bit line BL2 will rise due to coupling of capacitance. If the bit line BL2 is sensed in this state, distinction between the write-completed bit and write-incomplete bit becomes unclear. As a result, the potential of node N of the corresponding flip-flop circuit may be increased to 5 V, although the write operation is not completed, and the subsequent write operation may be disabled.

In order to overcome the above problem, a verify method called "bit line leaking method" has been proposed. According to this method, over the entire verify operation time (time t12 to time t15), the potential of the signal line $\phi2$ is raised to render the transistors Q6 conductive. Thus, the bit line BL3 retains a potential of 5 V from the beginning, and no abrupt change in potential occurs due to recharging.

Accordingly, no malfunction occurs due to interference between the bit lines. However, since the electric current is kept flowing through the conductive cell (memory cell 2-3), power consumption increases. Moreover, since the bit line potential at the time the current is kept flowing is determined by division of resistance between the transistors Q5 and Q6 and memory cell 2-3, the bit line potential cannot perfectly be maintained at 5 V and it is stabilized at a predetermined potential below 5 V. Thus, recharging cannot be avoided and the same problem as stated above will occur. Furthermore, the source potential floats due to the leak current of the bit line, and the read-out margin of the read-out cell lowers.

SUMMARY OF THE INVENTION

The object of the present invention is to provide a non-volatile semiconductor memory device which can overcome the above drawbacks and achieve a bit-by-bit verify operation without influence due to interference between bit lines or an increase in power consumption.

This object can be achieved by a non-volatile semiconductor memory device having a verify mode, the device comprising: bit line means; non-volatile memory cell means connected to said bit line means; setting means for setting the bit line means to a reference potential; flip-flop circuit means for holding latch data in one of first and second states; coupling means for coupling said flip-flop circuit means and the bit line means: latch control means for setting the latch data in the flip-flop circuit means in accordance with data to be written in said memory cell means; and data setting circuit means for forcibly inverting the latch data of the flip-flop circuit means in response to the reference potential of the bit line means when the reference potential of the bit line means reaches a predetermined voltage value in the verify mode for the memory cell means.

According to the present invention, write data input from outside is held in the flip-flop circuit in the first state or second state. As regards the bit of the first state in the flip-flop circuit, a write operation is effected in the non-volatile memory cell, and the threshold is shifted. As regards the bit of the second state in the flip-flop circuit, the write operation is not effected, and the threshold is not shifted.

Subsequently, at the time of the verify operation, the data in the non-volatile memory cell is read out, the charging operation by the setting means is completed, and the potential bit line in the floating state is discharged. When the threshold value of the non-volatile memory cell which performs the write operation falls within the second range or desirable threshold range, the write operation is completed and the data setting circuit functioning as forcible inversion means inverts the state of the flip-flop circuit and maintains the second state. In this case, the subsequent write operation for the associated bit is not performed.

The threshold of the non-volatile memory cell which performs the write operation does not fall within the second range or desired threshold range, the first state of the flip-flop circuit is maintained. Accordingly, the subsequent write operation is performed. When data is not written in the non-volatile memory cell, the second state of the flip-flop is maintained from the beginning. Accordingly, the subsequent write operation is not performed.

As stated above, when the data write is completed by the single write/verify operation, the data in the flip-flop circuit is inverted by the forcible inversion type data setting circuit. As a result, a bit-by-bit verify operation is realized. In addition, unlike the prior art, the bit line potential is not varied, because the bit line potential is input to only the forcible inversion means. Furthermore, there is neither a need to provide a current through-path, nor an increase in power consumption.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a circuit diagram showing a cell structure of a NAND type flash memory;

FIG. 2 illustrates a distribution of threshold values, based on the number of threshold values of memory cells shown in FIG. 1;

FIG. 3 is a table showing voltages to be applied to memory cells at the time of read, erase and write in the memory cells shown in FIG. 1;

FIG. 4 shows a distribution of threshold values having the memory cells at the time of read;

FIG. 5A shows a distribution of threshold values of the memory cells in a first state at the time of write;

FIG. 5B shows a distribution of threshold values of the memory cells in a second state at the time of write;

FIG. 6 is a first characteristic diagram showing a variance in write speed among the memory cells;

FIG. 10 shows realistic waveforms in a part of the time period shown in FIG. 9;

FIG. 11 is a circuit diagram illustrating a problem in the structure shown in FIG. 8;

FIG. 15 to FIG. 18 are circuit diagrams showing structural modifications of a main part of the first embodiment;

FIG. 44 is a circuit diagram showing a main part of a non-volatile semiconductor memory device according to a fifth embodiment of the invention;

FIG. 45 to FIG. 48 are circuit diagrams showing structures of first to fourth modifications of the main part of the fifth embodiment;

FIG. 51 to FIG. 54 are circuit diagrams showing structures of first to fourth applied examples of the main part of the first embodiment;

FIG. 87 to FIG. 90 are circuit diagrams showing structures of fifth to eighth applied examples of the main part of the third embodiment;

FIG. 91 to FIG. 98 are circuit diagrams showing structures of ninth to 16th applied examples of the main part of the fourth embodiment;

FIG. 99 to FIG. 102 are circuit diagrams showing structures of first to fourth applied examples of the main part of the fifth embodiment;

FIG. 103 to FIG. 106 are circuit diagrams showing structures of ninth to 12th applied examples of the main part of the first embodiment;

FIG. 107 to FIG. 114 are circuit diagrams showing structures of 17th to 24th applied examples of the main part of the second embodiment;

FIG. 119 to FIG. 126 are circuit diagrams showing structures of 17th to 24th applied examples of the main part of the fourth embodiment;

FIG. 127 is a circuit diagram showing the structure of a most desirable embodiment of the invention;

DETAILED DESCRIPTION OF THE PREFERRED EMBODIMENTS

Figure 7:
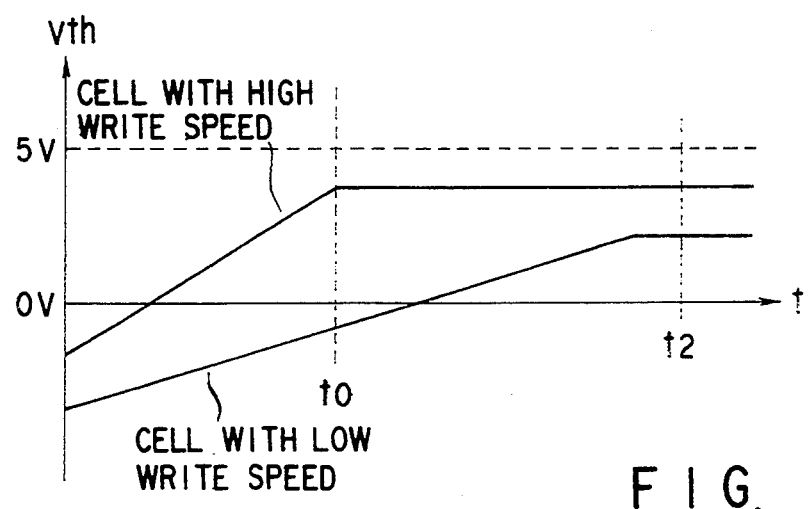
FIG. 7 is a second characteristic diagram showing a variance in write speed among the memory cells.
Figure 8:
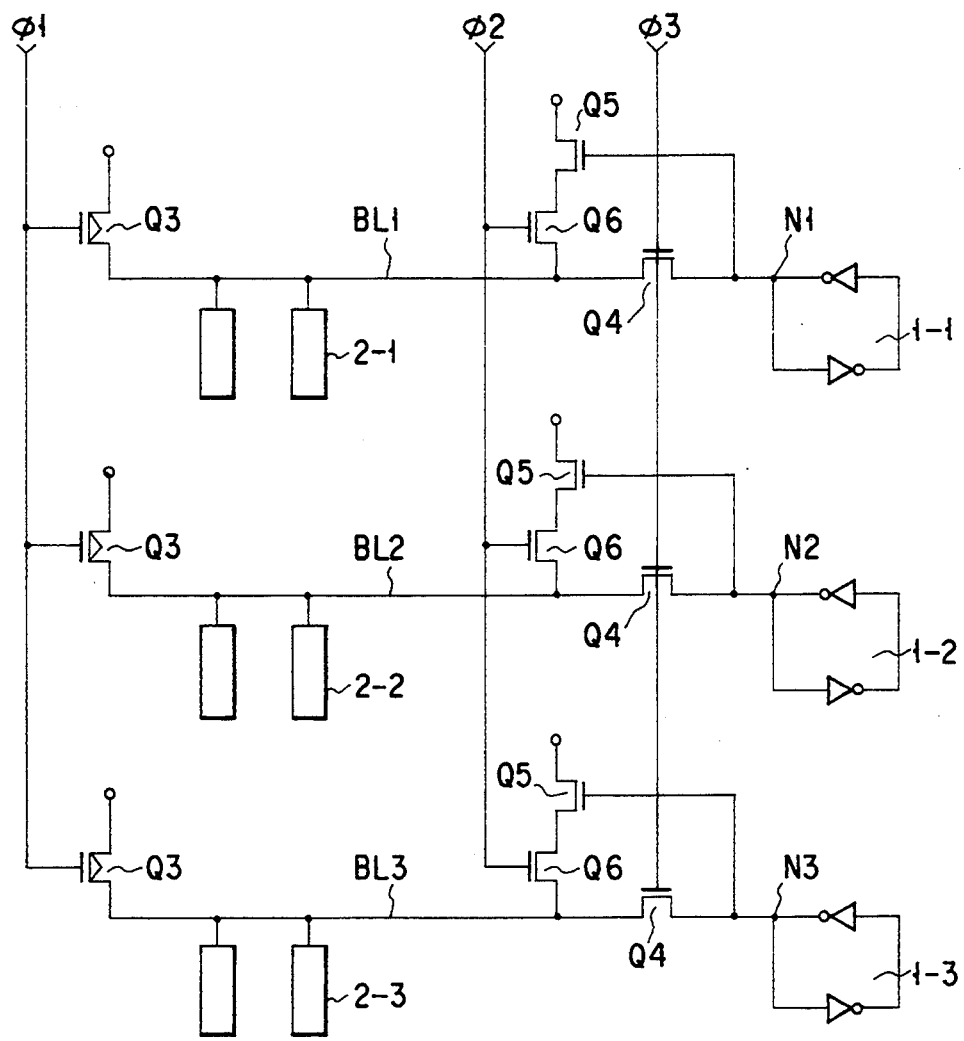
FIG. 8 shows schematically a conventional circuit for achieving a bit-by-bit verify operation within a semiconductor chip.
Figure 9:
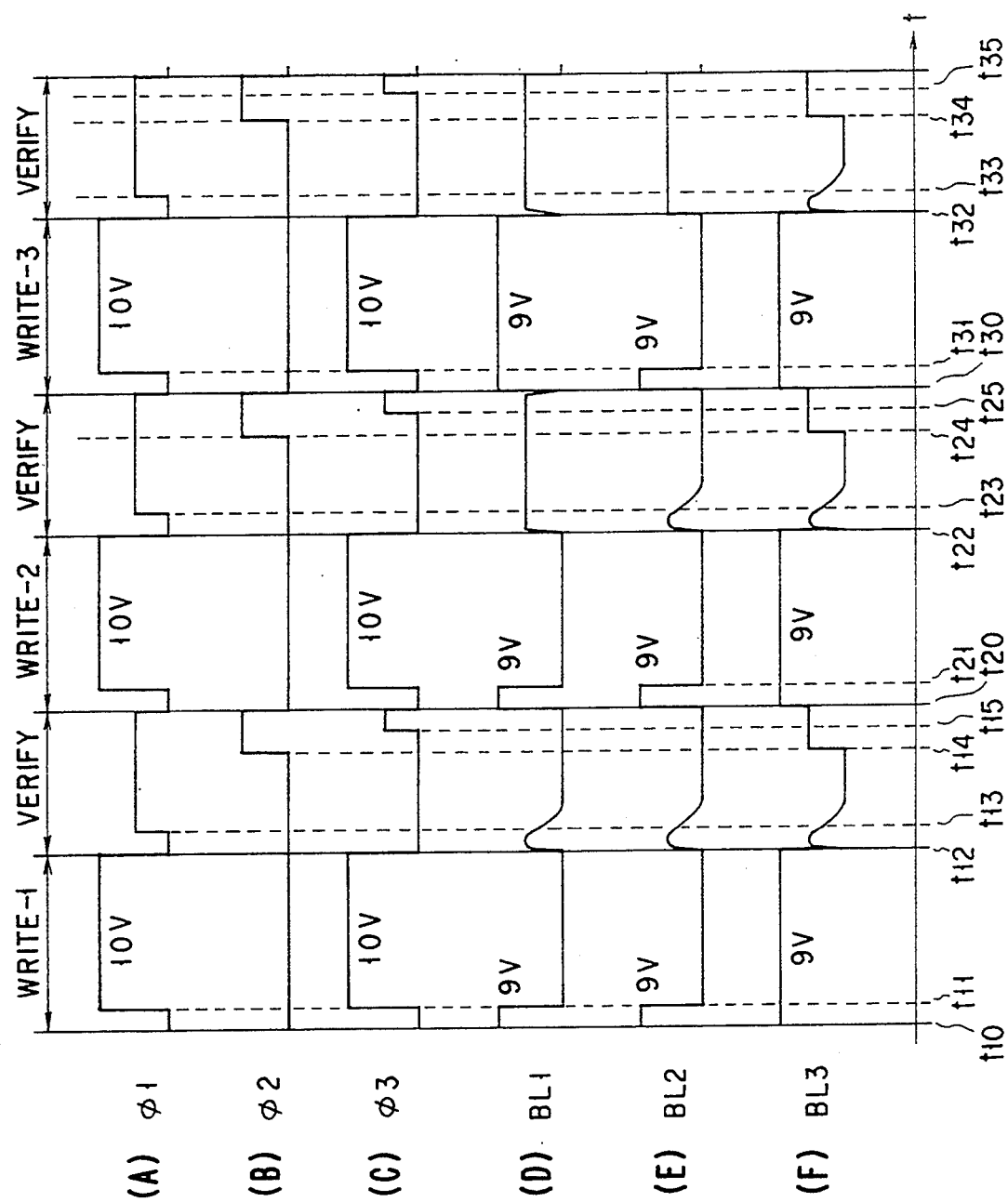
FIG. 9 shows operational waveforms at the time of write in the structure shown in FIG. 8.
Figure 12:
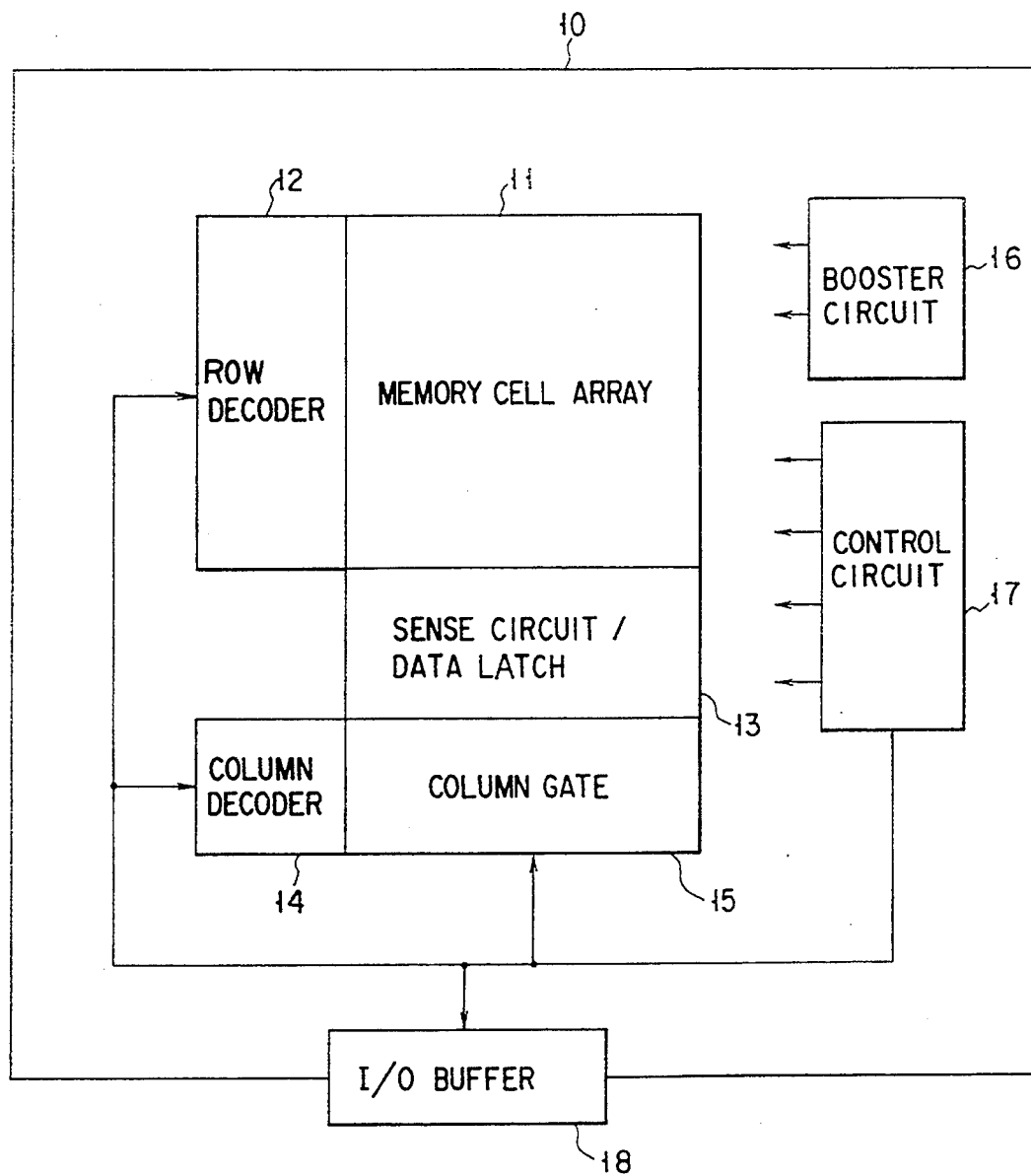
FIG. 12 is a block diagram showing the entire circuit configuration of a non-volatile semiconductor memory device according to an embodiment of the present invention.

FIG. 12 is a circuit block diagram showing an entire structure of a non-volatile semiconductor memory device according to a first embodiment of the present invention. This semiconductor device of the first embodiment is a NAND type flash memory 10. Specifically, the non-volatile semiconductor memory device 10 comprises a memory cell array 11, a row decoder 12, sense circuit/write data latches 13, a column decoder 14, a column gate 15, a booster circuit 16, a control circuit 17 and an I/O buffer 18.

The memory cell array 11 comprises a plurality of NAND-type memory cells arranged in a matrix, several thousand bit lines BL extending in a column direction, and several thousand word lines WL extending in a row direction. The row decoder 12 selects the word line on the basis of an address input from the outside. Signal lines of the sense circuit/write data latch 13 are connected at one end to the bit lines and at the other end to the I/O buffer 18 via the column gate 15. The column decoder 14 controls the column gate 15 on the basis of an address input from the outside, and selects the bit line and the corresponding sense circuit/write data latch circuit 13. The booster circuit 16 supplies high voltages necessary for the write operation and erase operation. The control circuit 17 controls a write operation, an erase operation, a read-out operation, etc. The I/O buffer 18 functions as interface with the outside of the chip.

The details of the memory cell within the memory cell array 11 are as shown in FIG. 1. Specifically, as shown in FIG. 1, non-volatile memory cells M1 to M16, each comprising a MOS transistor having a floating gate, are connected in series. The memory cell M1 at one end of the group of the memory cells M1 to M16 is connected to a bit line BL via a selector transistor Q1, and the memory cell M16 at the other end thereof is connected to a common source line S via a selector transistor Q2. Each transistor constituting each cell is formed on a single well substrate w. Control gates of memory cells M1 to M16 are connected to word lines WL1 to WL16, a control electrode of the selector transistor Q1 is connected to a selector line SL1, and a control gate of the selector transistor Q2 is connected to a selector line SL2.

Each of the memory cells M1 to M16 has a threshold value corresponding to data to be stored. When "0" data is stored, the threshold value is set at more than 0 V and less than 5 V. When "1" data is stored, the threshold value is set at less than 0 V. (More appropriately, these threshold values are set in narrow ranges in order to provide some margin.)

FIG. 2 shows a distribution of threshold values among the memory cells, and FIG. 3 shows the voltages to be applied to the memory cells at the time of read, erase and write operations.

In the read operation, the bit line BL is precharged at 5 V in a floating state. Then, 5 V is applied to the selector line SL1, 0 V is applied to the word line WL of the selected memory cell, 5 V is applied to the word lines WL of the non-selected memory cells, 5 V is applied to the selector line SL2, 0 V is applied to the well substrate W, and 0 V is applied to the common source line S. Thus, the transistors of all non-selected memory cells, other than the selected memory cell, are turned on. When "0" data is stored in the selected memory cell, this memory cell is in the non-conductive state and the bit line potential remains at 5 V. If "1" data is stored in the selected memory cell, this memory cell is in the conductive state and the bit line potential is discharged and dropped. A data sense operation is effected by sensing the bit line potential at the time of read-out.

In the erase operation, the bit line BL is opened, 0 V is applied to the selector line SL1, 0 V is applied to the word line WL of the memory cell, 0 V is applied to the selector line SL2, 18 V is applied to the well substrate w, and 18 V is applied to the common source line S. Thus, a tunnel current flows across the floating gate and the well via the gate insulating film, and the threshold value lowers to 0 V or less.

At the time of the write operation, different voltages are applied in accordance with write data. Specifically, in the case of "0" data write (i.e. in the case of shifting the threshold value), 0 V is applied to the bit line BL. In the case of "1" data write (i.e. in the case of not shifting the threshold value), 9 V is applied to the bit line BL. A potential of 11 V is applied to the selector line SL1, 18 V is applied to the word line WL of the selected memory cell, 9 V is applied to the word line WL of the non-selected memory cell, 0 V is applied to the selector line SL2, 0 V is applied to the well W, and 0 V is applied to the common source line S. As a result, the selector transistor Q1 and all memory cells M1 to M16 are turned on and set at the same potential as the bit line potential (no consideration is given to a drop in threshold value of transistors). Accordingly, in the memory cell in which 0 V is applied to the bit line BL, a high voltage of 18 V is applied between the channel and the control electrode, a tunnel current flows, and the threshold value shifts to the positive side. On the other hand, in the memory cell in which 9 V is applied to the bit line BL, only 9 V is applied between the channel and the control electrode. Thus, the threshold value is not shifted to the positive side.

Figure 13:
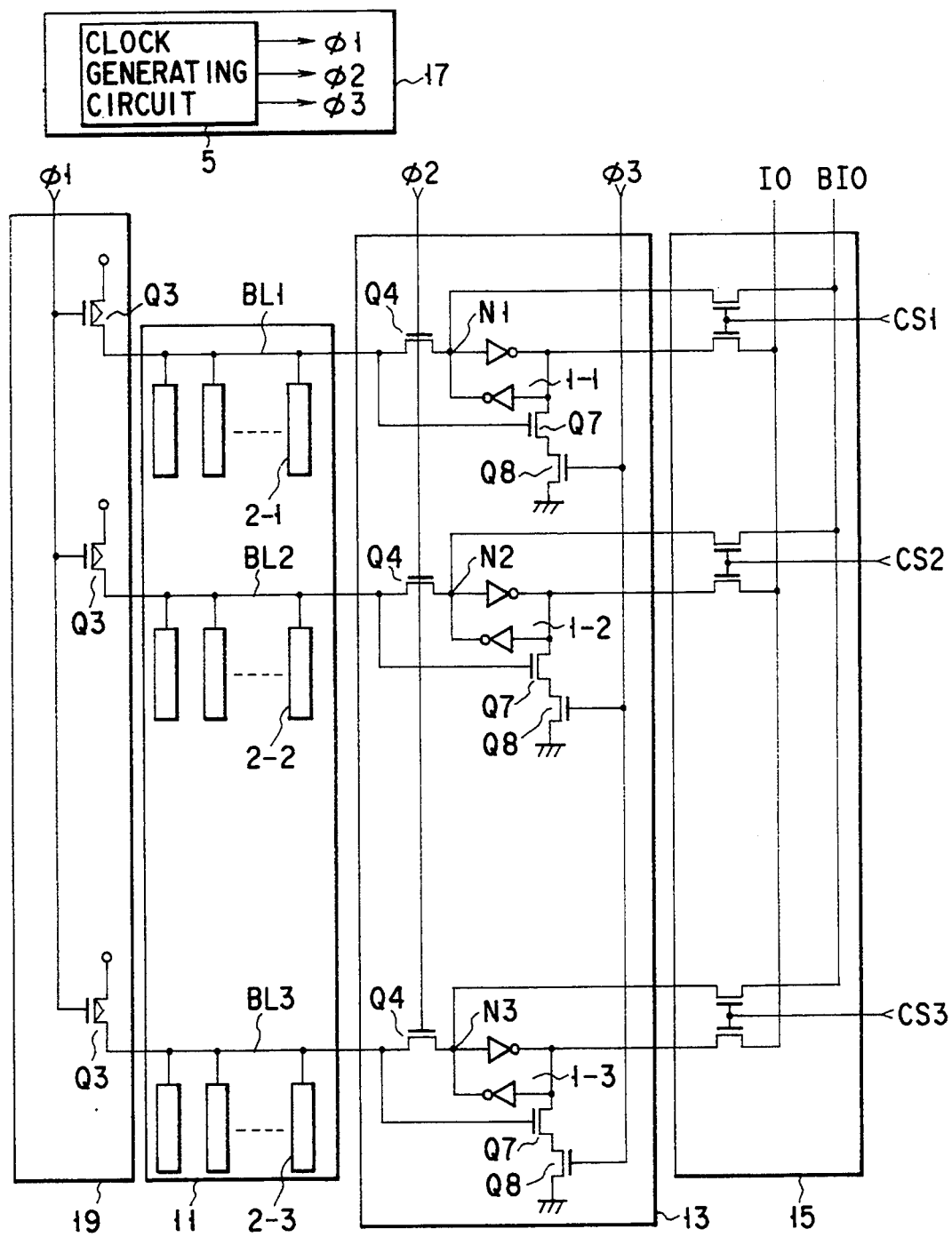
FIG. 13 is a circuit diagram showing a main part of a non-volatile semiconductor memory device according to a first embodiment of the invention.

FIG. 13 is a circuit diagram showing a main part of the non-volatile semiconductor memory device of the present invention, and specifically shows circuit portions associated with three bit lines in the non-volatile semiconductor memory device 10 shown in FIG. 12. FIG. 13 shows only those parts of the memory cell array 11, sense circuit/write data latches 13, column gate 15 and control circuit 17 shown in FIG. 12, which are necessary for understanding the present invention.

As is shown in FIG. 13, the circuit associated with one bit line comprises a flip-flop circuit 1 (1—x; x=1–3) for temporarily storing write data; a bit line BL (BLx; x=1–3); NAND-type memory cells 2 (2—x; x=1–3) connected to the bit line BL, as described in connection with FIG. 1; a P-channel transistor Q3 for charging the bit line BL; an N-channel transistor Q4 for connecting the bit line BL and flip-flop circuit 1; and N-channel transistors Q7 and Q8 connected in series between a 0 V-ground potential and a node of the flip-flop circuit 1 on the opposite side to the bit line BL. The transistors Q7 and Q8 constitute forcible inversion means (data setting circuit). The gate of the transistor Q7 is connected to the bit line BL.

The gates of all transistors Q3 are connected to a signal line $\phi 1$. This transistor Q3 constitutes charging unit (19). The gates of all transistors Q4 are connected to a signal line $\phi 2$, and the gates of all transistors Q8 are connected to a signal line $\phi 3$. A part of the control circuit 17 is extracted and shown as a clock generating circuit 5. The clock generating circuit 5 activates the signal lines $\phi 1$, $\phi 2$ and $\phi 3$ at predetermined timing.

The sources of the transistors Q3 are connected to a power supply having a potential of 9 V at the time of write and a potential of 5 V at the other time. In addition, a power supply for the flip-flop circuits has a potential of 9 V at the time of write and a potential of 5 V at the other time.

Figure 14:
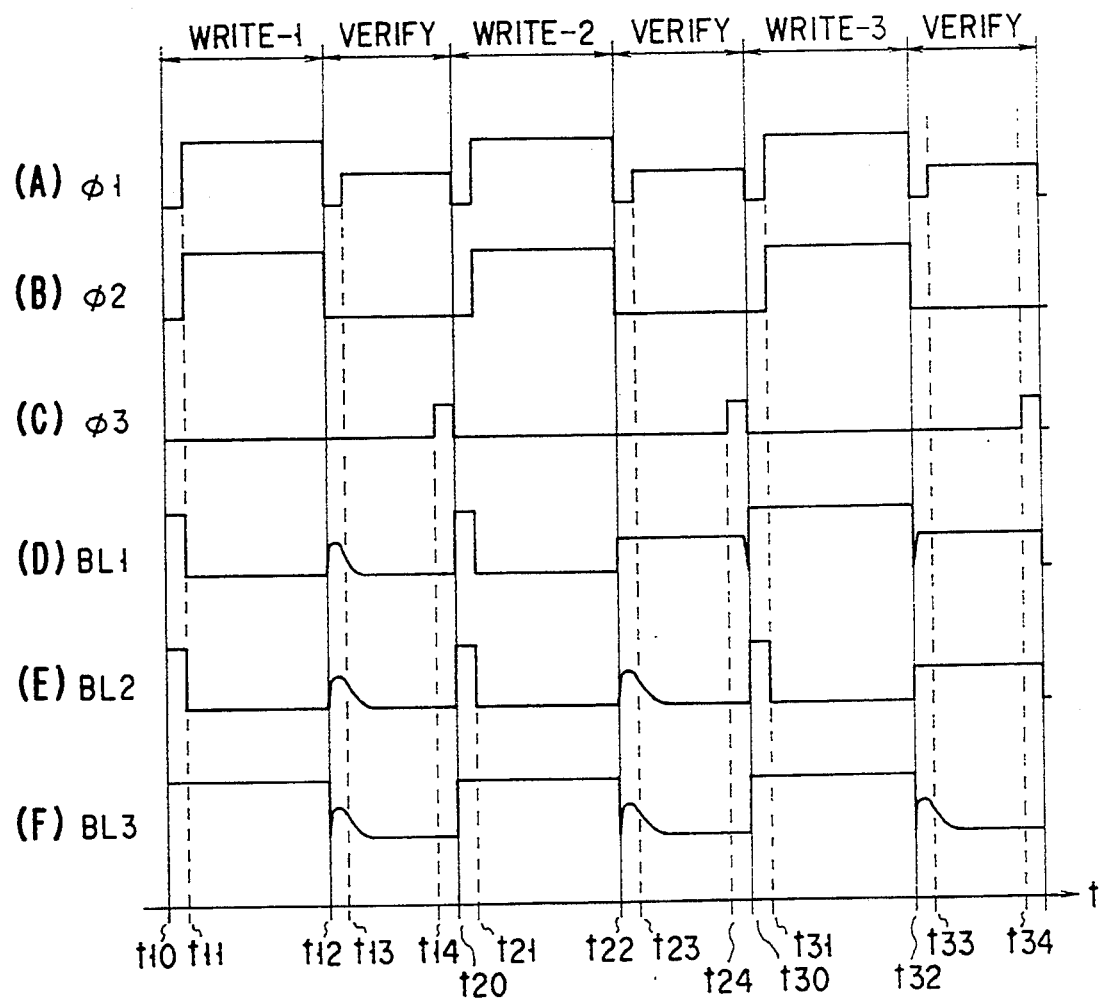
FIG. 14 shows operational waveforms at the time of write in the circuit shown in FIG. 13.

The operation of the circuit shown in FIG. 13 will now be described with reference to FIG. 14 showing waveforms at the time of the write operation. Suppose that "0" data is written in the memory cell 2-1, "0" data in the memory cell 2—2, and "1" data in the memory cell 2-3, and that data is written less easily in the memory cell 2—2 than in the memory cell 2-1.

At first, write data supplied from the outside via IO lines/BIO lines (lines of inverted signals of IO) and the column gates 15 is latched in the respective flip-flop circuits 1. Specifically, a bit-line-side node N1 of the flip-flop circuit 1—1 is set at 0 V, a bit-line-side node N2 of the flip-flop circuit 1-2 is set at 0V, and a bit-line-side node N3 of the flip-flop circuit 1-3 is set at 5 V. In this state, a first write operation (WRITE-1) starts.

At time t10, when the signal line $\phi 1$ is set at 0 V, the transistors Q3 are rendered conductive and the bit lines BL are charged at 9 V. Since the power supply for the flip-flop circuits rises to 9 V, the node N3 has a potential of 9 V.

At time t11, the potential of signal line $\phi 1$ rises to 10 V, and the charge of the bit lines is completed. At the same time, the potential of signal line $\phi 2$ rises to 10 V, and the bit lines are discharged according to the potentials of nodes N. Specifically, since the potentials of nodes N1 and N2 are 0 V, the bit lines BL1 and BL2 are discharged to 0 V. Since the potential of node N3 is 9 V, the bit line BL3 is discharged to 9 V. This potential of 9 V functions as a write prohibition potential for the memory cell 2-3. Under this condition, a write voltage is applied to each memory cell 2.

At time t12, the first write operation is completed, and a verify operation and a rewrite data set operation ("VERIFY") start. The potential of the signal line $\phi 1$ falls to 100 V, and the bit lines are charged at 5 V via the transistors Q3. At the same time, since the potential of the signal line $\phi 2$ falls to 0 V, the bit lines BL are disconnected from the flip-flop circuits 1.

At time t13, the charging for the bit lines is completed, and the bit lines in the floating state are discharged by the memory cells. The discharge speed varies depending on the threshold values of the memory cells. If the write operation is not fully effected, the threshold value does not rise and the bit line is discharged. In the first write operation, the write operation is not fully effected in either the memory cell 2-1 or memory cell 2—2. Since the write operation for the memory cell 2-3 is not effected, the bit line is necessarily discharged.

At time t14, the potential of the signal line $\phi 3$ rises to 5 V. Then, all transistors Q8 are turned on. In the first write operation, none of the three memory cells has completed the write operation, and all bit lines are discharged and have low levels. Accordingly, the transistor Q7 is rendered non-conductive, and the flip-flop circuit 1 is not influenced at all. In addition, unlike the prior art, the "recharging of bit line of '0' data write cell" is not performed. The potentials latched at the nodes N1 to N3 of flip-flop circuits 1 are 0 V, 0 V and 5 V, respectively, from the uppermost node N1. This state is the same as before the write operation.

At time t20, a second write operation (WRITE-2) starts. Specifically, 9 V-charging of the bit lines is effected between time t20 and time t21, and data write is effected in the memory cells between time t21 and time t22.

At time t22, second verify and rewrite data set operations are performed. Specifically, 5 V-charging of the bit lines is effected between time t22 and time t23, and discharge of the bit lines by the memory cells 2 is effected between time t23 and time t24. It should be noted that the potential of the bit line BL1 does not substantially decrease from 5 V. This indicates that the data write in the memory cell 2-1 has been completed.

At time t24, when the potential of the signal line $\phi 3$ rises to 5 V, the transistors Q8 are turned on. Unlike the first operation, the potential of the bit line BL1 is at high level. Thus, the transistor Q7 associated with the bit line BL1 is rendered conductive.

Then, the node of the flip-flop circuit 1—1, which is opposed to the bit line BL, is decreased towards the ground potential, and the data retained in the flip-flop circuit is inverted. In other words, the retained data is inverted by the forcible inversion means. The potentials latched in the nodes N1 to N3 of the flip-flop circuit 1 are 5 V, 0 V, and 5 V, respectively, from the uppermost node. It should be noted that the data-written bits are reset from 0 V to 5 V successively. This 5 V is raised to function as 9 V-write prohibition voltage. Thus, no further write operations are effected in these bits.

At time t30, a third write operation (WRITE-3) starts. Specifically, 9 V-charging of the bit lines is effected between time t30 and time t31, and write in memory cells is effected between time t31 and time t32. It should be noted that the potential of the bit line BL1 is 9 V. This 9 V is the same write prohibition voltage as for the bit line BL3.

At time t32, third verify and rewrite data set operations are performed. Specifically, 5 V-charging of the bit lines is effected between time t32 and time t33, and discharge of the bit lines by the memory cells 2 is effected between time t33 and time t34. It should be noted that the potential of the bit line BL2 does not substantially decrease from 5 V. This indicates that the data write in the memory cell 2—2 has been completed.

At time t34, when the potential of the signal line $\phi3$ rises to 5 V, the transistors Q8 are turned on. Unlike the second operation, the potential of the bit line BL2 is at high level. Thus, the transistor Q7 associated with the bit line BL2 is rendered conductive. Then, the node of the flip-flop circuit 1-2, which is opposed to the bit line BL2, is decreased towards the ground potential, and the data retained in the flip-flop circuit 1-2 is inverted. In other words, the retained data is inverted by the forcible inversion means. The potentials latched in the nodes N1 to N3 of the flip-flop circuit 1 are 5 V, 5 V, and 5 V, respectively, from the uppermost node. It should be noted that the potential of the node N2 varied to 5 V from 0 V in the second operation. Thus, the write operations for all bits (three bits) have been completed.

As has been described above, when the data write is completed by every write and verify operation, the data in the flip-flop circuit is inverted by the forcible inverting means (data setting circuit). Thus, the bit-by-bit verify operation is achieved. Moreover, unlike the prior art, the bit line potential need not be varied, because the bit line potential is only input to the forcible inverting means. Furthermore, a through-passage for current is not provided, and power consumption does not increase.

Besides, since the gate of the transistor Q7 is used as a sense node, the sensitivity is high, and the sense operation is performed with low voltage.

FIGS. 15 to 18 are circuit diagrams showing modifications of the first embodiment. The circuit shown in FIG. 15 has the same structure as that shown in FIG. 13, and it is shown for comparison with other circuits.

In FIG. 16, the order of transistors Q7 and Q8 is reversed. A variation in potential of the bit line BL is not transmitted to the flip-flop circuit 1 via a capacitance of the gate/drain of the transistor Q7, and the data retained in the flip-flop circuit 1 is stabilized. In addition, since the source of the transistor Q7 is grounded, the flip-flop circuit 1 is inverted with a relatively low potential of the bit line BL, as compared to the circuit of FIG. 15. As a result, the stable verify operation can be effected, and possibility of error of the verify operation is reduced. (Conversely, in FIG. 15, as compared to FIG. 16, switching noise of the transistor Q8, which may adversely affect the flip-flop circuit, is cut off by the transistor Q7, and therefore erroneous inversion of the flip-flop circuit due to noise can be prevented.)

In FIG. 17, transistors Q8, Q7 and Q82 are connected in series, and the transistors Q81 and Q82 function as the transistor Q8 in FIG. 15. Accordingly, the advantages of both circuits shown in FIGS. 15 and 16 can be enjoyed, the stable verify operation is performed, and the erroneous inversion of the flip-flop circuit can be prevented.

In FIG. 18, the transistor Q8 shown in FIG. 15 is replaced by transistors Q91 and Q92. Complementary signals $\phi3$ and B$\phi3$ are input to the transistors Q91 and Q92. Specifically, when the potential of signal $\phi3$ rises to 5 V, the transistor Q91 is turned on and the flip-flop circuit 1 is forcibly inverted according to the potential of the bit line BL. If the potential of signal B$\phi3$ changes to 0 V, the transistor Q92 is turned on and the gate potential of the transistor Q7 is set at ground potential of 0 V. Since the transistors Q91 and Q92 are operated only by transfer of charge, the size thereof may be small. Accordingly, the area of the device can be made less than that in the series-connected transistor construction shown in FIGS. 15 to 17. Since both circuits operate similarly with the circuit of FIG. 13, a description of the details of the operation may be omitted.

Figure 19:
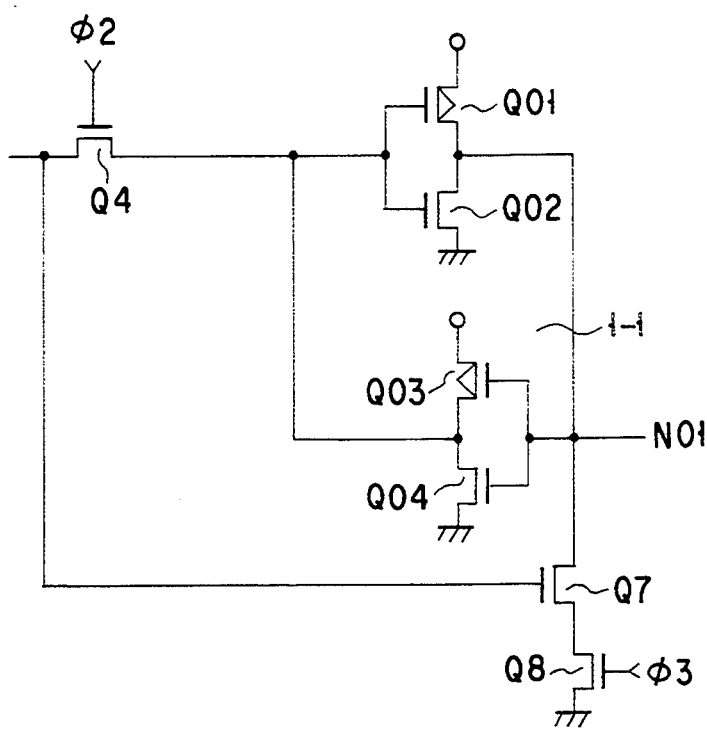
FIG. 19 is a circuit diagram showing the main part of the first embodiment in greater detail.

Conditions for maintaining stability of the operation in the above-described first embodiment will now be described. FIG. 19 is a circuit diagram for illustrating in greater detail the flip-flop circuit 1—1 transistors Q4, Q7 and Q8 in FIG. 13. The flip-flop circuit 1—1 is constituted by connecting in parallel in opposite directions an inverter comprising a P-channel transistor Q01 and an N-channel transistor Q02 and an inverter comprising a P-channel transistor Q03 and an N-channel transistor Q04. It is the transistor Q01 that charges a node N01 connected to the transistors Q7 and Q8 functioning as forcible inversion means. An important factor for the stable operation is the magnitude of conductance of the transistor Q01 and the transistors Q7 and Q8.

Figure 20:
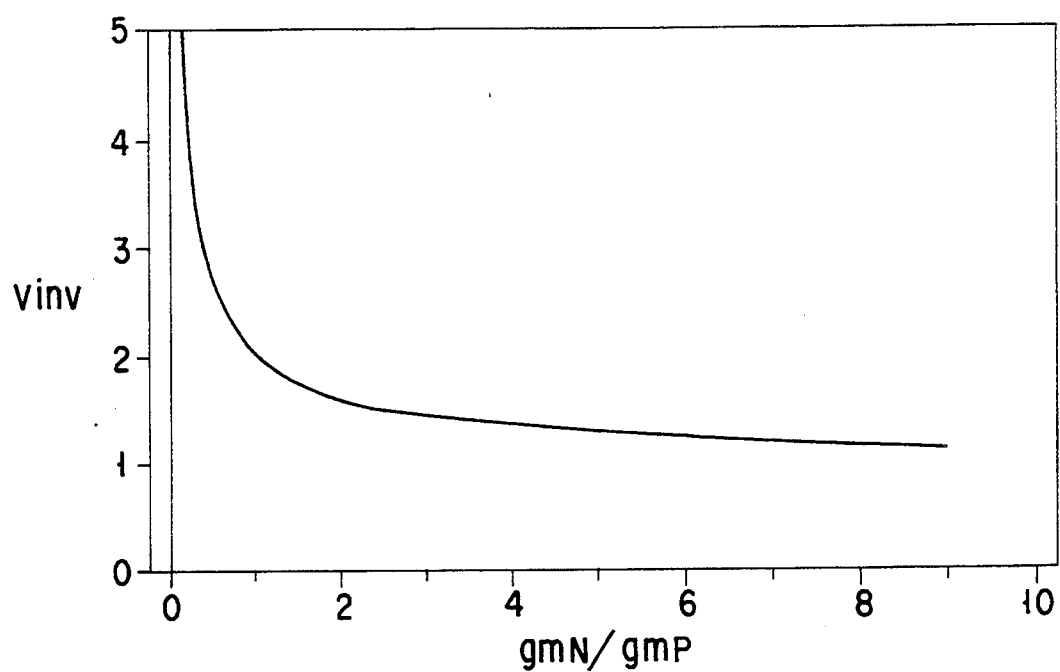
FIG. 20 is a characteristic diagram showing gmN/gmP dependency of inverted voltage Vinv.
Figure 21:
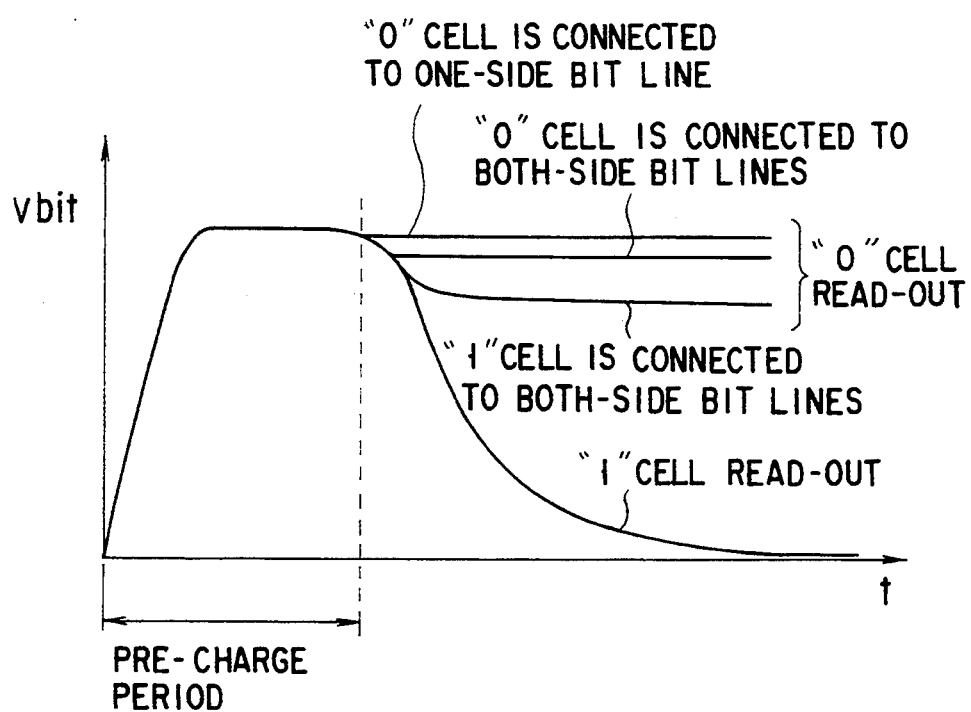
FIG. 21 is a characteristic diagram showing a variation in bit line potential Vbit at the time of operation of the circuit shown in FIG. 19.

Suppose that the conductance of the transistor Q01 is gmP and the equivalent conductance of the series-connected transistors Q7 and Q8 is gmN. FIG. 20 shows a simulation result of the gmN/gmP dependency of an inversion voltage Vinv (a minimum voltage value which needs to be applied to the bit line when the flip-flop is inverted) at the time Vcc (power supply voltage) is 5 V. The inversion voltage Vinv decreases steeply in the vicinity of gmN/gmP=1 and approaches gradually to the threshold value vth of the transistors Q7 and transistor Q8. Even in the case where an input signal or bit line potential Vbit is precharged to, e.g. vcc and then the conductance of the cell comes into free-running in an ideal "0" state ("0" cell read-out), the bit line potential Vbit is influenced by the capacitance between adjacent bit lines (according to this embodiment a problem of influence of capacitance between adjacent bit lines at the bit line charging time after the verify operation can be solved, but a problem of influence of capacitance at the time of free-running remains unsolved). If the potential of one of the adjacent bit lines decreases, the bit line potential vbit decreases, as shown in FIG. 21. Specifically, when a "0" cell is connected to both-side bit lines, substantially no decrease occurs in potential Vbit across these bit lines. However, if a "1" cell is connected to either or both-side bit lines, a decrease occurs in bit line potential Vbit. Thus, in order to surely sense "0" in the bit line with decreased potential, it is desirable that potential Vinv be low. In FIG. 20, from a point at which the gmN/gmP exceeds 1.8, the gmN/gmP dependency of inversion voltage decreases steeply and approaches a low Vth. Accordingly, it is desirable that the value of gmN/gmP be 1.8 or above. As a result, the operation of the flip-flop is stabilized, and a circuit hardly susceptible to fluctuation in power supply voltage, noise, etc. can be obtained. In addition, by setting this value as described above, the inversion voltage can be set with little influence of conductance fluctuation due to misalignment of masks and a fluctuation in gmN/gmP. These merits in manufacture can also be enjoyed.

In brief, the above advantages can be obtained if the equivalent conductance gmN of the series-connected MOS transistors serving as forcible inversion means and the conductance gmP of the MOS transistor for charging/discharging the junction node in the flip-flop circuit meet the formula:

$$gmN/gmP > 1.8 \qquad (i)$$

Figure 22:
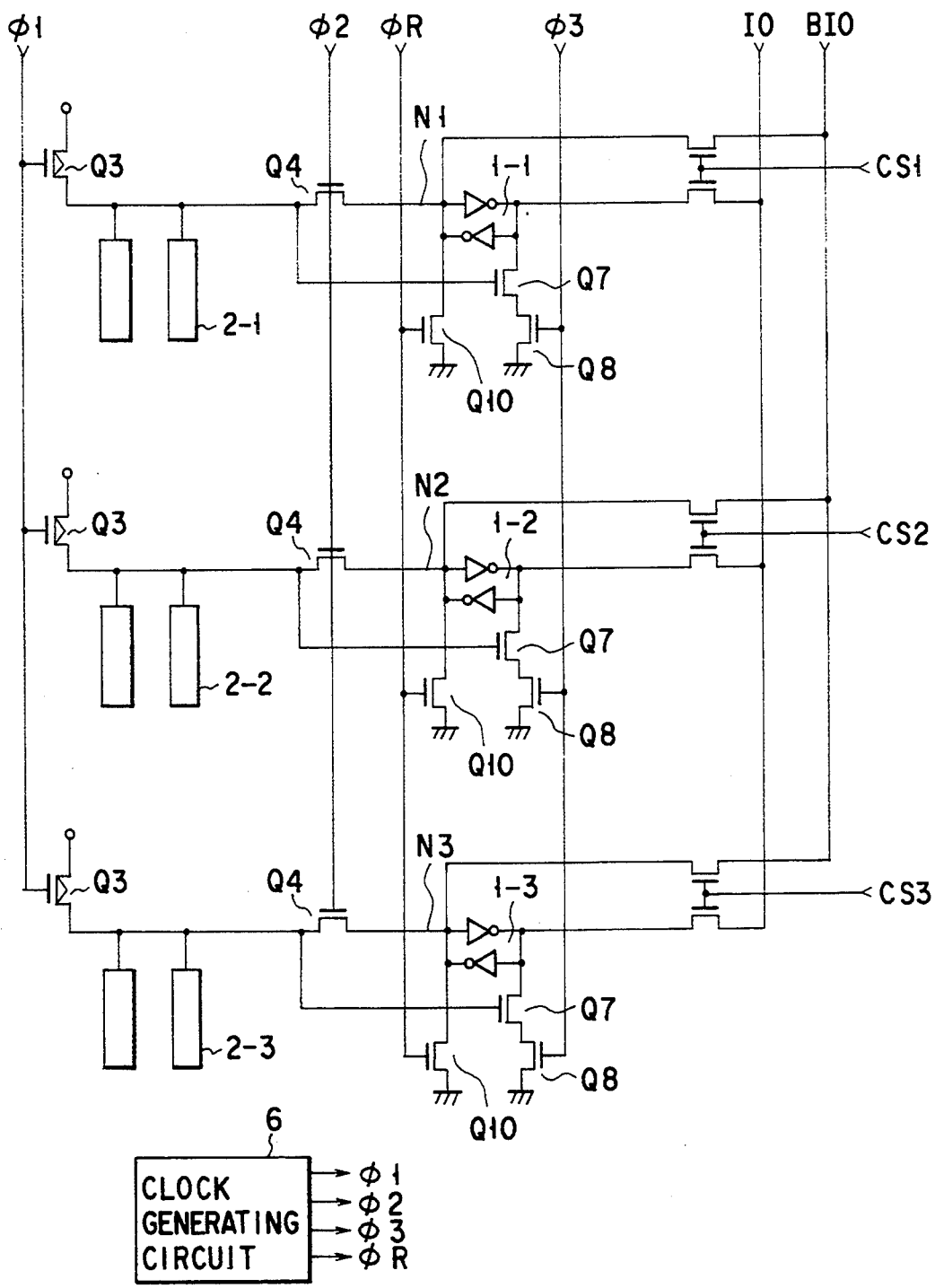
FIG. 22 is a circuit diagram showing a main part of a non-volatile semiconductor memory device according to a second embodiment of the invention.

FIG. 22 is a circuit showing a second embodiment of the present invention. The circuit elements common to those in the first embodiment are denoted by like reference numerals. A circuit portion associated with one bit line comprises a flip-flop circuit 1 for temporarily storing write data; a bit line BL, a NAND-type memory cell 2 (illustrated in FIG. 1) connected to the bit line BL; a P-channel transistor Q3 for charging the bit line BL; a transistor Q4 for connecting the bit line BL and the flip-flop circuit 1; and transistors Q7 and Q8 connected in series between the node of the flip-flop circuit 1, which is located on the opposite side of the bit line BL, and the ground potential of 0 V.

The transistors Q7 and Q8 constitute forcible inversion means (data setting circuit). The gate of the transistor Q7 is connected to the bit line BL. The gates of all transistors Q3 are connected to a signal line $\phi 1$. This transistor Q3 constitutes charging means. The gates of all transistors Q4 are connected to a signal line $\phi 2$, and the gates of all transistors Q8 are connected to a signal line $\phi 3$. The second embodiment differs from the first embodiment in that transistors Q10 having gates connected to a signal line $\phi R$ are connected between nodes N of flip-flop circuits 1 and the ground potential. The transistor Q10 constitutes reset means. A part of the control circuit 17 is extracted and shown as clock generating circuit 6 for driving the signal lines $\phi 1$, $\phi 2$, $\phi 3$ and $\phi R$ at predetermined time, as described later.

The sources of the transistors Q3 are connected to a power supply having a potential of 9 V at the time of write and a potential of 5 V at the other time. In addition, a power supply for the flip-flop circuits has a potential of 9 V at the time of write and a potential of 5 V at the other time.

Figure 23:
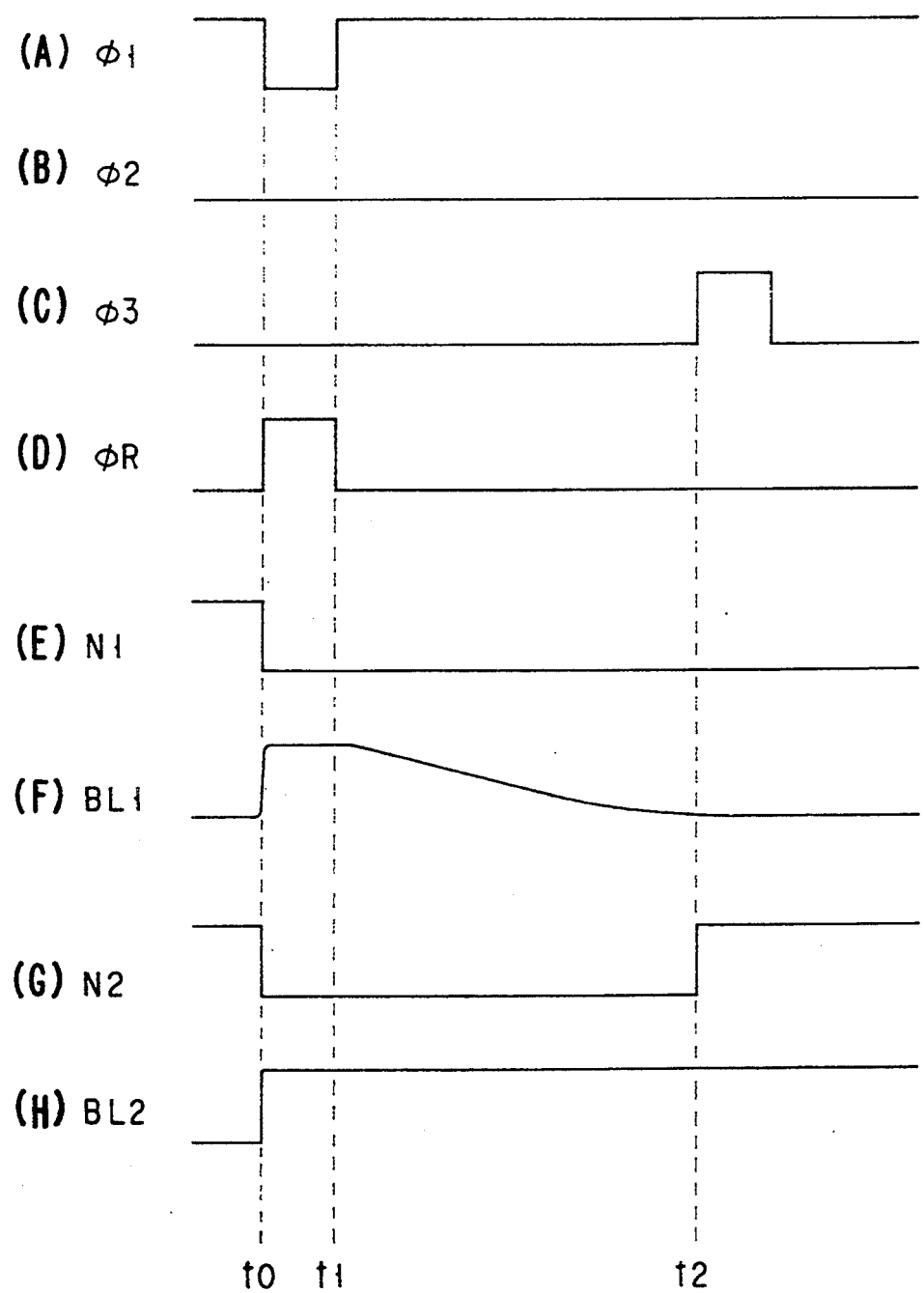
FIG. 23 shows operational waveforms at the time of read-out in the circuit shown in FIG. 22.

With reference to FIG. 23 showing operational waveforms at the time of read-out, the operation of the circuit shown in FIG. 22 will now be described. At time t0, the potential of the signal line $\phi 1$ lowers and the bit line BL is precharged at 5 V. At the same time, the potential of the signal line $\phi R$ rises and the flip-flop circuit 1 is reset. That is, the node N is set at 0 V. At time t2, the potential of the signal line $\phi 1$ rises and the bit line BL is set in the floating state. The bit line BL is discharged by the data retained in the memory cell 2. When the potential of signal line $\phi 3$ rises at time t2, the transistor Q8 is turned on and the flip-flop 1 is forcibly inverted by the transistor Q7 in accordance with the value of the bit line potential.

By adding only one transistor Q10 in the first embodiment, the read-out operation can be effected through the same path as in the verify operation. Accordingly, the verify operation and the read-out operation correspond to each other exactly, and a circuit less susceptible to a fluctuation in power supply voltage, noise, etc. can be realized.

Furthermore, since the detection (sense) level of the bit line potential at the time of read-out can be set by controlling the threshold value of the transistor Q7, the detection can be effected with a lower potential than in the prior art (i.e. the detection using the threshold of the inverter). In other words, since the sense level is low, pre-charge up to Vcc is not necessary, unlike the prior art. As a result, the power supply potential can be decreased, and therefore the reliability of the circuit is enhanced.

Figure 24:
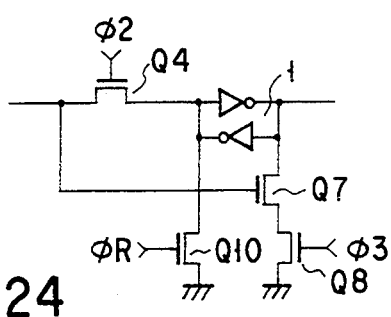
FIG. 24 to FIG. 31 are circuit diagrams showing structures of first to eighth modifications of a main part of the second embodiment.
Figure 25:
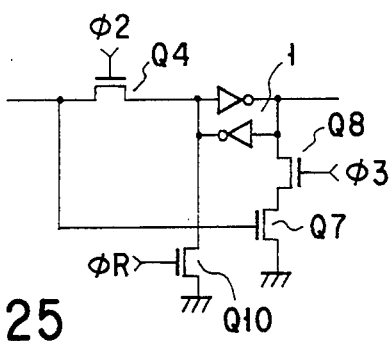
Figure 26:
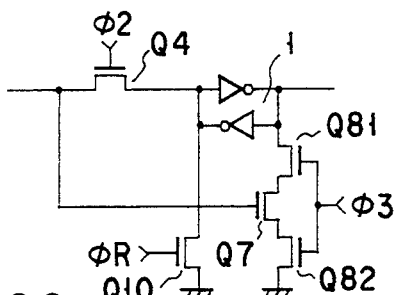
Figure 27:
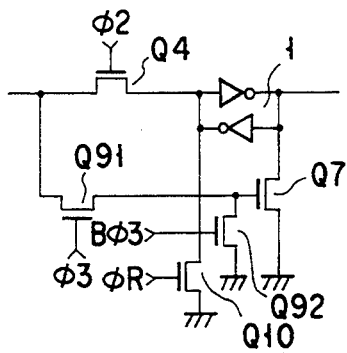

FIGS. 24 to 31 are circuit diagram showing various modifications of the second embodiment. FIG. 24 shows the same structure as FIG. 22, and FIG. 24 is prepared for the purpose of reference. FIG. 24 to FIG. 27 show examples in which N-channel transistors Q10 are connected to bit-line-side nodes of the flip-flop circuits 1, and FIG. 28 to FIG. 31 are examples in which P-channel transistors Q11 are connected to the nodes of the flip-flop circuits, which are located on the opposite side to the bit lines. Each of these examples functions similarly with the second embodiment, and therefore a description thereof is omitted.

FIG. 32 to FIG. 35 are circuit diagram showing a third embodiment of the invention, wherein the bit line potential is sensed via an inverter 80 or a NAND gate 81, thereby driving a transistor Q80 for forcible inversion. Unlike the first embodiment, the bit line (BL)-side node of the flip-flop circuit 1 is forcibly inverted by the transistor Q80. Thus, a sensing circuit with higher sensitivity can be realized by the inverter 80.

FIG. 36 to FIG. 43 are circuit diagrams showing a fourth embodiment of the invention, wherein a reset transistor driven by signal $\phi R$ or BCR is provided in the third embodiment. The operation of the fourth embodiment is similar to that of the second embodiment, and a description thereof is omitted.

FIG. 44 is a circuit diagram showing the structure of a fifth embodiment having a batch verify function. In the first embodiment, no consideration is given of the detection of completion of data write in all bits. For example, the nodes (N1 to N3) of the flip-flop circuits are successively sensed, and if 5 V is latched in all bits, the data write is completed. A circuit for sensing the nodes in a batch manner is referred to as "batch verify circuit."

The batch verify circuit comprises transistors Q201, 202 and 203, a transistor Q21 and an inverter 20, as shown in FIG. 44. Specifically, a circuit portion associated with one bit line comprises a flip-flop circuit 1 for temporarily storing write data; a bit line BL, a NAND-type memory cell 2 (illustrated in FIG. 1) connected to the bit line BL; a P-channel transistor Q3 for charging the bit line BL; a transistor Q4 for connecting the bit line BL and the flip-flop circuit 1; and transistors Q7 and Q8 connected in series between the node BN (BN1 to BN3) of the flip-flop circuit 1, which is located on the opposite side of the bit line BL, and the ground potential of 0 V. The transistors Q7 and Q8 constitute forcible inversion means (data setting circuit). The gate of the transistor Q7 is connected to the bit line BL.

The gates of all transistors Q3 are connected to a signal line $\phi 1$. This transistor Q3 constitutes charging means. The gates of all transistors Q4 are connected to a signal line $\phi 2$, and the gates of all transistors Q8 are connected to a signal line $\phi 3$. The source of the transistor Q3 is connected to a power supply source having a potential of 9 V at the time of write and having a potential of 5 V at the other time. A power supply for the flip-flop circuit has a potential of 9 V at the time of write and a potential of 5 V at the other time. A part of the control circuit 17 is extracted and shown as clock generating circuit 8 for driving signal lines $\phi 1$, $\phi 2$, $\phi 3$ and $\phi 5$ at predetermined time.

The principle of the verify operation is the same as that in the first embodiment. The detection of completion of data write in all bits is performed as follows. Specifically, after the verify operation is completed, the signal $\phi 5$ is lowered and a common verify line 26 is precharged to 5 V. If any one of the transistors Q201 to Q203 is turned on and rendered conductive, the common verify line 26 is discharged. If all transistors Q201 to Q203 are turned off and rendered non-conductive, the potential of the common verify line 26 remains 5 V.

The transistors Q201 to Q203 are connected to the nodes BN of the associated flip-flop circuits 1, which are located on the side opposite to the nodes N. Accordingly, if the potential of node N is 5 V, the potential of node BN is 0 V and the transistors Q201 to Q203 are rendered non-conductive. If the potential of node N is 0 V, the potential of node BN is 5 V and the transistors Q201 to Q203 are rendered conductive.

As a result, if any one of the bit lines associated with nodes N1 to N3 has a potential of 0 V after the verify operation (i.e. if the write operation has not been completed), the common verify line 26 is discharged and the output VFY becomes 5 V. If the potentials of all nodes N1 to N3 reaches 5 V after the verify operation (i.e. if the data write for all bits is completed), the common verify line 26 remains at 5 V and the output VFY becomes 0 V.

As described above, if the batch verify circuit is provided in the fifth embodiment, it is possible to detect the completion of data write for all bits in a batch manner. It is therefore possible to determine the timing for halting the write operation and the verify operation. In the fifth embodiment, the write operation and verify operation may be repeated until the output VFY reaches 0 V.

If the batch verify circuit is combined with the above-mentioned forcible inversion type sense amplifier, the verify time can be decreased. For example, in FIG. 44, as regards the latch data in the flip-flop circuit 1 in the forcible inversion type sense amplifier, the node N is at "H" level and the node BN is at "L" level before the verify operation. Thus, all transistors Q201 to Q203 are turned off. Accordingly, the timing for charging the common verify line 26 by signal $\phi 5$ can be set during or before the verify read-out operation. In the various sense methods described in connection with the prior art, it is necessary to charge the common verify line 26 after the verify read-out operation is completed. However, in the present embodiment, the common verify line can be charged high a higher timing, and therefore the batch verify time and, accordingly, the write time can be decreased.

FIG. 45 to FIG. 48 are circuit diagrams showing main parts of various modifications of the fifth embodiment. FIG. 45 shows the same structure as FIG. 44, FIG. 45 is prepared for the purpose of comparison. FIG. 46 shows an example wherein the batch verify circuit is constituted by connecting P-channel transistors Q21x (x=1, 2, 3) in series. FIG. 47 shows an example wherein a batch verify circuit comprising the same N-channel transistor Q20x (x=1, 2, 3) as shown in FIG. 45 is provided on the node (N)- side of the associated flip-flop circuit 1. FIG. 48 shows an example wherein the same P-channel transistor Q21x (x=1, 2, 3) as shown in FIG. 46 is connected to the node N side of the associated flip-flop circuit 1, thereby constituting the batch verify circuit. The circuits of these examples operate similarly with the circuit shown in FIG. 44, and a detailed description of the operation is omitted.

In FIGS. 45 and 48, since all sense transistors for discharge are connected in parallel, the batch verify operation can be effected at higher speed than in the other circuits. In the examples of FIGS. 46 and 47, since the sense transistors are connected in series, the chip area can be reduced. The example shown in FIG. 45 is optimal, and the speed of the circuit operation is higher than that in FIGS. 46 to 48, by virtue of the parallel connection and the use of N-channel transistors.

Figure 49:
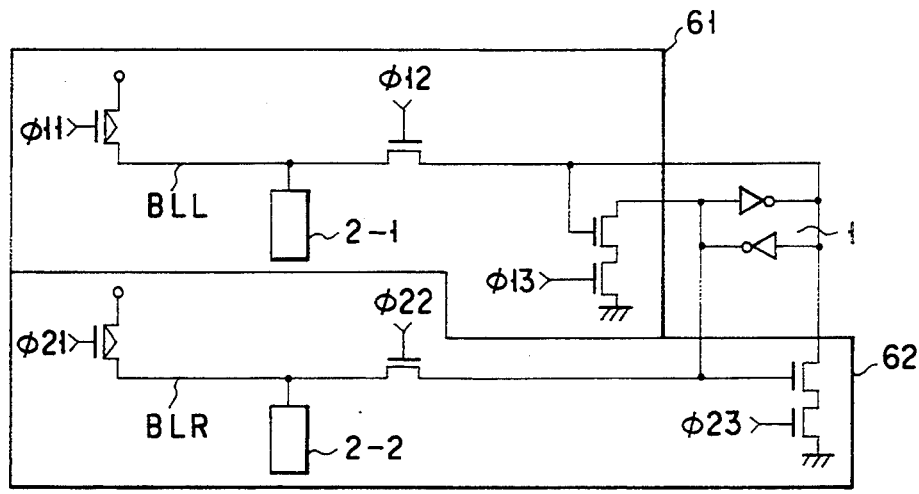
FIG. 49 is a circuit diagram showing a main part of a sixth embodiment of the invention.
Figure 50:
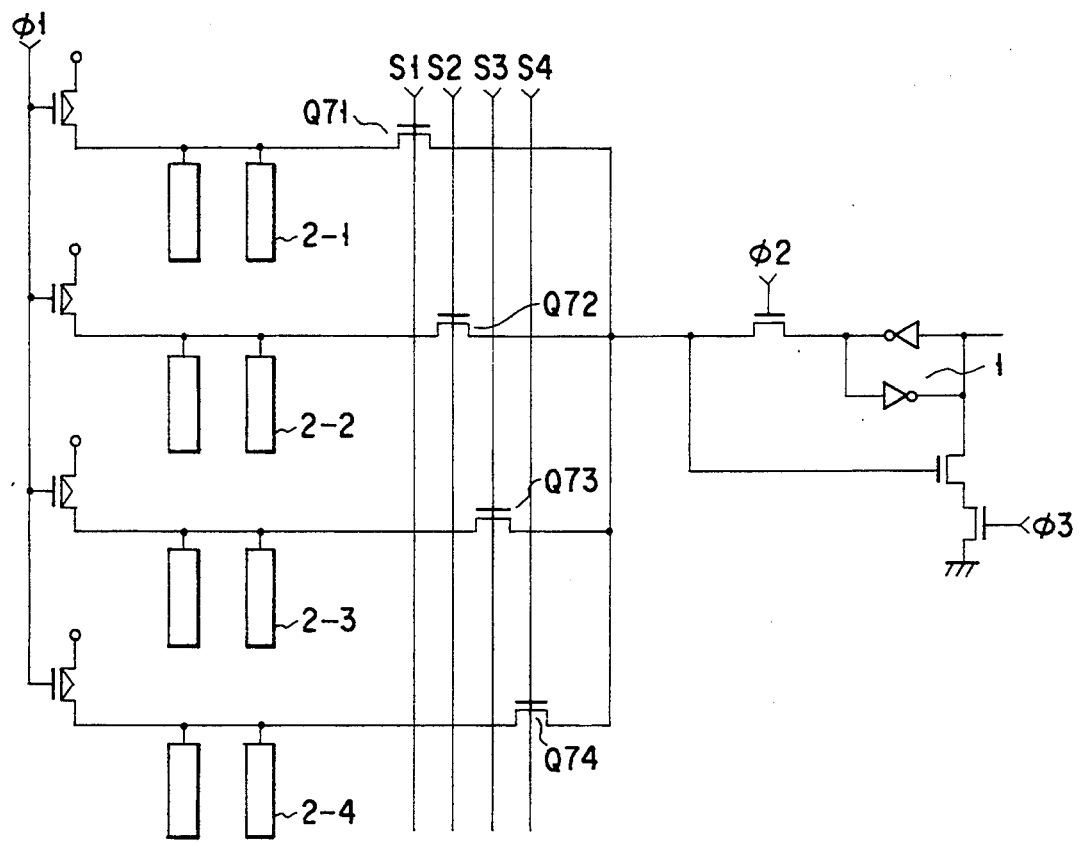
FIG. 50 is a circuit diagram showing a main part of a seventh embodiment of the invention.
Figure 55:
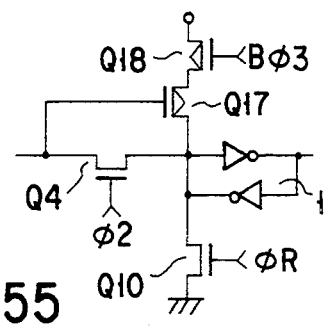
FIG. 55 to FIG. 62 are circuit diagrams showing structures of first to eighth applied examples of the main part of the second embodiment.
Figure 59:
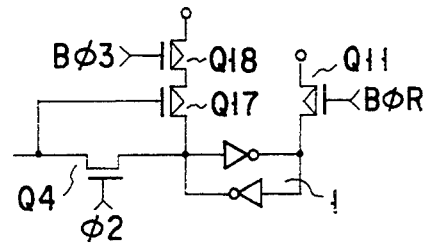
Figure 56:
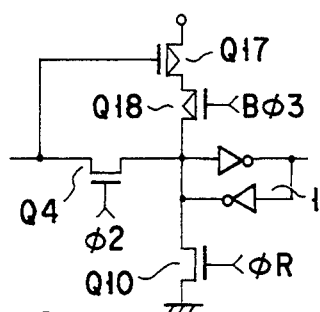
Figure 60:
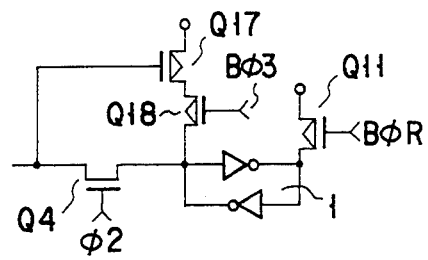
Figure 57:
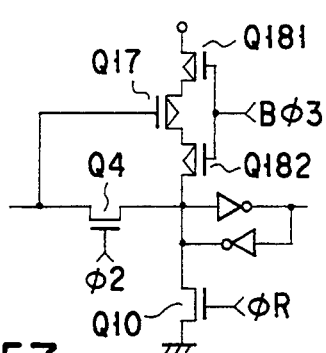
Figure 61:
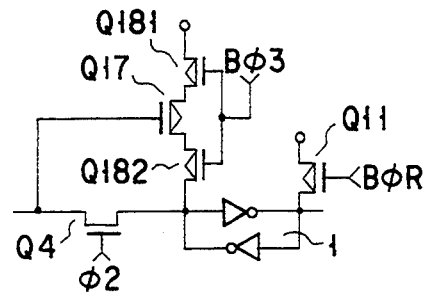
Figure 58:
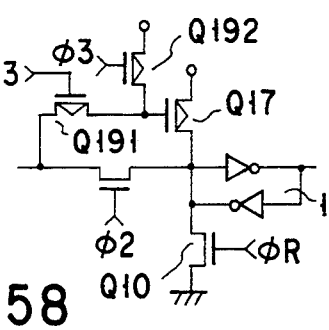
Figure 62:
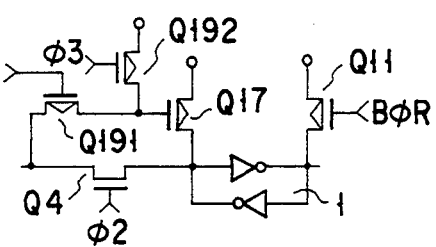
Figure 63:
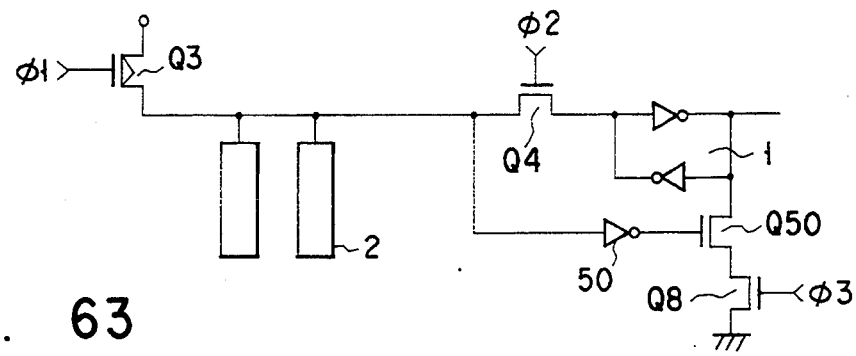
FIG. 63 to FIG. 66 are circuit diagrams showing structures of first to fourth applied examples of the main part of the third embodiment.
Figure 64:
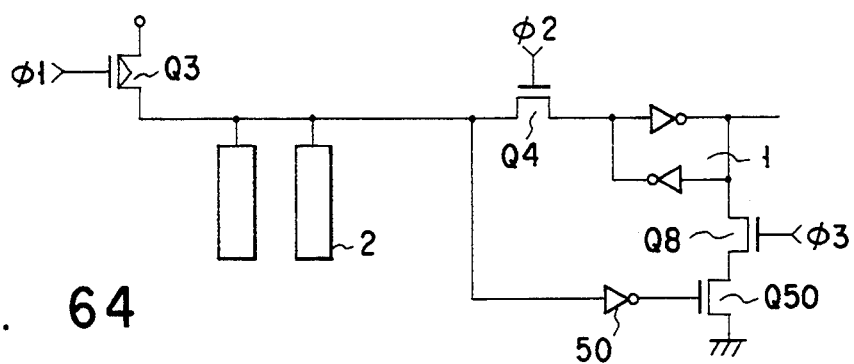
Figure 65:
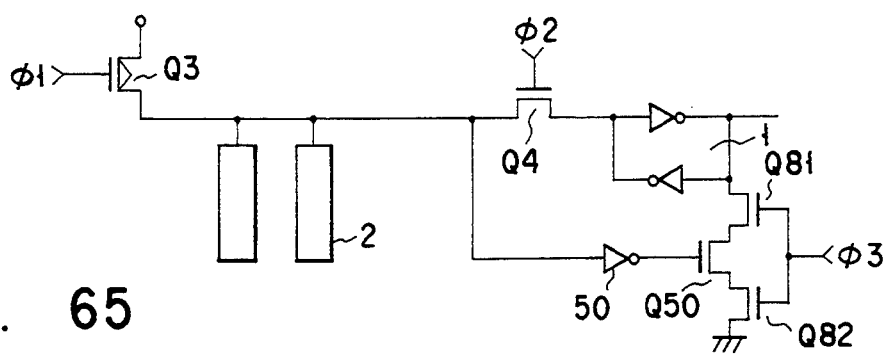
Figure 66:
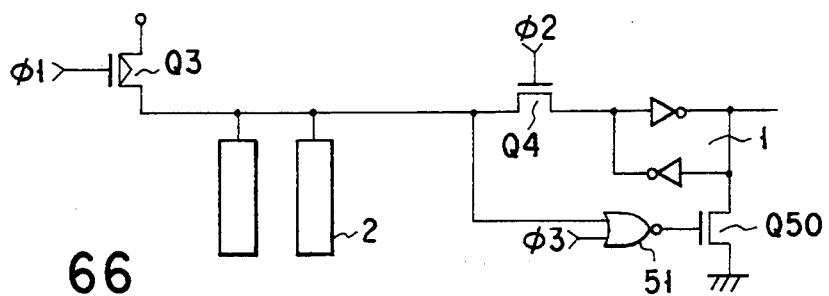
Figure 67:
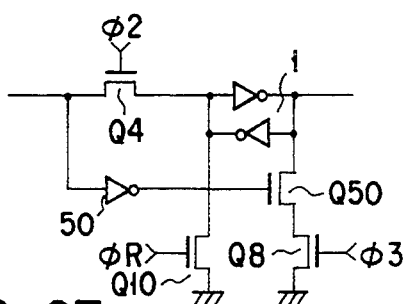
FIG. 67 to FIG. 74 are circuit diagrams showing structures of first to eighth applied examples of the main part of the fourth embodiment.
Figure 68:
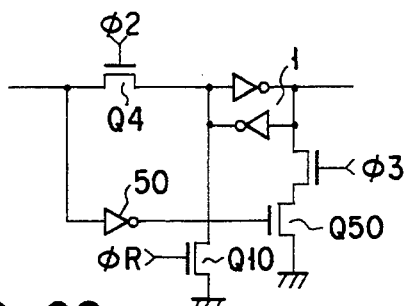
Figure 69:
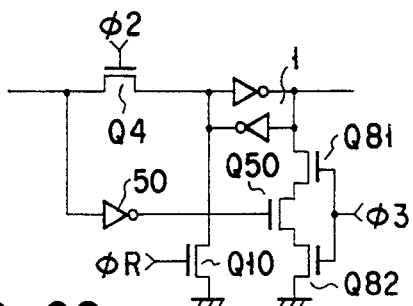
Figure 70:
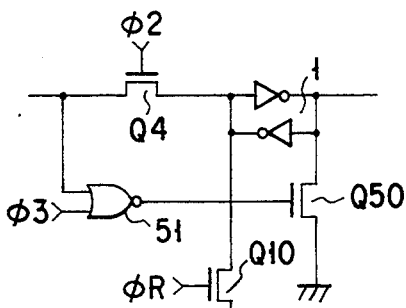
Figure 71:
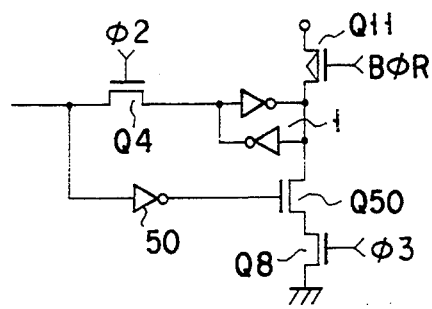
Figure 72:
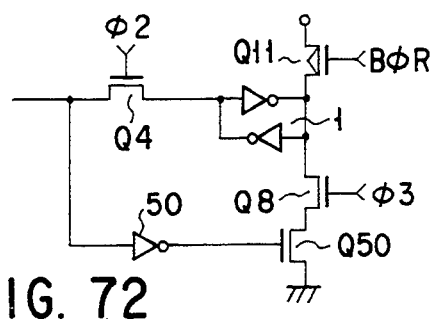
Figure 73:
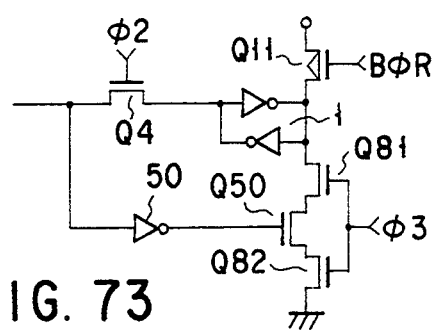
Figure 74:
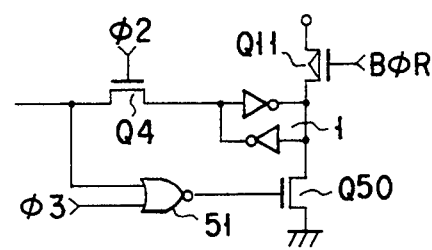
Figure 75:
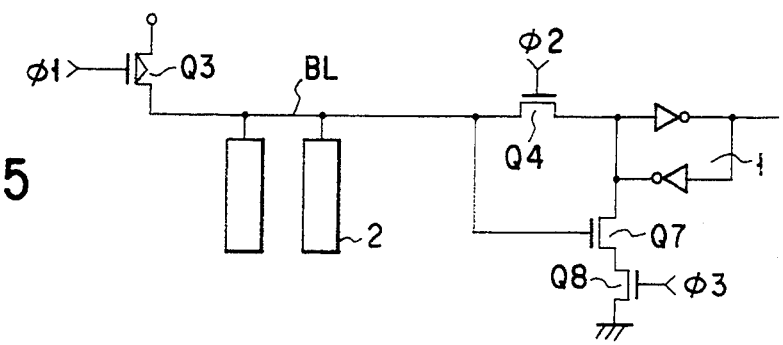
FIG. 75 to FIG. 78 are circuit diagrams showing structures of fifth to eighth applied examples of the main part of the first embodiment.
Figure 76:
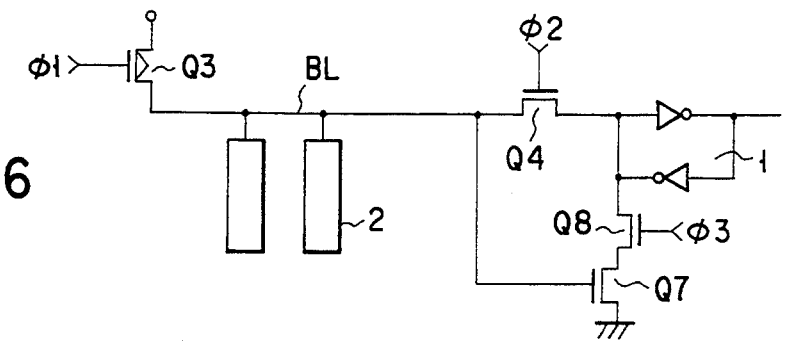
Figure 77:
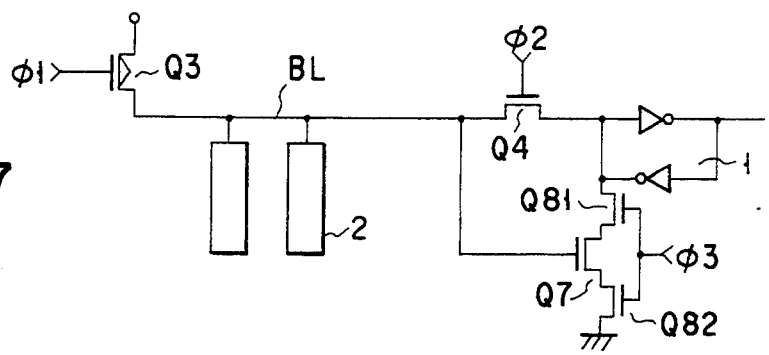
Figure 78:
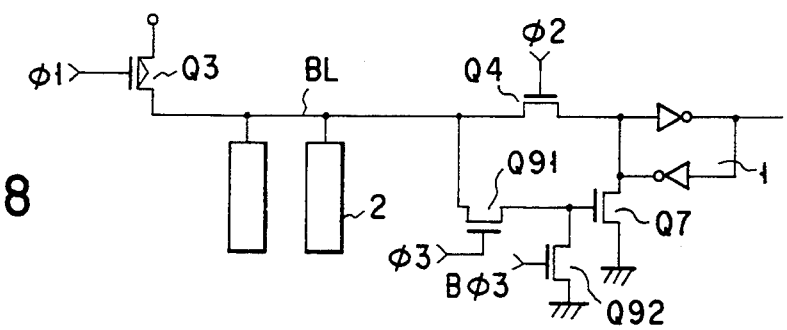
Figure 79:
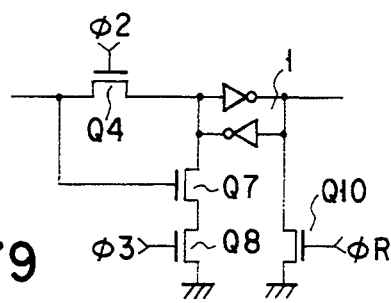
FIG. 79 to FIG. 86 are circuit diagrams showing structures of ninth to 16th applied examples of the main part of the second embodiment.
Figure 80:
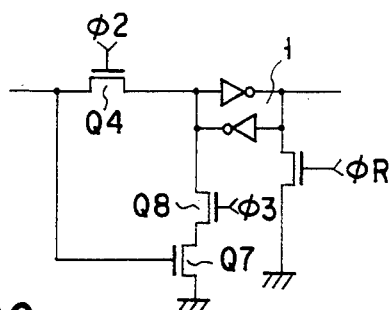
Figure 81:
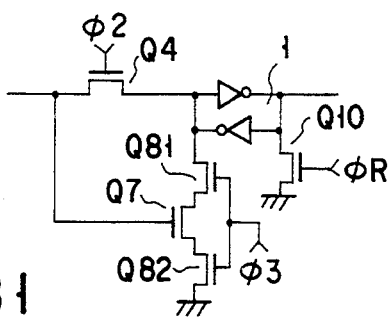
Figure 82:
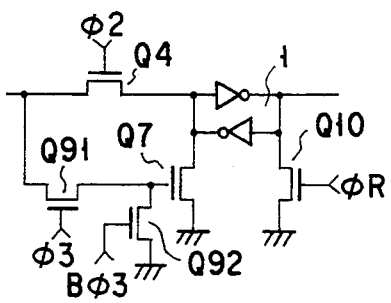
Figure 83:
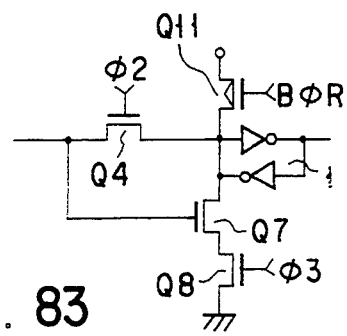
Figure 84:
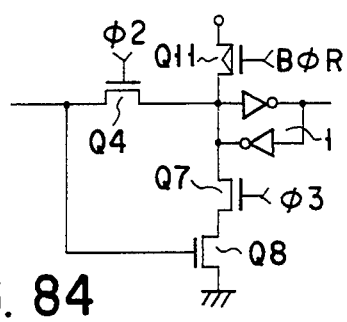
Figure 85:
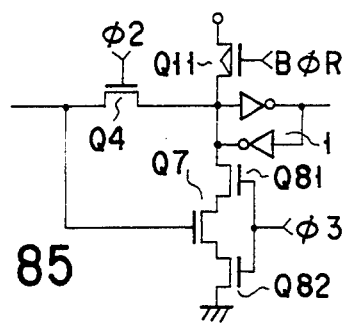
Figure 86:
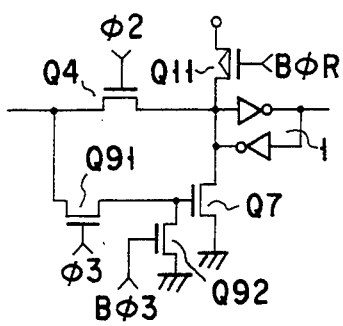
Figures 99, 100:
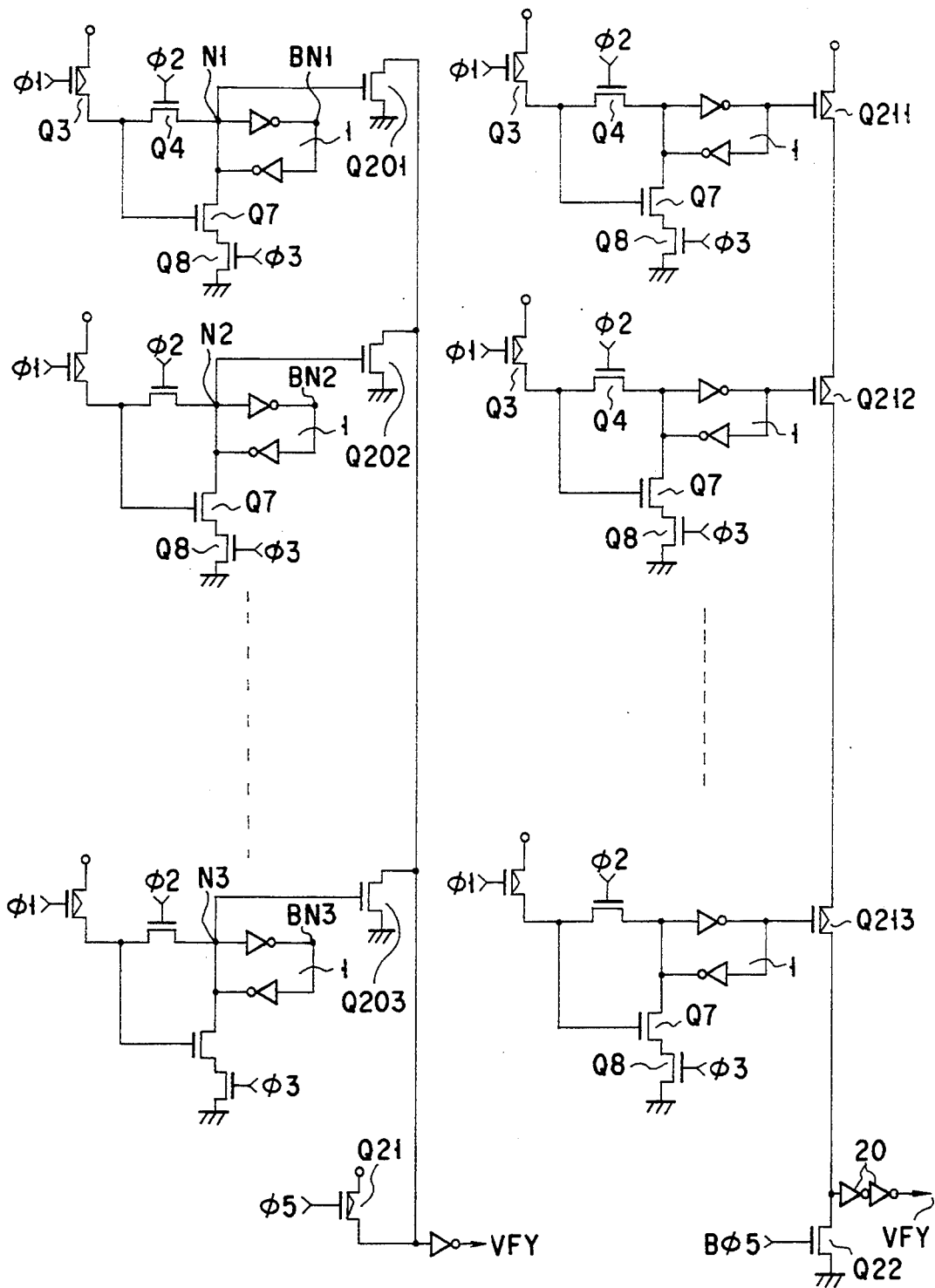
Figure 115:
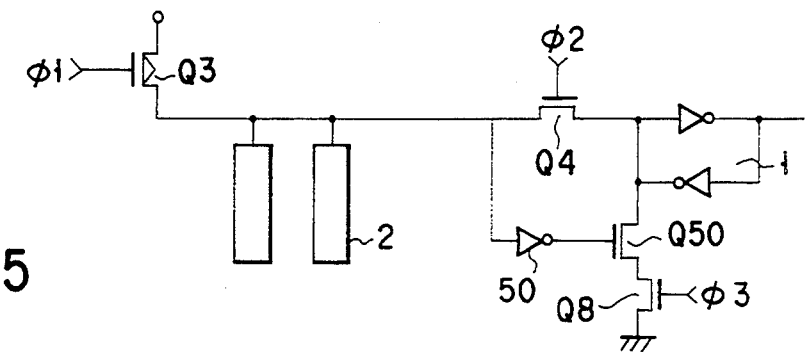
FIG. 115 to FIG. 118 are circuit diagrams showing structures of ninth to 12th applied examples of the main part of the third embodiment.
Figure 116:
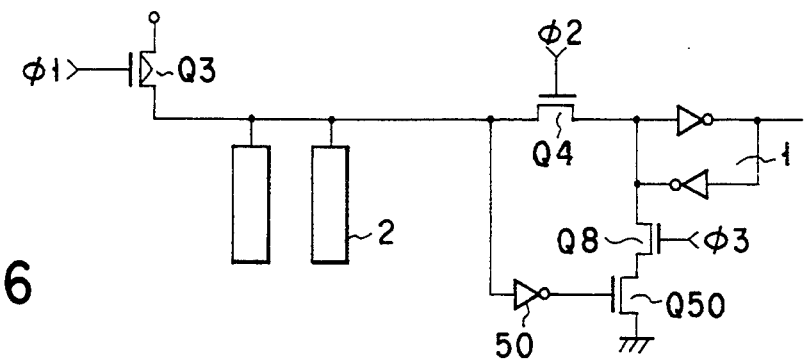
Figure 117:
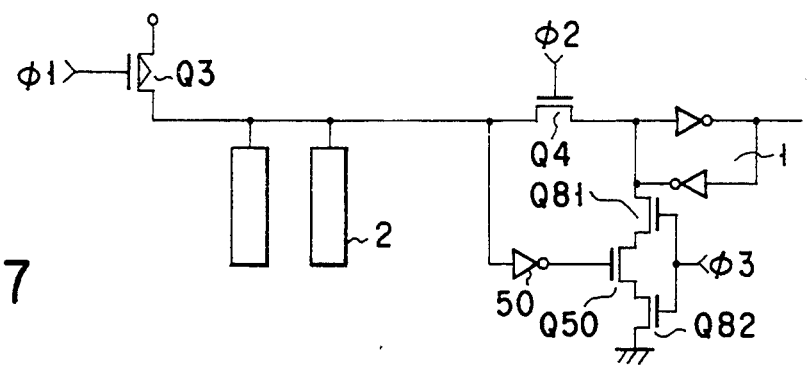
Figure 118:
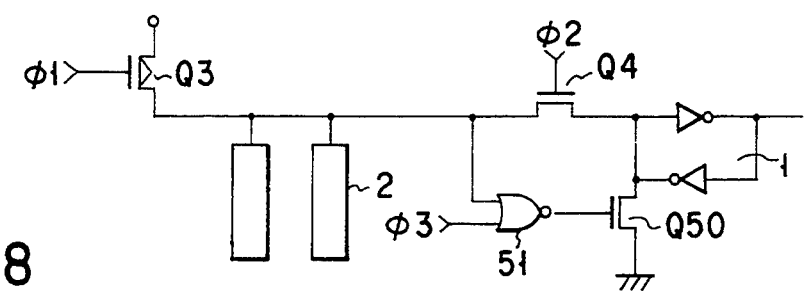

FIGS. 49 and 50 are circuit diagrams showing sixth and seventh embodiments of the invention, respectively. In these examples, a single flip-flop circuit 1 is shared by a plurality of bit lines. The circuit shown in FIG. 49 comprises a flip-flop circuit 1; bit lines BLL and BLR connected to the flip-flop circuit 1; a first verify read-out circuit 61 controlled by signals $\phi 11$, $\phi 12$ and $\phi 13$; and a second verify read-out circuit 62 controlled by signals $\phi 21$, $\phi 22$ and $\phi 23$. The flip-flop circuit 1 can be shared by the bit lines BLL and BLR, and the pattern area can be reduced.

In the seventh embodiment shown in FIG. 50, a single flip-flop circuit 1 is shared by bit lines BL1, BL2, BL3 and BL4. The switching of the bit lines is effected by transistors Q71 to Q74 controlled by signals S1 to S4. As a result, like the sixth embodiment, the pattern area can be reduced.

Moreover, since a sense amplifier is shared by a plurality of adjacent bit lines, a sense amplifier, which is relatively difficult to situate, can be provided easily in a pattern layout of the chip. This advantage is enhanced by the combination with the aforementioned forcible inversion type sense amplifier. Specifically, in the forcible inversion type sense amplifier, the forcible inversion means is connected to the node of the flip-flop which is located on the side opposite to the bit line, and consequently wiring is complex. If the sense amplifier is shared by every four bit lines, wiring can be made easily with allowance. From the standpoint of design, it is desirable to group the bit lines in units of four.

The circuit configurations of the first to seventh embodiment in the case where NAND-type memory cells are used have been described above. In these example, (1) the bit line is set at 0 V when the threshold is shifted in the write mode, and the latch data in the flip-flop circuit is inverted if the bit line remains at 5 V after read-out in the verify mode.

There may be other cases (2) to (4):

(2) The bit line is set at 0 V when the threshold is shifted in the write mode, and the latch data in the flip-flop circuit is inverted if the potential of the bit line reaches 0 V after read-out in the verify mode (for example, a NOR-type memory cell structure wherein electrons are injected in the floating gate at the time of erase, and write is effected by selectively extracting electrons from the drain and shifting the threshold to the negative side).

(3) The bit line is set at 5 V when the threshold is shifted in the write mode, and the latch data in the flip-flop circuit is inverted if the potential of the bit line remains 5 V after read-out in the verify mode (for example, a NOR-type memory cell structure wherein electrons are extracted from the floating gate at the time of erase, and write is effected by selectively injecting electrons from the drain and shifting the threshold to the positive side).

(4) The bit line is set at 5 V when the threshold is shifted in the write mode, and the latch data in the flip-flop circuit is inverted if the potential of the bit line reaches 0 V after read-out in the verify mode (for example, a NAND-type memory cell structure wherein electrons are injected in the floating gate at the time of erase, and write is effected by selectively extracting electrons from the drain and shifting the threshold to the negative side).

The case (2) is illustrated in FIGS. 51 to 74. FIGS. 51 to 54 are circuit diagrams showing main parts of applied examples corresponding to the first embodiment, FIGS. 55 to 62 are circuit diagrams showing main parts of applied examples of the second embodiment, FIGS. 63 to 66 are circuit diagrams showing main parts of applied examples of the third embodiment, and FIGS. 67 to 74 are circuit diagrams showing main parts of applied examples corresponding to the fourth embodiment. The operations of these circuits are the same as those of the above-described embodiments, and therefore a description thereof is omitted.

The case (3) is illustrated in FIGS. 75 to 98. FIGS. 75 to 78 are circuit diagrams showing main parts of applied examples corresponding to the first embodiment, FIGS. 79 to 86 are circuit diagrams showing main parts of applied examples of the second embodiment, FIGS. 87 to 90 are circuit diagrams showing main parts of applied examples of the third embodiment, and FIGS. 91 to 98 are circuit diagrams showing main parts of applied examples corresponding to the fourth embodiment. The operations of these circuits are the same as those of the above-described embodiments, and therefore a description thereof is omitted. FIGS. 99 to 102 show examples of the structure of the batch verify circuit. These examples correspond to the fifth embodiment, and therefore a description thereof is omitted.

The case (4) is illustrated in FIGS. 103 to 126. FIGS. 103 to 106 are circuit diagrams showing main parts of applied examples corresponding to the first embodiment, FIGS. 107 to 114 are circuit diagrams showing main parts of applied examples of the second embodiment, FIGS. 115 to 118 are circuit diagrams showing main parts of applied examples of the third embodiment, and FIGS. 119 to 126 are circuit diagrams showing main parts of applied examples corresponding to the fourth embodiment. The operations of these circuits are the same as those of the above-described embodiments, and therefore a description thereof is omitted.

FIG. 127 is a circuit diagram showing the structure of a most desirable embodiment of the present invention. A portion in a block 25 has a structure similar to that shown in FIG. 25. Specifically, when the level of signal $\phi R$ rises, the node BN of the flip-flop circuit 1 is set at "1". If the level of signal $\phi 3$ rises in the state in which the bit line BL is at "1", the flip-flop circuit 1 is inverted.

As has been described above, in the actual applied mode, several thousand bit-by-bit verify circuits are arranged in parallel. When read-out pulses $\phi 3$ are input in the state in which all bit lines are at "1", all flip-flop circuits 1 are inverted. At this time, a through-current flows in the flip-flop circuit 1, and the power consumption of the chip may increase or the source potential of the P-channel transistor Q33 may decrease due to wiring resistance. As a result, the operation may become unstable.

The P-channel transistors Q35 and Q36 connected between the transistors Q31 and Q33 and the power supply prevent the above undesirable operation and also prevent the through-current of a predetermined level or above from flowing. The gates of the transistors are separated to realize flexible structure. That is, when an intermediate potential is input to the bit line, a large current flows through the transistor Q36. Thus, the through-current is reduced by increasing the gate potential of the transistor Q36, and the gate potential of the transistor Q35 is lowered to enhance stability of the flip-flop circuit 1. Needless to say, the gates may be commonly used in consideration of the specifications, or the conductance may be controlled by the dimension of the P-channel MOS transistor.

If the through-current is reduced by the transistor Q35, the threshold of the bit line potential for inverting the flip-flop circuit 1 can be set in the vicinity of the threshold value of the transistor Q7, and influence of noise due to capacitance between bit lines can be decreased.

A high voltage is applied to the bit line at the time of programming/erasure. If conventional means for cutting off high voltage is adopted by inserting a depletion type MOS transistor Q37 between the bit line and the input terminal of the sense amplifier, the sense amplifier circuit can be constituted by low-voltage type transistors. Accordingly, the area occupied by the circuit elements can be reduced and the performance of the circuit can be enhanced.

The data in the flip-flop circuit 1 is read out to the IO line via the transfer gate to which a column decode signal CS is input. If the potential of the IO line is fully swung from the outside, desired data can be written in the flip-flop circuit.

Electric current flowing from the IO/BIO line to the bit line can be measured by setting the bit line in the selected state, setting the potential of the node BN at "0" via the IO/BIO line, and setting the transistor Q35 in the off state. The bit line current is a current flowing to the cell or a leak current due to defects. With this function, device information of the memory can be exactly acquired.

According to the above embodiment, the sense amplifier circuit is realized wherein the bit-by-bit verify operation can be performed, influence of noise is very low, power consumption is low, and a test function is provided.

Figure 28:
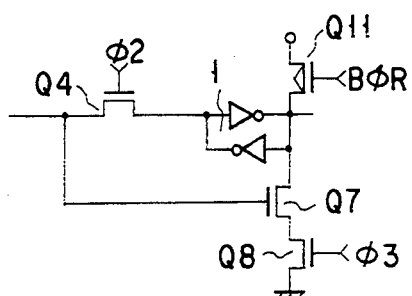
Figure 29:
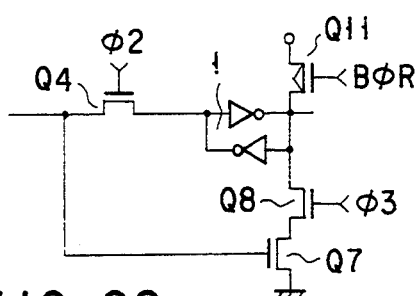
Figure 30:
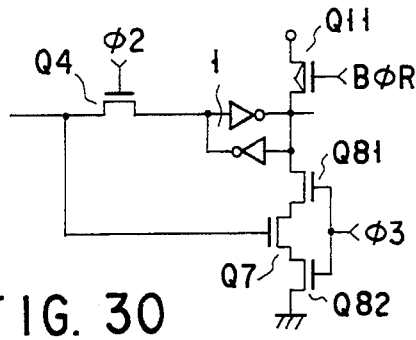
Figure 31:
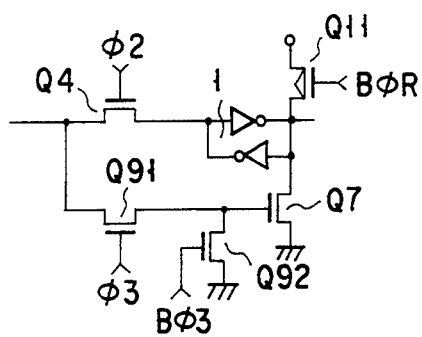
Figure 32:
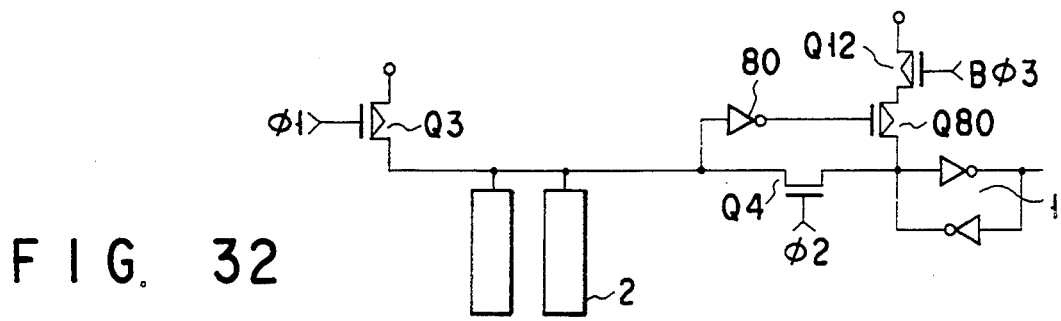
FIG. 32 to FIG. 35 are circuit diagrams showing structures of first to fourth modifications of a main part of a third embodiment.
Figure 33:
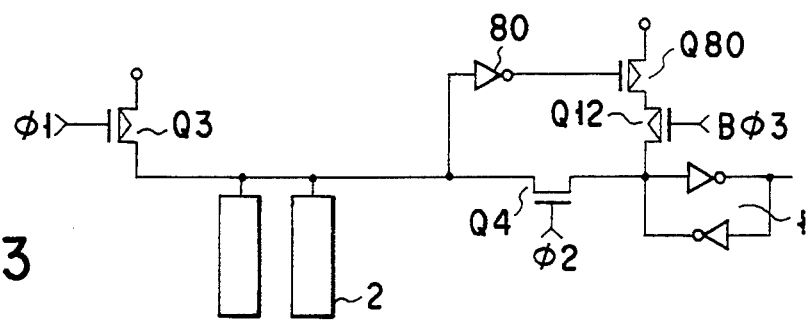
Figure 34:
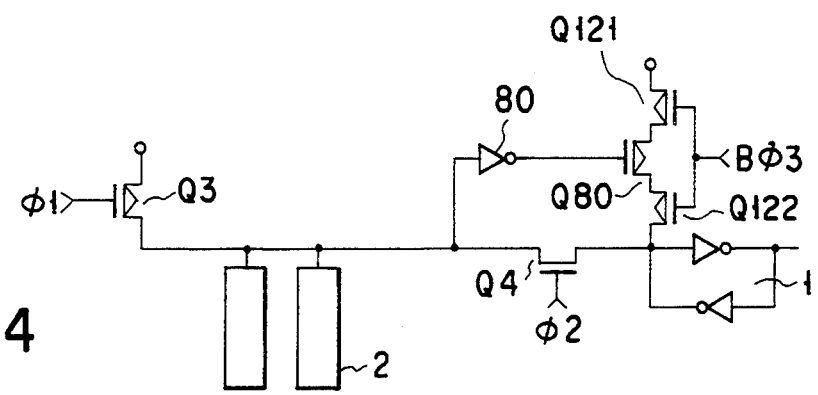
Figure 35:
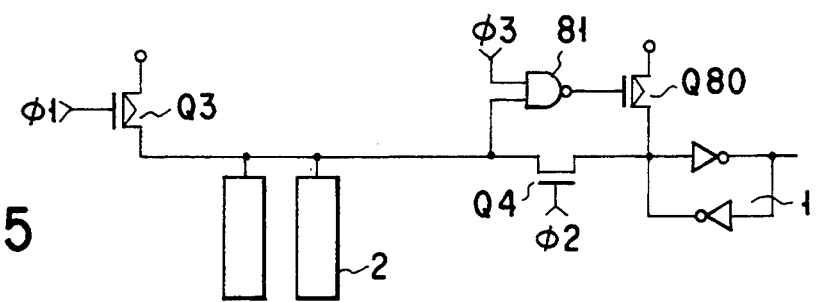
Figure 36:
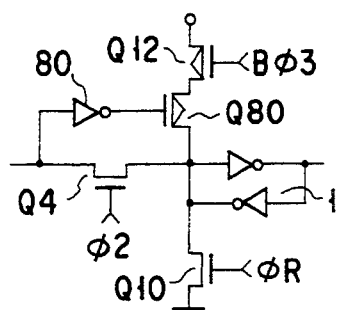
FIG. 36 to FIG. 43 are circuit diagrams showing structures of first to eighth modifications of a main part of a fourth embodiment.
Figure 40:
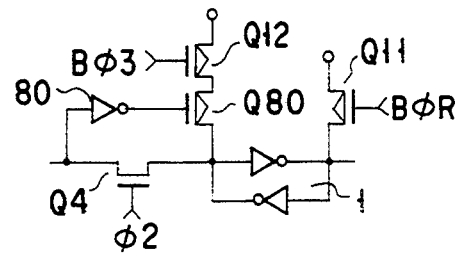
Figure 37:
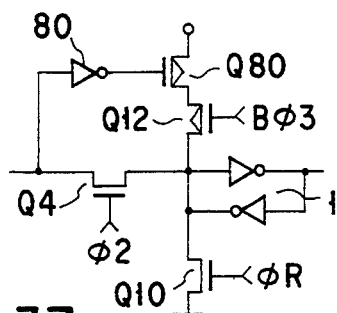
Figure 41:
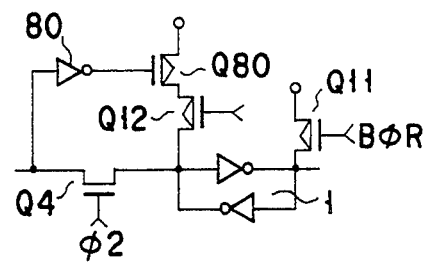
Figure 38:
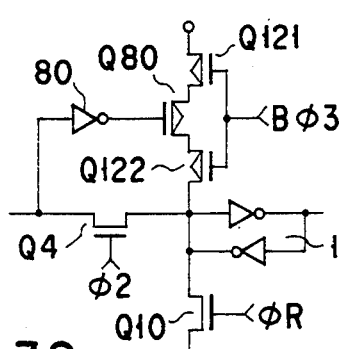
Figure 42:
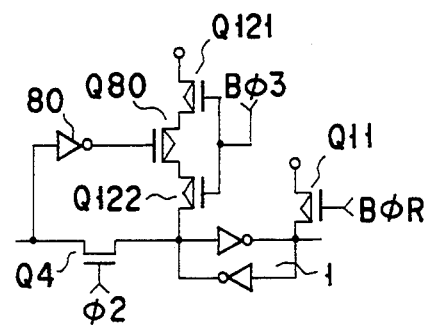
Figure 39:
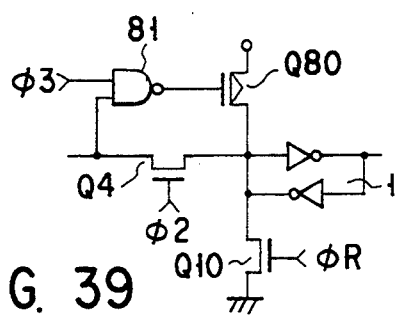
Figure 43:
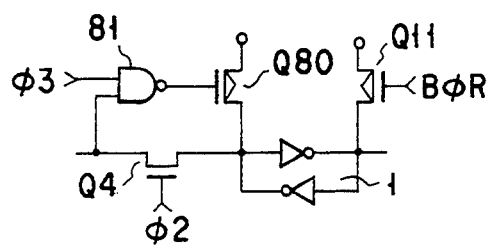

Although mentioned in the above description, the present invention is applicable not only to the NAND type EEPROM cell but to the NOR type EEPROM. FIG. 28 is a circuit diagram showing a circuit wherein a NOR type memory cell is adopted in the structure shown in FIG. 115. For example, a memory cell having a selector transistor, which makes use of FN (Fowler-Nordheim) tunnel current for erase and write operations, is used. The reason is that write operations can be simultaneously effected in a great number of cells (e.g. about 4000 bits) which make use of tunnel current for write operations. Thus, the effect of the bit-by-bit verify by the present invention can be exhibited to a maximum. It is more desirable to provide the selector transistor, because the drain stress of each transistor with floating gate is reduced. In the cell portion shown in FIG. 128, "erase" is defined by the state in which electrons are injected in the floating gate at a time and the threshold is increased. The write operation is performed in the following manner. A voltage is applied to a selector gate SL0 and the selector transistor is turned on. Then, a positive bias voltage is applied to the drain of the transistor in which data is to be written, and a negative bias voltage is applied to the control gate (one of word lines WL0, WL1 . . . ) of the selected transistor. Thereby, electrons in the floating gate of the selected bit are released to lower the threshold value. At this time, if the electrons are released from the floating gate excessively and the threshold value decreases to 0 V or less, a current flows in the non-selected word line and data in the selected cell cannot be read. For this reason, like the NAND type cell, the stable operation can be expected by performing the bit-by-bit verify operation and writing "1" data while sensing the threshold value. FIG. 129 should be referred to with respect to the definition of the threshold value distribution.

Figure 128:
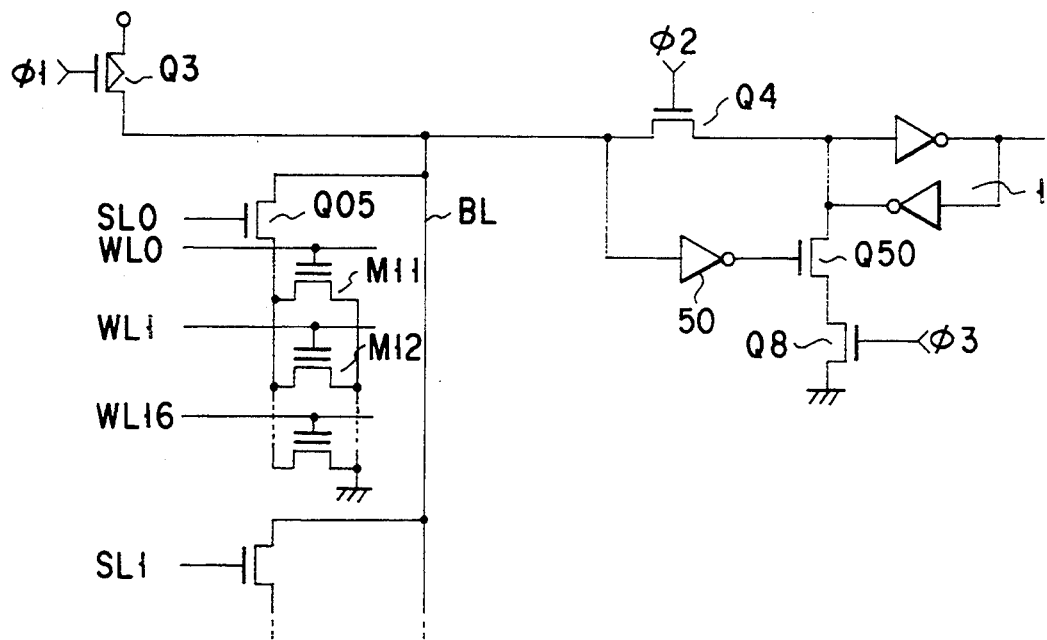
FIG. 128 is a circuit diagram showing a structure of the invention as applied to a NOR-type EEPROM.
Figure 129:
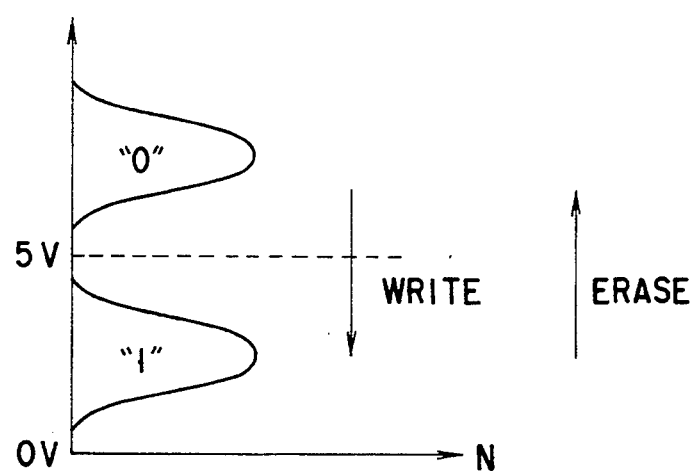
FIG. 129 is a characteristic diagram showing a distribution of threshold values among NOR-type memory cells.

In FIG. 128, when data is to be written in the selected cell M11 (i.e. when electrons are to be released from the floating gate), the circuit is reset such that the bit line-side node of the flip-flop circuit 1 of the forcible inversion type sense amplifier is set at "H" level. This can be realized by using a reset transistor (not shown) or loading data from the outside via a column gate. In this state, the power supply for the flip-flop circuit 1 is set at high potential, e.g. about 7 V, a high bias voltage is applied to the drain, and a negative bias voltage of about −10 V is applied to the word line WL0. Thereby, electrons are released from the floating gate of the selected cell. In the subsequent verify operation, $\phi 2$ is set at "L" to turn off the transistor Q4 and SL0 is set at "L" to turn off the selector transistor Q05. In this state, WL0 is set at a predetermined verify potential, and the bit line BL is precharged by the transistor Q3. Thereafter, the selector transistor Q05 is turned on to set the bit line in the free-running state. At this time, if the threshold value is lower than the verify potential, the bit line potential decreases and "H", signal is output from the inverter 50. Accordingly, if $\phi 3$ is set at "H" at a certain timing, the flip-flop 1 is forcibly inverted, and the bit line-side node is set at "L". If this node is at "L", the electrons in the floating gate are not released even if the negative bias is applied to the word line at the time of write, since the drain remains at 0 V. On the other hand, if the threshold value of the cell is greater than the verify potential, the bit line pre-charge level is maintained. Thus, the flip-flop circuit 1 is not inverted, and the write operation is performed again. In the case where the selected cell needs to remain in the erase state, the cell keeps the threshold value in the erase state, if data is loaded to set the bit line (BL)-side node of the flip-flop circuit 1 at the "L" level, because no potential is applied to the drain.

A normal read-out operation is performed by applying a proper potential (e.g. Vcc) to the control gate of the cell, instead of the verify potential, and by performing the same operation as the verify operation. As stated above, the present invention is applicable to the NOR-type EEPROM of the type in which the threshold is lowered at the time of write, and the same advantage as with the NAND-type device can be obtained. In particular, if this invention is applied to the cell which makes use of FN tunnel current at the time of write, the merit of multi-bit simultaneous write can be obtained, and the cell using the selector transistor is desirable in terms of stress.

As has been described above, according to the present invention, when a single write/verify operation has been completed, the data in the flip-flop circuit is inverted by the forcible inversion means (data setting circuit). As a result, the bit-by-bit verify operation is realized.

Moreover, unlike the prior art, the bit line potential is not varied, since the bit line potential is applied only to the forcible inversion means (data setting circuit). Besides, the through-current path is not provided, and the power consumption is not increased.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A non-volatile semiconductor memory device having a verify mode, said device comprising:

flip-flop circuit means for holding latch data in one of first and second states;

bit line means;

setting means for setting said bit line means to a reference potential;

coupling means for coupling said flip-flop circuit means and said bit line means;

non-volatile memory cell means, connected to said bit line means and having a MOS transistor structure, for storing data when a threshold thereof is set in one of first and second threshold ranges, wherein at the time of a write mode said threshold of the memory cell means is shifted from the first threshold range towards the second threshold range while said flip-flop circuit means remains in the first state and the shift of the threshold is not effected while said flip-flop circuit means remains in the second state, and at the time of the verify mode following the write mode said bit line means is kept at said reference potential by said setting means while the threshold remains in the second threshold range;

data setting circuit means for providing, at the time of the verify mode, said flip-flop circuit means with a path for supplying a latch potential when said bit line means is set at the reference potential and setting the flip-flop circuit means in the second state irrespective of the state prior to the verify mode;

input/output line means for transferring input/output dam; and column gate means for Coupling said input/output line means with said flip-flop circuit means to control transfer of data by said input/output line memos.

2. The device according to claim 1, wherein said bit line means comprises a bit line, said flip-flop circuit means comprises a flip-flop circuit having at least first and second signal nodes, and said coupling means includes at least one switching element, said switching element being turned off at the time of the verify mode, thereby electrically disconnecting said bit line from said flip-flop circuit.

3. The device according to claim 2, wherein said flip-flop circuit includes at least two CMOS inverter circuits having their input and output terminals connected in parallel in opposite directions, said data setting circuit means includes MOS transistor circuit means having a current path connected between one of the first and second signal nodes of the flip-flop circuit and a power supply node for providing said latch potential, and said MOS transistor circuit means includes at least a first MOS transistor having a gate controlled in accordance with a signal of said bit line.

4. The device according to claim 3, wherein the relationship between a conductance gmN of said MOS transistor circuit means and a conductance gmP of a MOS transistor within said CMOS inverter circuit for charging/discharging one of the first and second signal nodes of the flip-flop circuit is given by $$gmN/gmP > 1.8$$

5. The device according to claim 2, wherein said flip-flop circuit includes at least two CMOS inverter circuits having their input and output terminals connected in parallel in opposite directions, said data setting circuit means includes a first MOS transistor and a second MOS transistor, said second MOS transistor having a current path connected between one of the first and second signal nodes of the flip-flop circuit and a power supply node for providing said latch potential in series with said first MOS transistor, a gate of said first MOS transistor is controlled in accordance with a signal of said bit line, a control signal is input to a gate of said second MOS transistor, and said second MOS transistor is turned on at the time of the verify mode.

6. The device according to claim 5, wherein the relationship between an equivalent conductance gmN of said first and second MOS transistors and a conductance gmP of a MOS transistor within said CMOS inverter circuit for charging/discharging one of the first and second signal nodes of the flip-flop circuit is given by $$gmN/gmP > 1.8$$

7. The device according to claim 5, wherein said first MOS transistor is provided on said flip-flop circuit side, and said second MOS transistor is provided on said power supply node side.

8. The device according to claim 5, wherein said second MOS transistor is provided on said flip-flop circuit side, and said first MOS transistor is provided on said power supply node side.

9. The device according to claim 3, wherein said MOS transistor circuit means includes a second MOS transistor having a current path connected in series between said first MOS transistor and one of the first and second signal nodes of the flip-flop circuit, and a third MOS transistor having a current path connected in series between said first MOS transistor and said power supply node, said second and third MOS transistors being turned on at the time of the verify mode when the gates of said second and third MOS transistors are supplied with control signals.

10. The device according to claim 3, wherein said MOS transistor circuit means includes transfer control means for enabling a gate control operation of the first MOS transistor at the time of the verify mode.

11. The device according to claim 1, further comprising reset means for providing another path for supplying a reset potential to said flip-flop circuit at the time of a reset mode, and setting said flip-flop circuit means in the first state.

12. The device according to claim 11, wherein one of a ground potential and a power supply potential is supplied to a power supply node of said path for supplying the latch potential, and one of a ground potential and a power supply potential is supplied to a power supply node of said another path for supplying the reset potential.

13. The device according to claim 1, wherein said bit line means comprises a plurality of bit lines, said flip-flop circuit means comprises a plurality of flip-flop circuits each having first and second signal nodes, and said coupling means comprises a plurality of switching elements to be turned off at the time of the verify mode for electrically disconnecting a respective flip-flop circuit from an associated one of said bit lines, said coupling means controlling connection between said bit lines and said flip-flop circuits.

14. The device according to claim 13, wherein each of said flip-flop circuits is shared by at least two of said bit lines.

15. The device according to claim 1, wherein said bit line means comprises a plurality of bit lines, said flip-flop circuit means comprises a plurality of flip-flop circuits each having first and second signal nodes, and said coupling means comprises a plurality of switching elements to be turned off at the time of the verify mode for electrically disconnecting a respective flip-flop circuit from an associated one of said bit lines, said coupling means controlling connection between said bit lines and said flip-flop circuits, and wherein said non-volatile semiconductor memory device further comprises verify sensing means for sensing completion of a verify operation in the verify mode for data in each of the memory cells.

16. The device according to claim 15, wherein said verify sensing comprises a shared verify line for obtaining a sense signal only when the potential at one of the first and second signal nodes of each of said flip-flop circuits is equal.

17. The device according to claim 1, wherein said non-volatile memory cell means makes use of an FN (Fowler-Nordheim) tunnel current at the time of the write mode.

18. The device according to claim 17, wherein said non-volatile memory cell means includes a plurality of MOS transistors each having a floating gate, and selector transistor means provided between said MOS transistors and said bit lines.

19. A non-volatile semiconductor memory device comprising:
flip-flop circuit means for holding latch data in one of first and second states;
bit line means;
setting means for setting said bit line means to a reference potential;
coupling means for coupling said flip-flop circuit means and said bit line means;
reset means for providing a first path for supplying a reset potential to said flip-flop circuit means at the time of a reset mode, and keeping said flip-flop circuit means in the first state;
non-volatile memory cell means of a MOS transistor construction, connected to said bit line means, for storing data when a threshold thereof is set in one of first and second threshold ranges, said non-volatile memory cell means maintaining said bit line means at the reference potential by said setting means, when said threshold value is in said second threshold range, at the time of a read mode following said reset mode; and data setting circuit means for providing a second path for supplying a latch potential to said flip-flop circuit means when said bit line means is at said reference potential at the time of the read mode, and keeping said flip-flop circuit means in the second state.

20. The device according to claim 19, wherein one of a ground potential and a power supply potential is supplied to a first power supply node of said first path for supplying the reset potential, and one of a ground potential and a power supply potential is supplied to a second power supply node of said second path for supplying the latch potential.

21. The device according to claim 20, wherein said bit line means comprises a bit line, said flip-flop circuit means comprises a flip-flop circuit having at least first and second signal nodes, and said coupling means includes at least one switching element, said switching element being turned off at the time of the read mode, thereby electrically disconnecting said bit line from said flip-flop circuit.

22. The device according to claim 21, wherein said flip-flop circuit includes at least two CMOS inverter circuits having their input and output terminals connected in parallel in opposite directions, said data setting circuit means includes a MOS transistor circuit means having a current path connected between one of the first and second signal nodes of the flip-flop circuit and the power supply node of the second path, and said MOS transistor circuit means includes at least a first MOS transistor having a gate controlled in accordance with a signal of said bit line.

23. The device according to claim 22, wherein the relationship between a conductance gmN of said MOS transistor circuit means and a conductance gmP of a MOS transistor within said CMOS inverter circuit for charging/discharging one of the first and second signal nodes of the flip-flop circuit is given by $gmN/gmP > 1.8$ 24. The device according to claim 21, wherein said flip-flop circuit includes at least two CMOS inverter circuits having their input and output terminals connected in parallel in opposite directions, said data setting circuit means includes a first MOS transistor and a second MOS transistor, said second MOS transistor having a current path connected between one of the first and second signal nodes of the flip-flop circuit and the second power supply node in series with said first MOS transistor, a gate of said first MOS transistor is controlled in accordance with a signal of said bit line, a control signal is input to a gate of said second MOS transistor, and said second MOS transistor is turned on at the time of the verify mode.

25. The device according to claim 24, wherein the relationship between an equivalent conductance gmN of said first and second MOS transistors and a conductance gmP of a MOS transistor within said CMOS inverter circuit for charging/discharging one of the first and second signal nodes of the flip-flop circuit is given by $gmN/gmP > 1.8$ 26. The device according to claim 24, wherein said first MOS transistor is provided on said flip-flop circuit side, and said second MOS transistor is provided on said second power supply node side.

27. The device according to claim 24, wherein said second MOS transistor is provided on said flip-flop circuit side, and said first MOS transistor is provided on said second power supply node side.

28. The device according to claim 22, wherein said MOS transistor circuit means includes a second MOS transistor having a current path connected in series between said first MOS transistor and one of the first and second signal nodes of the flip-flop circuit, and a third MOS transistor having a current path connected in series between said first MOS transistor and said second power supply node, said second and third MOS transistors being turned on at the time of the read mode when the gates of said second and third MOS transistors are supplied with control signals.

29. The device according to claim 22, wherein said MOS transistor circuit means includes transfer control means for enabling a gate control operation of the first MOS transistor at the time of the read mode.

30. The device according to claim 19, wherein said bit line means comprises a plurality of bit lines, said flip-flop circuit means comprises a plurality of flip-flop circuits each having first and second signal nodes, and said coupling means comprises a plurality of switching elements to be turned off at the time of the read mode for electrically disconnecting a respective flip-flop circuit from an associated one of said bit lines, said coupling means controlling connection between said bit lines and said flip-flop circuits.

31. The device according to claim 30, wherein each of said flip-flop circuits is shared by at least two of said bit lines.

32. The device according to claim 19, wherein said bit line means comprises a plurality of bit lines, said flip-flop circuit means comprises a plurality of flip-flop circuits each having first and second signal nodes, and said coupling means comprises a plurality of switching elements to be turned off at the time of the verify mode for electrically disconnecting a respective flip-flop circuit from an associated one of said bit lines, said coupling means controlling connection between said bit lines and said flip-flop circuits, and wherein said non-volatile semiconductor memory device further comprises data input/output circuit means for enabling a read operation in the read mode and a write operation in the write operation for data of each memory cell.

33. The device according to claim 32, wherein said data input/output circuit means includes column gates connected to the first and second signal nodes of the flip-flop circuits.

34. The device according to claim 19, wherein said non-volatile memory cell means makes use of an FN (Fowler-Nordheim) tunnel current at the time of the write mode.

35. The device according to claim 34, wherein said non-volatile memory cell means includes a plurality of MOS transistors each having a floating gate, and selector transistor means provided between said MOS transistors and said bit lines.

36. A non-volatile semiconductor memory device comprising:

flip-flop circuit means for holding latch data in one of first and second states;

reset means for providing a first path for supplying a reset potential to said flip-flop circuit means at the time of a reset mode, and keeping said flip-flop circuit means in the first state;

bit line means;

setting means for setting said bit line means to a reference potential;

coupling means for coupling said flip-flop circuit means and said bit line means;

non-volatile memory cell means, connected to said bit line means and having a MOS transistor structure, for storing data when a threshold thereof is set in one of first and second threshold ranges, wherein at the time of a write mode said threshold of the memory cell means is shifted from the first threshold range towards the second threshold range while said flip-flop circuit means remains in the first state and the shift of the threshold is not effected while said flip-flop circuit means remains in the second state, and at the time of a verify mode following the write mode and at the time of a read mode following the reset mode said bit line means is kept at said reference potential by said setting means while the threshold remains in the second threshold range; and data setting circuit means for providing a second path for supplying a latch potential to said flip-flop circuit means when said bit line means is at said reference potential at the time of the verify mode and the read mode, and keeping said flip-flop circuit means in the second state irrespective of the state prior to the verify mode.

37. The device according to claim 36, wherein one of a ground potential and a power supply potential is supplied to a first power supply node of said first path for supplying the reset potential, and one of a ground potential and a power supply potential is supplied to a second power supply node of said second path for supplying the latch potential.

38. The device according to claim 37, wherein said bit line means comprises a bit line, said flip-flop circuit means comprises a flip-flop circuit having at least first and second signal nodes, and said coupling means includes at least one switching element, said switching element being turned off at the time of the read mode, thereby electrically disconnecting said bit line from said flip-flop circuit.

39. The device according to claim 38, wherein said flip-flop circuit includes at least two CMOS inverter circuits having their input and output terminals connected in parallel in opposite directions, said data setting circuit means includes a MOS transistor circuit means having a current path connected between one of the first and second signal nodes of the flip-flop circuit and the second power supply node, and said MOS transistor circuit means includes at least a first MOS transistor having a gate controlled in accordance with a signal of said bit line.

40. The device according to claim 39, wherein the relationship between a conductance gmN of said MOS transistor circuit means and a conductance gmP of a MOS transistor within said CMOS inverter circuit for charging/discharging one of the first and second signal nodes of the flip-flop circuit is given by $$gmN/gmP > 1.8$$

41. The device according to claim 38, wherein said flip-flop circuit includes at least two CMOS inverter circuits having their input and output terminals connected in parallel in opposite directions, said data setting circuit means includes a first MOS transistor and a second MOS transistor having current paths connected in series between one of the first and second signal nodes of the flip-flop circuit and said second power supply node, a gate of said first MOS transistor is controlled in accordance with a signal of said bit line, a control signal is input to a gate of said second MOS transistor, and said second MOS transistor is turned on at the time of the verify mode.

42. The device according to claim 41, wherein the relationship between an equivalent conductance gmN of said first and second MOS transistors and a conductance gmP of a MOS transistor within said CMOS inverter circuit for charging/discharging one of the first and second signal nodes of the flip-flop circuit is given by $$gmN/gmP > 1.8$$

43. The device according to claim 39, wherein said first MOS transistor is provided on said flip-flop circuit side, and said second MOS transistor is provided on said second power supply node side.

44. The device according to claim 41, wherein said second MOS transistor is provided on said flip-flop circuit side, and said first MOS transistor is provided on said second power supply node side.

45. The device according to claim 39, wherein said MOS transistor circuit means includes a second MOS transistor having a current path connected in series between said first MOS transistor and one of the first and second signal nodes of the flip-flop circuit, and a third MOS transistor having a current path connected in series between said first MOS transistor and said second power supply node, said second and third MOS transistors being turned on at the time of the read mode when the gates of said second and third MOS transistors are supplied with control signals.

46. The device according to claim 39, wherein said MOS transistor circuit means includes transfer control means for enabling a gate control operation of the first MOS transistor at the time of the verify mode.

47. The device according to claim 36, wherein said bit line means comprises a plurality of bit lines, said flip-flop circuit means comprises a plurality of flip-flop circuits having first and second signal nodes, and said coupling means comprises a plurality of switching elements to be turned off at the time of the read mode for electrically disconnecting a respective flip-flop circuit from an associated one of said bit lines, said coupling means controlling connection between said bit lines and said flip-flop circuits.

48. The device according to claim 47, wherein each of said flip-flop circuits is shared by at least two of said bit lines.

49. The device according to claim 36, wherein said bit line means comprises a plurality of bit lines, said flip-flop circuit means comprises a plurality of flip-flop circuits each having first and second signal nodes, and said coupling means comprises a plurality of switching elements to be turned off at the time of the verify mode for electrically disconnecting a respective flip-flop circuit from an associated one of said bit lines, said coupling means controlling connection between said bit lines and said flip-flop circuits, and wherein said non-volatile semiconductor memory device further comprises verify sensing means for sensing completion of a verify operation in the verify mode for data in each of the memory cells.

50. The device according to claim 49, wherein said verify sensing comprises a shared verify line for obtaining a sense signal only when the potential at one of the first and second signal nodes of each of said flip-flop circuits is equal.

51. The device according to claim 36, wherein said non-volatile memory cell means makes use of an FN (Fowler-Nordheim) tunnel current at the time of the write mode.

52. The device according to claim 51, wherein said non-volatile memory cell means includes a plurality of MOS transistors each having a floating gate, and selector transistor means provided between said MOS transistors and said bit lines.

53. A non-volatile semiconductor memory device having a verify mode, said device comprising:
bit line means;
non-volatile memory cell means connected to said bit line means;
setting means for setting said bit line means to a reference potential;
flip-flop circuit means comprising a plurality of flip-flop circuits each for holding latch data in one of first and second states;
coupling means for coupling said flip-flop circuit means and said bit line means;
latch control means comprising an input/output line means through which latch data is transferred and a column gate for controlling transfer of the latch data to said flip-flop means, for setting the latch data in said flip-flop means; and
data setting circuit means for forcibly inverting into said first state, the latch data of a given flip-flop circuit which is in said second state, when a potential of the bit line means to which said given flip-flop circuit is connected is at said reference potential in the verify mode for said memory cell means.

54. The device according to claim 53, further comprising reset means for initializing said latch control means.

55. The device according to claim 53, wherein the connection of said coupling means is controlled by at least one switching element, said switching element being turned off at the time of the verify mode, thereby electrically disconnecting said bit line from said flip-flop circuit means.

56. The device according to claim 53, wherein said flip-flop circuit means includes at least two CMOS inverter circuits having their input and output terminals connected in parallel in opposite directions and having first and second signal nodes, said data setting circuit means includes MOS transistor circuit means having a current path connected between one of the first and second signal nodes of the flip-flop circuit and a power supply node for providing a latch potential, and said MOS transistor circuit means includes at least a first MOS transistor having a gate controlled in accordance with a signal of said bit line.

57. The device according to claim 56, wherein the relationship between a conductance gmN of said MOS transistor circuit means and a conductance gmP of a MOS transistor within said CMOS inverter circuit for charging/discharging one of the first and second signal nodes of the flip-flop circuit is given by $$gmN/gmP > 1.8$$

58. The device according to claim 53, wherein said flip-flop circuit means includes at least two CMOS inverter circuits having their input and terminals connected in parallel in opposite directions, said data setting circuit means includes a first MOS transistor and a second MOS transistor, said second MOS transistor having a current path connected between one of the first and second signal nodes of the flip-flop circuit and a power supply node for providing a latch potential in series with said first MOS transistor, a gate of said first MOS transistor is controlled in accordance with a signal of said bit line, a control signal is input to a gate of said second MOS transistor, and said second MOS transistor is turned on at the time of the verify mode.

59. The device according to claim 58, wherein the relationship between an equivalent conductance gmN of said first and second MOS transistors and a conductance gmP of a MOS transistor within said CMOS inverter circuit for charging/discharging one of the first and second signal nodes of the flip-flop circuit is given by $$gmN/gmP > 1.8$$

60. The device according to claim 58, wherein said first MOS transistor is provided on said flip-flop circuit means side, and said second MOS transistor is provided on said power supply node side.

61. The device according to claim 58, wherein said second MOS transistor is provided on said flip-flop circuit means side, and said first MOS transistor is provided on said power supply node side.

62. The device according to claim 56, wherein said MOS transistor circuit means includes a second MOS transistor having a current path connected in series between said first MOS transistor and one of the first and second signal nodes of the flip-flop circuit, and a third MOS transistor having a current path connected in series between said first MOS transistor and said power supply node, said second and third MOS transistors being turned on at the time of the verify mode when the gates of said second and third MOS transistors are supplied with control signals.

63. The device according to claim 56, wherein said MOS transistor circuit means includes transfer control means for enabling a gate control operation of the first MOS transistor at the time of the verify mode.

64. The device according to claim 53, wherein said non-volatile memory cell means makes use of an FN (Fowler-Nordheim) tunnel current at the time of a write mode preceding the verify mode.

65. The device according to claim 53, wherein said memory cell means constitutes a NAND type flash memory.

66. The device according to claim 53, wherein said non-volatile memory cell means constitutes a NAND type flash memory and makes use of an FN (Fowler-Nordheim) tunnel current at the time of a write mode preceding the verify mode.

67. A non-volatile semiconductor memory device, comprising:
at least one non-volatile memory cell;
a bit line connected to said at least one non-volatile memory cell;
a flip-flop circuit which is set in a first state in accordance with write data supplied thereto;

a switching circuit responsive to a switching signal for electrically connecting said bit line and said flip-flop circuit during a write operation for writing the write data to said at least one non-volatile memory cell;

a data setting circuit responsive to a potential of said bit line for setting said flip-flop circuit in a second state in accordance with a verify operation for verifying the writing of the write data to said at least one non-volatile memory cell; and a data re-settings circuit responsive to a reset signal for resetting said flip-flop circuit in a reset state.

68. The device according to claim 67, wherein said data setting circuit comprises:

a first MOS transistor having a gate connected to said bit line, a first terminal connected to said flip-flop circuit, and a second terminal; and a second MOS transistor having a gate supplied with a clock signal, a first terminal connected to said second terminal of said first MOS transistor, and a second terminal connected to a first potential.

69. The device according to claim 67, wherein said data setting circuit comprises:

a first MOS transistor having a gate supplied with a clock signal, a first terminal connected to said flip-flop circuit, and a second terminal; and a second MOS transistor having a gate connected to said bit line, a first terminal connected to said second terminal of said first MOS transistor, and a second terminal connected to a first potential.

70. The device according to claim 67, wherein said data setting circuit comprises:

a first MOS transistor having a gate supplied with a first clock signal, a first terminal connected to said flip-flop circuit, and a second terminal;

a second MOS transistor having a gate connected to said bit line, a first terminal connected to said second terminal of said first MOS transistor, and a second terminal; and a third MOS transistor having a gate connected to a second clock signal, a first terminal connected to said second terminal of said second MOS transistor, and a second terminal connected to a first potential.

71. The device according to claim 67, wherein said data setting circuit comprises:

a first MOS transistor having a gate supplied with a first clock signal, a first terminal connected to said bit line, and a second terminal;

a second MOS transistor having a gate connected to said second terminal of said first MOS transistor, a first terminal connected to said flip-flop circuit, and a second terminal connected to a first potential; and a third MOS transistor having a gate supplied with a second clock signal, a first terminal connected to said second terminal of said first MOS transistor, and a second terminal connected to a second potential.

72. The device according to claim 67, wherein said data setting circuit comprises:

a logic gate having a first input connected to said bit line and a second input supplied with a clock signal; and a MOS transistor having a gate connected to an output of said logic gate, a first terminal connected to said flip-flop circuit, and a second terminal connected to a first potential.

73. The device according to claim 67, wherein said resetting circuit comprises:

a MOS transistor having a gate supplied with the reset signal and a current path connected between a first potential and said flip-flop circuit.

74. The device according to claim 67, wherein said at least one non-volatile memory cell comprises NAND-structured memory cells.

75. A non-volatile semiconductor memory device, comprising:

at least one non-volatile memory cell;

a bit line connected to said at least one non-volatile memory cell;

a flip-flop circuit which is set in a first state in accordance with write data supplied thereto;

a switching circuit responsive to a switching signal for electrically connecting said bit line and said flip-flop circuit during a write operation for writing the write data to said at least one non-volatile memory cell;

a data setting circuit responsive to a potential of said bit line for setting said flip-flop circuit in a second state in accordance with a verify operation for verifying the writing of the write data to said at least one non-volatile memory cell, said data setting circuit including first and second MOS transistors connected in series between said flip-flop circuit and a first potential, a gate of said first MOS transistor being connected to said bit line and a gate of said second MOS transistor being supplied with a first clock signal.

76. The device according to claim 75, wherein:

said first MOS transistor includes a first terminal connected to said flip-flop circuit and a second terminal; and said second MOS transistor includes a first terminal connected to said second terminal of said first MOS transistor and a second terminal connected to the first potential.

77. The device according to claim 75, wherein:

said second MOS transistor includes a first terminal connected to said flip-flop circuit and a second terminal; and said first MOS transistor includes a first terminal connected to said second terminal of said second MOS transistor and a second terminal connected to the first potential.

78. The device according to claim 75, wherein said data setting circuit further comprises a third MOS transistor connected in series with said first and second MOS transistors, a gate of said third MOS transistor supplied with a second clock signal.

79. A non-volatile semiconductor memory device, comprising:

at least one non-volatile memory cell;

a bit line connected to said at least one non-volatile memory cell;

a flip-flop circuit which is set in a first state in accordance with write dam supplied thereto;

a switching circuit responsive to a switching signal for electrically connecting said bit line and said flip-flop circuit during a write operation for writing the write data to said at least one non-volatile memory cell;

a data setting circuit responsive to a potential of said bit line for setting said flip-flop circuit in a second state in accordance with a verify operation for verifying the writing of the write data to said at least one non-volatile memory cell, said data setting circuit including:

a first MOS transistor having a gate supplied with a first clock signal, a first terminal connected to said bit line, and a second terminal;

a second MOS transistor having a gate connected to said second terminal of said first MOS transistor, a first terminal connected to said flip-flop circuit, and a second terminal connected to a first potential; and a third MOS transistor having a gate supplied with a second clock signal, a first terminal connected to said second terminal of said first MOS transistor, and a second terminal connected to a second potential.

80. A non-volatile semiconductor memory device, comprising:

non-volatile memory cells;

bit lines connected to said non-volatile memory cells;

flip-flop circuits which are set in respective first states in accordance with respective write data supplied thereto;

switching circuits responsive to switching signals for electrically connecting said bit lines and said flip-flop circuits during a write operation for writing the respective write data to said non-volatile memory cells;

data setting circuits responsive to potentials of said bit lines for setting said flip-flop circuits in respective second states in accordance with a verify operation for verifying the writing of the respective write data to said non-volatile memory cells; and data resetting circuits responsive to reset signals for resetting said flip-flop circuits in respective reset states.

81. The device according to claim 80, further comprising:

a batch verify circuit for verifying completion of a write operation for writing the respective write data to said non-volatile memory cells.

82. The device according to claim 81, wherein said batch verify circuit comprises:

MOS transistors each having a gate connected to one of said flip-flop circuits, a first terminal connected to a first potential, and a second terminal connected to a verify signal line.

83. The device according to claim 80, wherein said switching circuits are arranged such that one of said flip-flop circuits is selectively connectable to one of a plurality of said bit lines.

84. The device according to claim 80, wherein:

said non-volatile memory cells are NAND-structured memory cells;

the second state of one of said flip-flops which is supplied with "0" data is the inversion of the first state; and the second state of another one of said flip-flops which is supplied with "1" data is the same as the first state.

* * * * *